United States Patent
Hsieh et al.

(10) Patent No.: US 11,837,614 B2
(45) Date of Patent: Dec. 5, 2023

(54) FAST CHARGE TRANSFER FLOATING DIFFUSION REGION FOR A PHOTODETECTOR AND METHODS OF FORMING THE SAME

(71) Applicant: Taiwan Semiconductor Manufacturing Company Limited, Hsinchu (TW)

(72) Inventors: Feng-Chien Hsieh, Pingtung (TW); Yun-Wei Cheng, Taipei (TW); Wei-Li Hu, Tainan (TW); Kuo-Cheng Lee, Tainan (TW); Hsin-Chi Chen, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 275 days.

(21) Appl. No.: 17/182,300

(22) Filed: Feb. 23, 2021

(65) Prior Publication Data
US 2022/0271075 A1    Aug. 25, 2022

(51) Int. Cl.
*H01L 27/146*    (2006.01)

(52) U.S. Cl.
CPC .... *H01L 27/14614* (2013.01); *H01L 27/1463* (2013.01); *H01L 27/14636* (2013.01)

(58) Field of Classification Search
CPC ........... H01L 27/14614; H01L 27/1463; H01L 27/14636
See application file for complete search history.

(56) References Cited

U.S. PATENT DOCUMENTS

| | | |
|---|---|---|
| 2007/0034965 A1 | 2/2007 | Jung et al. |
| 2011/0037969 A1* | 2/2011 | Spickermann ........ G01S 7/4863 356/5.01 |

(Continued)

FOREIGN PATENT DOCUMENTS

TW    201719876 A    6/2017

OTHER PUBLICATIONS

Taiwan Patent Office; Application No. 110119728 Office Action dated May 30, 2022, 6 pages.

(Continued)

*Primary Examiner* — Thao X Le
*Assistant Examiner* — Daniel Hyun Suh
(74) *Attorney, Agent, or Firm* — The Mabury Law Group, PLLC

(57) ABSTRACT

A subpixel including at least one second-conductivity-type pinned photodiode layer that forms a p-n junction with a substrate semiconductor layer, at least one floating diffusion region, and at least one transfer gate stack structure. The at least one transfer gate stack structure may at least partially laterally surround the at least one second-conductivity-type pinned photodiode layer with a total azimuthal extension angle in a range from 240 degrees to 360 degrees around a geometrical center of the second-conductivity-type pinned photodiode layer. The at least one transfer gate stack structure may include multiple edges that overlie different segments of a periphery of the at least one second-conductivity-type pinned photodiode layer, and the floating diffusion region includes a portion located between the first edge and the second edge. In addition, multiple transfer gate stack structures and multiple floating diffusion regions may be present in the subpixel.

20 Claims, 32 Drawing Sheets

(56) References Cited

U.S. PATENT DOCUMENTS

2020/0066771 A1* 2/2020 Köklü ................ H01L 27/1461
2020/0395394 A1 12/2020 Takahashi et al.

OTHER PUBLICATIONS

Taiwan Patent Office; Application No. 110119728; second Office Action dated Dec. 30, 2022, 3 pages.

* cited by examiner

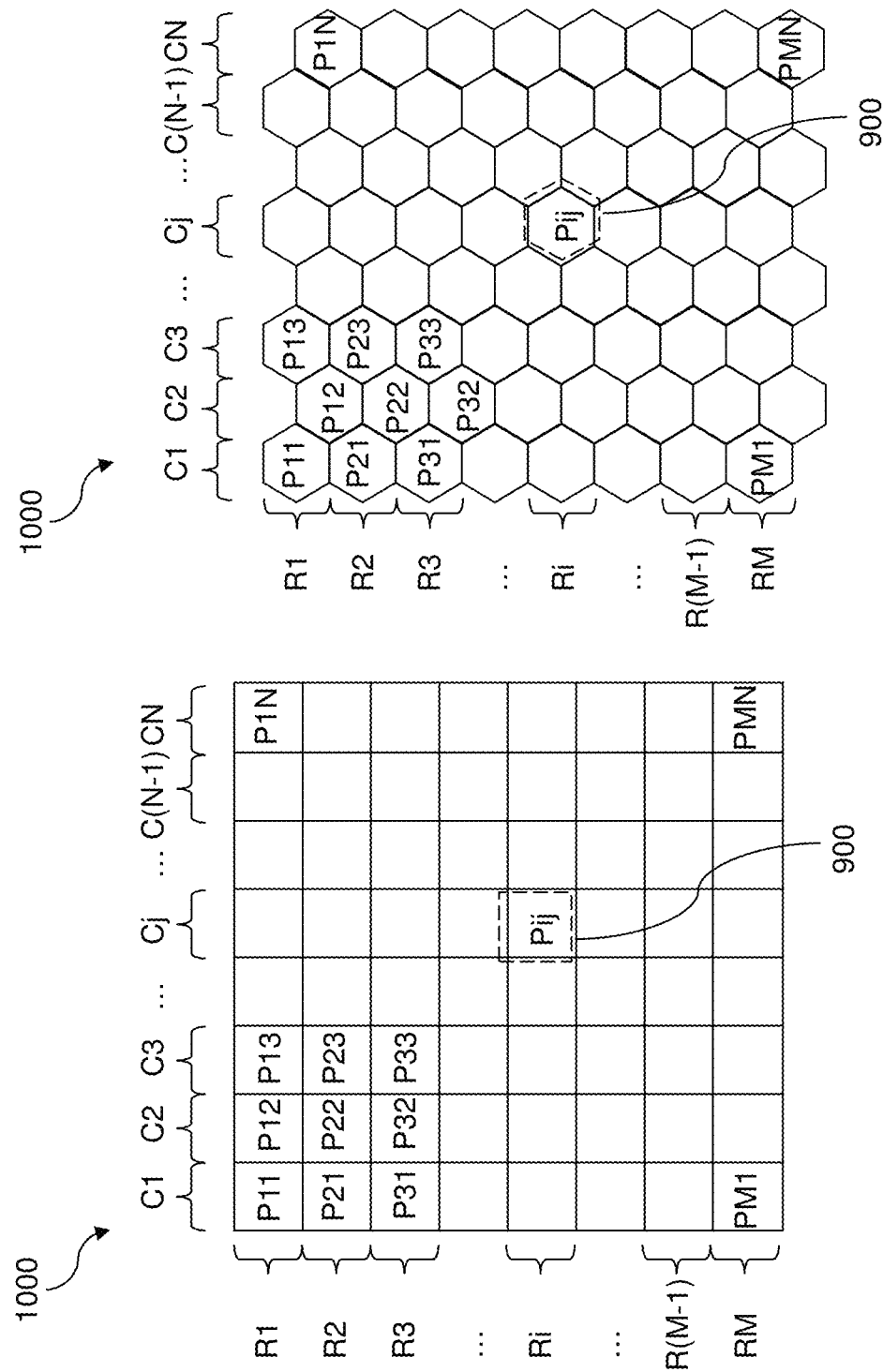

FAST CHARGE TRANSFER FLOATING DIFFUSION REGION FOR A PHOTODETECTOR AND METHODS OF FORMING THE SAME

BACKGROUND

Semiconductor image sensors are used to sense electromagnetic radiation such as visible range light, infrared radiation, and/or ultraviolet light. Complementary metal-oxide-semiconductor (CMOS) image sensors (CIS) and charge-coupled device (CCD) sensors are used in various applications. For example, such image sensors may be used in digital cameras or embedded cameras in mobile devices. These devices utilize an array of pixels (which may include photodiodes and transistors) to detect radiation using photogeneration of electron-hole pairs. A large p-n junction area may increase the photosensitivity in a photodetector. However, for such large p-n junction areas in a photodetector, the charge transfer speed to a floating diffusion region may be slow. Fast charge transfer to the floating diffusion region may increase the operational speed of a photodetector in CMOS image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a plan view of a first configuration for an array of pixels of an image sensor according to an embodiment of the present disclosure.

FIG. 1B is a plan view of a second configuration for an array of pixels of an image sensor according to another embodiment of the present disclosure.

DETAILED DESCRIPTION

Figure 2A:
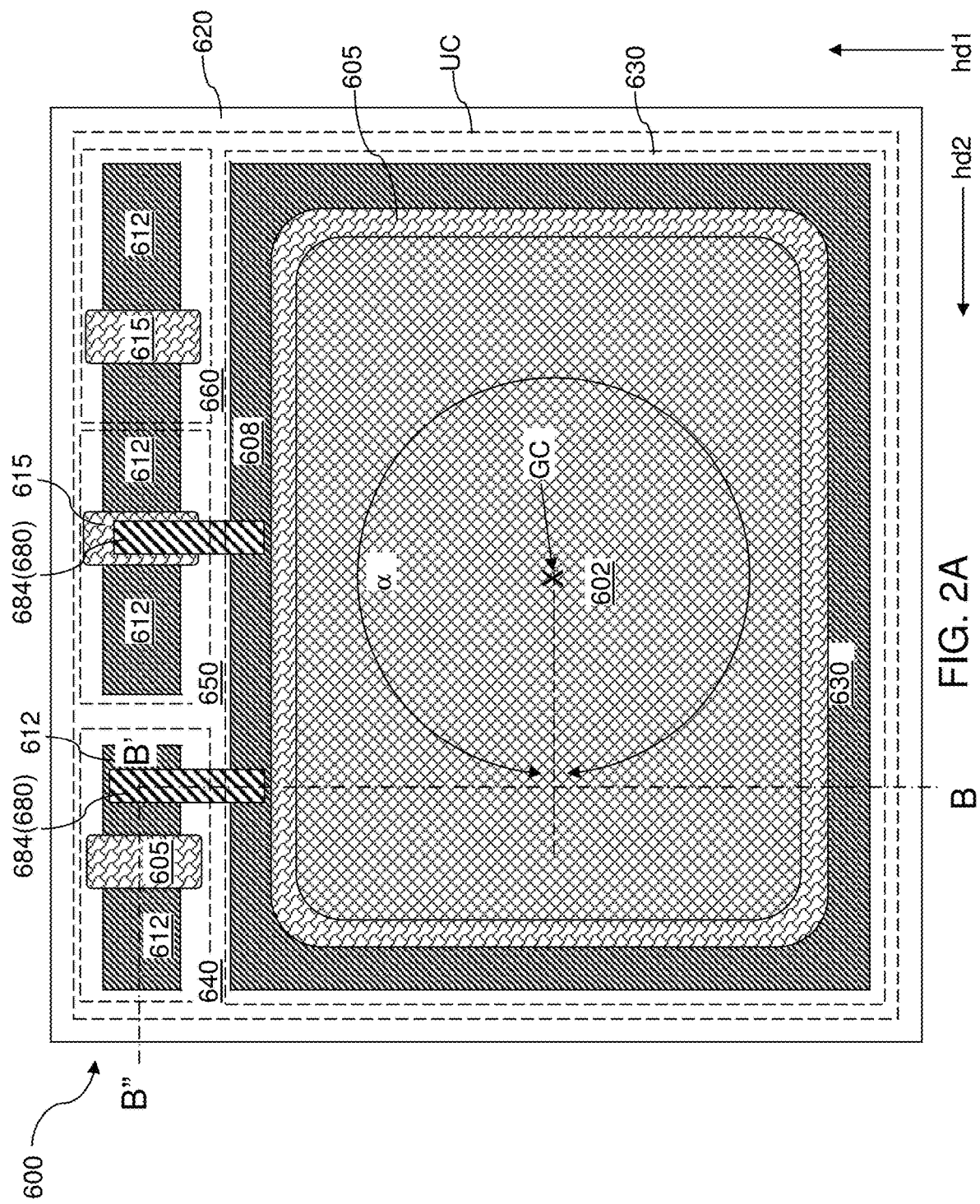
FIG. 2A is a plan view of front side sensor components within the area of a subpixel in a first configuration of a first exemplary structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to devices including a metal-oxide-semiconductor (MOS) photodetector such as an image sensor and methods of forming the same.

Generally, the structures and methods of the present disclosure may be used to provide an image sensor having a higher charge transfer speed from a pinned photodiode layer. The pinned photodiode layer may function as a charge collection region from which collected electrical charges may be transferred to a floating diffusion region through a semiconductor channel that underlies a transfer gate electrode. The transfer gate electrode may be provided with a non-linear shape. Thus, the transfer gate electrode may provide a smaller average distance between the pinned photodiode layer and the floating diffusion region. The horizontal cross-sectional shape of the floating diffusion region may be selected such that the transfer gate electrode may have a same channel length throughout. Thus, the horizontal cross-sectional shape of the floating diffusion region may have a non-rectangular shape. This non-rectangular shape may have an annular shape, an arc shape, a shape with a protrusion portion, or multiple disjoined portions.

In one embodiment, the floating diffusion region may laterally surround, partially or completely, a transfer gate electrode. The transfer gate electrode may laterally surround, partially or completely, a pinned photodiode layer. In another embodiment, the floating diffusion region may include a laterally-protruding portion that protrudes toward a geometrical center of a pinned photodiode layer. In yet another embodiment, multiple floating diffusion regions may be formed at different peripheral regions of a pinned photodiode layer.

FIG. 1A is a plan view of a first configuration for an array of pixels of an image sensor according to an embodiment of the present disclosure. FIG. 1B is a plan view of a second configuration for an array of pixels of an image sensor according to another embodiment of the present disclosure. Referring to FIGS. 1A and 1B, a first configuration for an array 1000 of pixels 900 of an image sensor and a second configuration of an array 1000 of pixels 900 of an image sensor are illustrated in a plan view, respectively. The image sensor may be a backside illuminated (BSI) image sensor device. However, it should be appreciated that embodiments of the disclosure may be used in a front side illuminated (FSI) image sensor.

Each pixel 900 represents a smallest unit area for the purpose of generating an image from the image sensor. The region including the array 1000 of pixels 900 is herein referred to as a pixel array region. The pixels 900 in the pixel array region may be arranged in rows and columns. For example, the pixel array region may include M rows and N columns, in which M and N are integers in a range from 1 to $2^{16}$, such as from $2^8$ to $2^{14}$. The rows of pixels 900 may be consecutively numbered with integers that range from 1 to M, and the columns of pixels 900 may be consecutively numbered with integers that range from 1 to N. A pixel Pij refers to a pixel 900 in the i-th row and in the j-th column.

Each pixel 900 includes at least one photodetector that is configured to detect radiation of a given wavelength range. Each pixel 900 may include a plurality of photodetectors configured to detect radiation of a respective wavelength range. The wavelength range of the detected radiation may be different among the plurality of photodetectors. In one embodiment, each pixel 900 may include a plurality of subpixels, each of which including a respective combination of a photodetector and an electronic circuit configured to detect radiation that impinges upon the photodetector. For example, a pixel 900 may include a subpixel configured to detect radiation in a red wavelength range (such as a range from 635 nm to 700 nm), a subpixel configured to detect radiation in a green wavelength range (such as a range from 520 nm to 560 nm), and a subpixel configured to detect radiation in a blue wavelength range (such as a range from 450 nm to 490 nm). Such subpixels are referred to as a red subpixel, green subpixel, and a blue subpixel, respectively.

Generally, a pixel 900 generates information in impinging radiation for a unit detection area. A subpixel generates information regarding the intensity of the impinging radiation within a specific wavelength range as detected within a region of the unit detection area. A monochromatic pixel 900 may include only a single subpixel. A pixel 900 configured to detect spectral distribution of impinging radiation includes multiple subpixels having at least two different detection wavelength ranges. Photodetectors in a pixel array region may include photodiodes, complimentary metal-oxide-semiconductor (CMOS) image sensors, charged coupling device (CCD) sensors, active sensors, passive sensors, other applicable sensors, or a combination thereof.

Figure 2B:
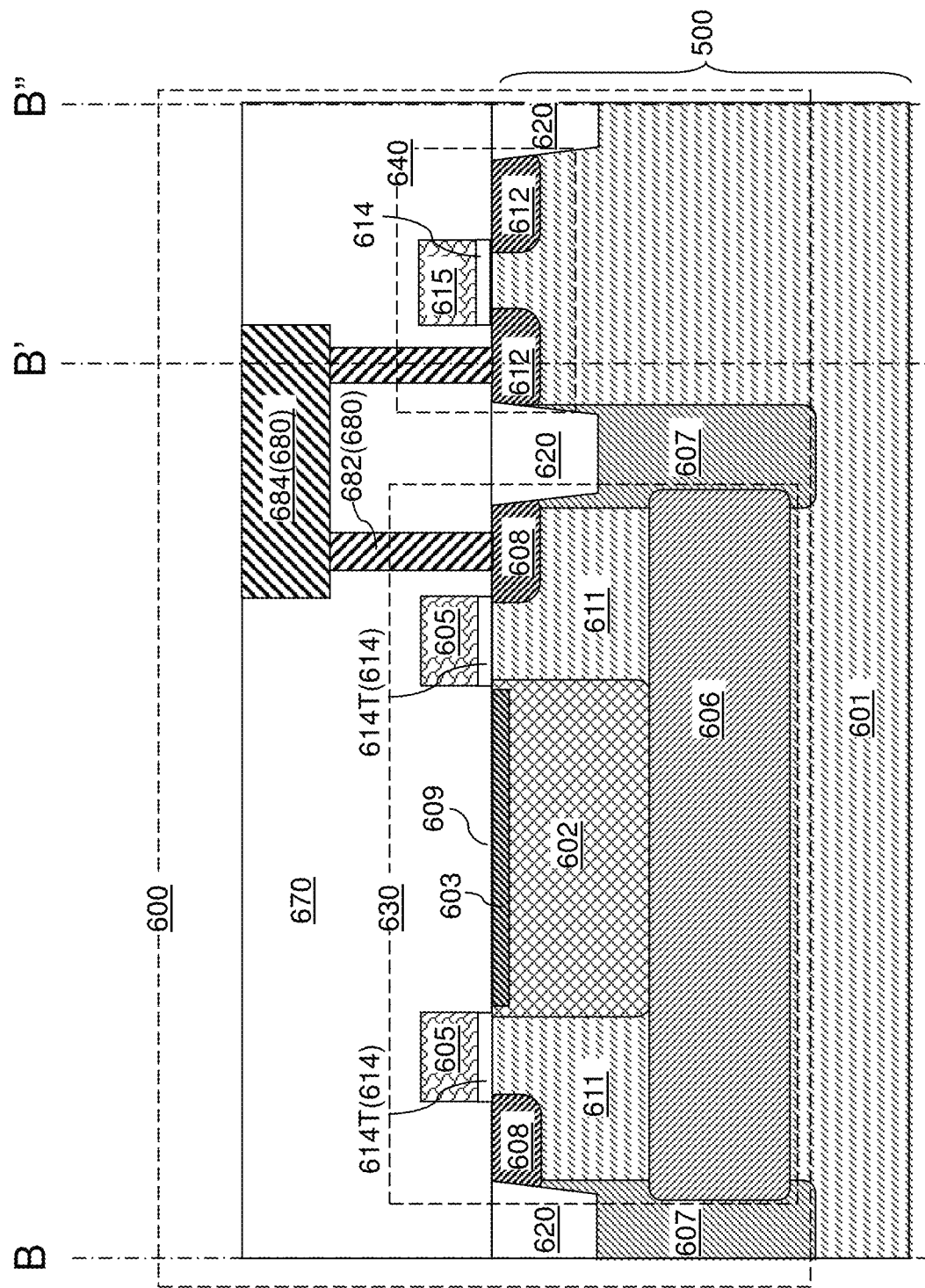
FIG. 2B is a vertical cross-sectional view of the first exemplary structure along a hinged vertical plane B-B'-B" that passes through the vertical axes B, B', and B" of FIG. 2A.
Figure 2C:
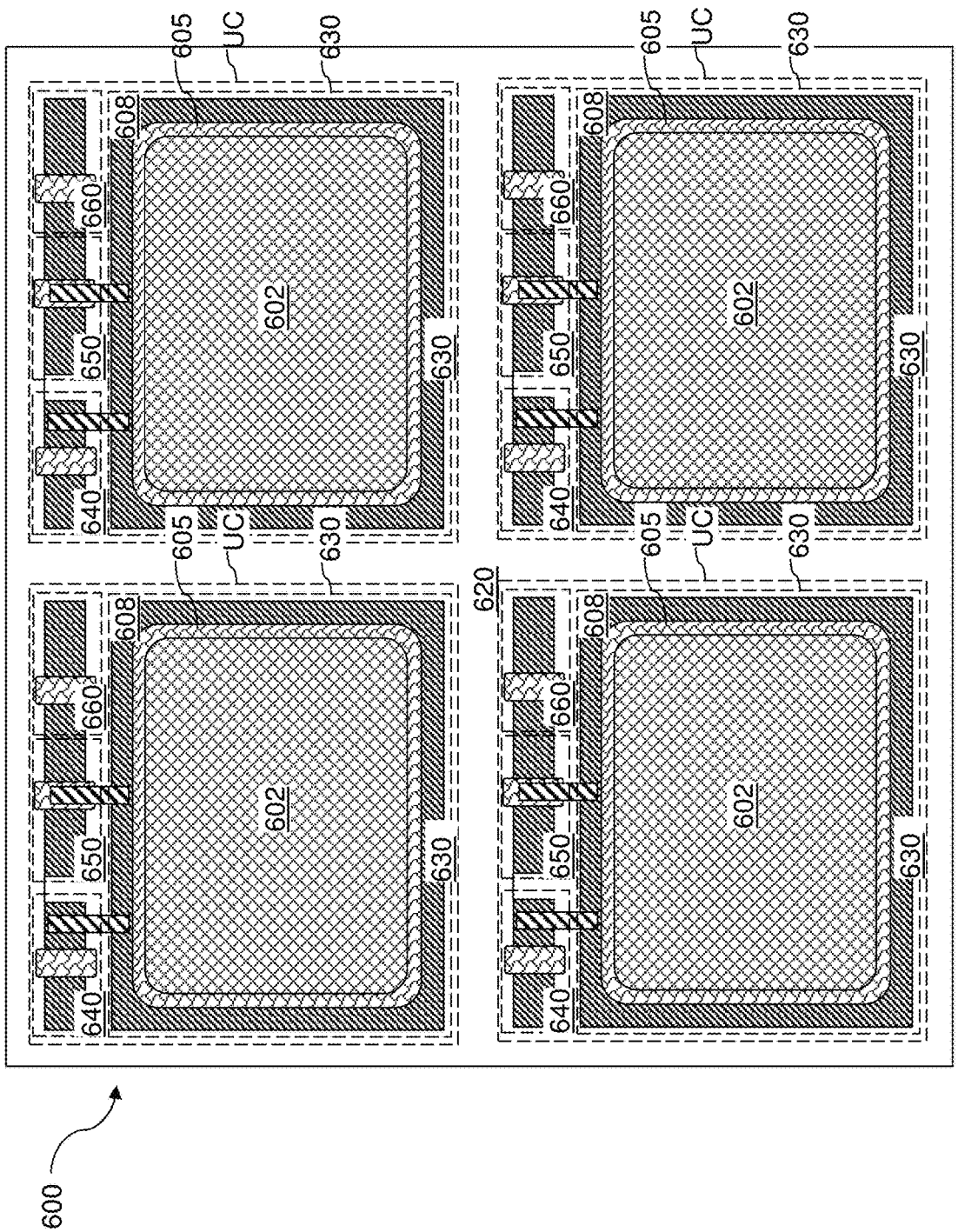
FIG. 2C is a zoom-out plan view of the front side sensor components within a pixel in the first configuration of the first exemplary structure of FIGS. 2A and 2B.
Figure 2D:
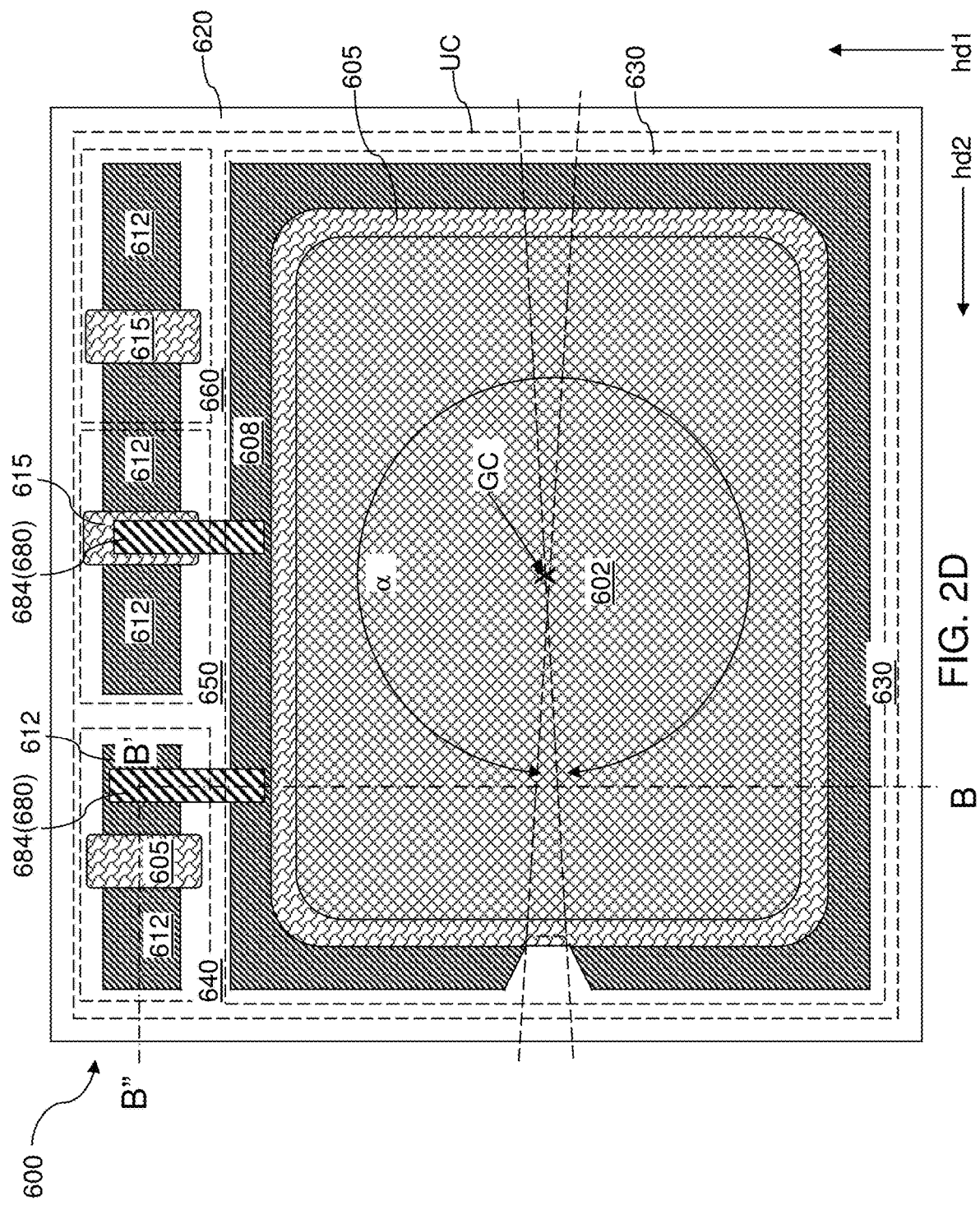
FIG. 2D is a plan view of front side sensor components within the area of a subpixel in a second configuration of the first exemplary structure according to an embodiment of the present disclosure.
Figure 2E:
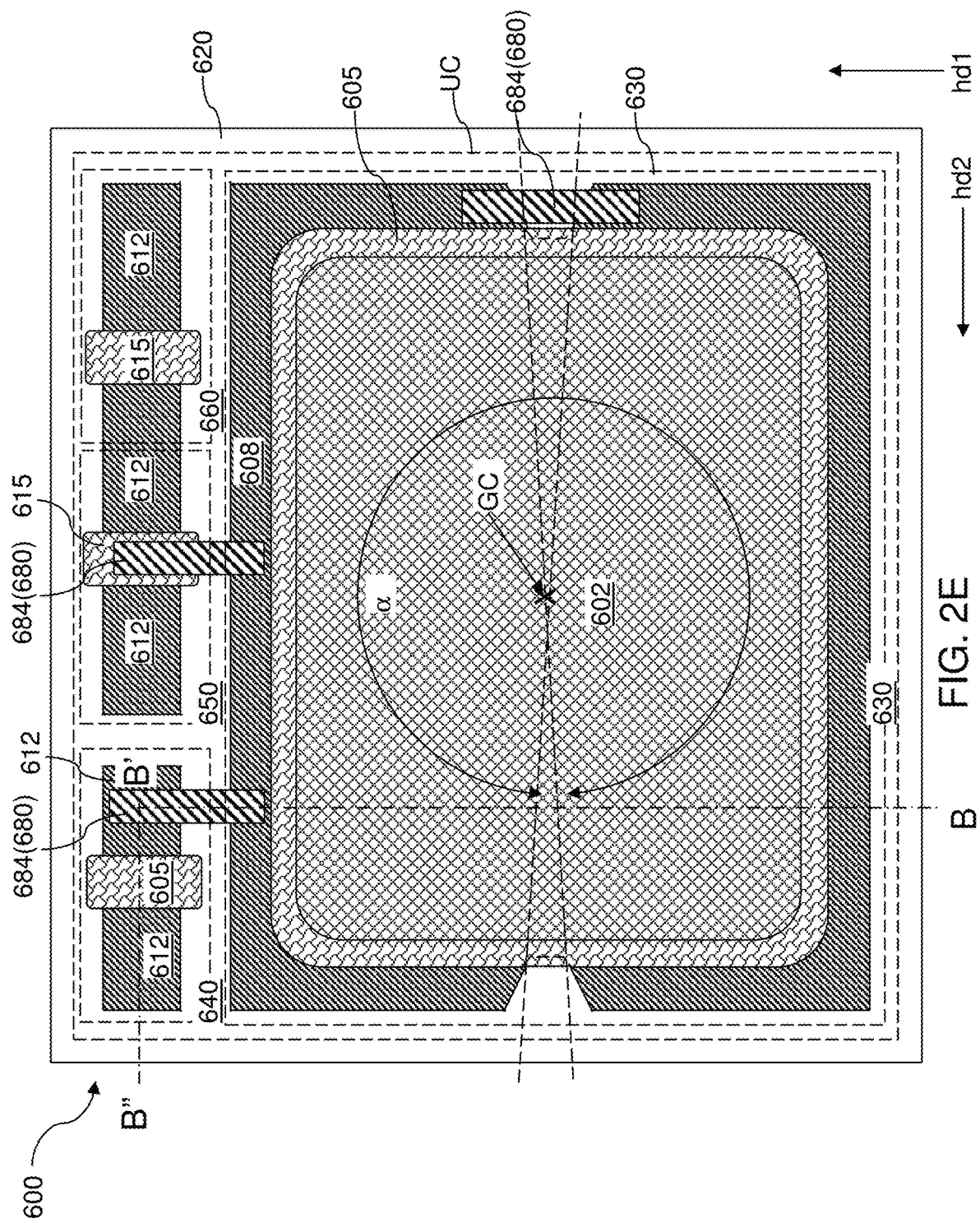
FIG. 2E is a plan view of front side sensor components within the area of a subpixel in a third configuration of the first exemplary structure according to an embodiment of the present disclosure.
Figure 2F:
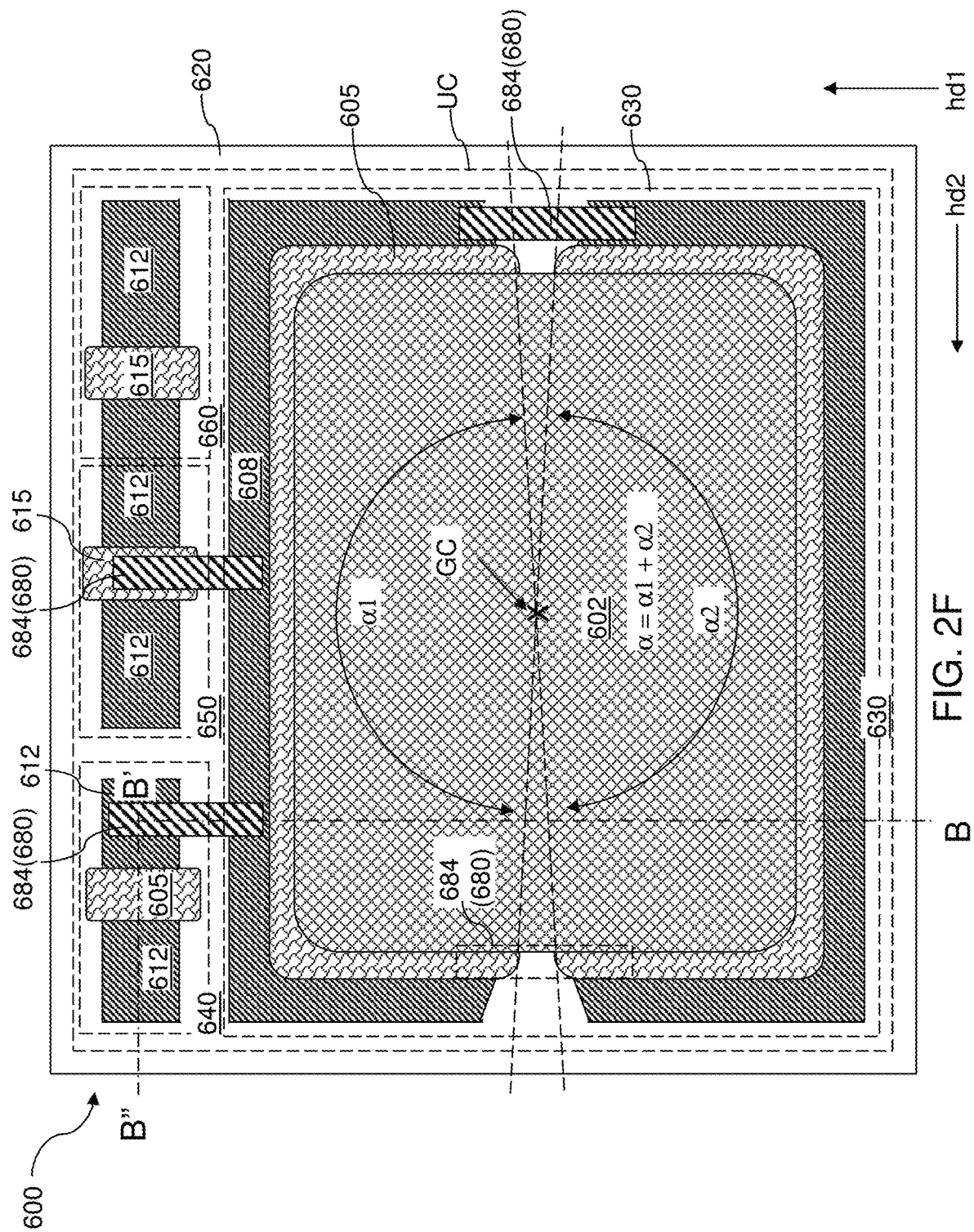
FIG. 2F is a plan view of front side sensor components within the area of a subpixel in a fourth configuration of the first exemplary structure according to an embodiment of the present disclosure.

FIG. 2A is a plan view of front side sensor components within the area of a subpixel in a first configuration of a first exemplary structure according to an embodiment of the present disclosure. FIG. 2B is a vertical cross-sectional view of the first exemplary structure along the hinged vertical plane B-B'-B" of FIG. 2A. FIG. 2C is a zoom-out plan view of the front side sensor components within a pixel in the first configuration of the first exemplary structure of FIGS. 2A and 2B. FIG. 2D is a plan view of front side sensor components within the area of a subpixel in a second configuration of the first exemplary structure according to an embodiment of the present disclosure. FIG. 2E is a plan view of front side sensor components within the area of a subpixel in a third configuration of the first exemplary structure according to an embodiment of the present disclosure. FIG. 2F is a plan view of front side sensor components within the area of a subpixel in a fourth configuration of the first exemplary structure according to an embodiment of the present disclosure. Referring to FIGS. 2A-2F, various configurations of a first exemplary structure are illustrated. FIGS. 2A-2C illustrate a first configuration of the first exemplary structure. FIG. 2D illustrates a second configuration of the first exemplary structure. FIG. 2E illustrates a third configuration of the first exemplary structure. FIG. 2F illustrates a fourth configuration of the first exemplary structure. The various configurations of the first exemplary structure may be derived from each other by changing the layout of a pinned photodiode layer comprising a second-conductivity-type pinned photodiode layer 602, a floating diffusion region 608, and a transfer gate stack structure (614T, 605).

FIGS. 2A-2F illustrate front side sensor components 600 within the area of a subpixel in an image sensor. A semiconductor substrate 500 includes a substrate semiconductor layer 601. Front side sensor components 600 refer to all components of the image sensor that may be formed on the front surface 609 of the semiconductor substrate 500, or may be formed within the substrate semiconductor layer 601. Each subpixel may include a photodetector and a sensing circuit for the photodetector. A set of subpixels may be used for a pixel, and an array 1000 of pixels may be arranged as illustrated in FIG. 1A or in FIG. 1B, or in any other suitable array configurations to provide an image sensor. Each subpixel may comprise a unit cell UC, which may be repeated along at least one horizontal direction (hd1, hd2) to provide front side sensor components 600 for a single pixel 900, which may include a single subpixel, two subpixels, or three or more subpixels. In one embodiment, multiple instances of the unit cell UC may be repeated along at least one horizontal direction (hd1, hd2). For example, the unit cell UC may be repeated as a two-dimensional array of unit cells UC that are replicated with a first periodicity along a first horizontal direction hd1 and with a second periodicity along a second horizontal direction hd2. As discussed above, the two-dimensional array may be a rectangular array or a hexagonal array. As such, the second horizontal direction hd2 may, or may not, be perpendicular to the first horizontal direction hd1.

Each subpixel may be formed on, or in, the substrate semiconductor layer 601, which provide a front surface 609 and a back surface. The substrate semiconductor layer 601 includes a semiconductor material such as silicon, germanium, a silicon-germanium alloy, a compound semiconductor material, or any other semiconductor material having a band gap that that does not exceed the energy of the photons to be detected. The material within the substrate semiconductor layer 601 may be selected based on the energy range of the photons (i.e., wavelength) to be detected by the subpixel. In one embodiment, the substrate semiconductor layer 601 may include single crystalline silicon. A commercially available single crystalline semiconductor substrate may be used for the semiconductor substrate 500. The semiconductor substrate 500 as provided at this processing step provides a sufficiently high thickness to be able to withstand standard complementary metal-oxide-semiconductor (CMOS) processing steps. For example, the thickness of the semiconductor substrate 500 may be in a range from 200 microns to 1 mm, although lesser and greater thicknesses may also be used.

A top portion of the substrate semiconductor layer 601 may be suitably doped to have a first-conductivity-type, which may be p-type or n-type. For example, an epitaxial semiconductor deposition process may be performed to form a single crystalline epitaxial semiconductor material layer at an upper portion of the substrate semiconductor layer 601 such that the atomic concentration of the dopants of the first-conductivity-type is in a range from $1.0 \times 10^{13}/cm^3$ to $1.0 \times 10^{16}/cm^3$, although lesser and greater atomic concentrations may also be used. The thickness of the single crystalline epitaxial semiconductor material layer may be in a range from 1 micron to 10 microns, although lesser and greater thicknesses may also be used.

First-conductivity-type wells 607 may be formed by ion implantation around regions in which shallow trench isolation structures 620 may be subsequently formed. The atomic concentration of dopants of the first-conductivity-type in the first-conductivity-type wells 607 may be in a range from $1.0 \times 10^{15}/cm^3$ to $1.0 \times 10^{18}/cm^3$, although lesser and greater atomic concentrations may also be used. Shallow trench isolation structures 620 may be formed to provide electrical isolation from the various components within the subpixel.

Dopants of a second conductivity type may be implanted through the front surface 609 of the semiconductor substrate 500 using at least one masked ion implantation process. The second conductivity type is the opposite of the first-conductivity-type. For example, if the first-conductivity-type is p-type, the second conductivity type is n-type, and vice versa. Various doped regions having a doping of the second conductivity type may be formed by the at least one masked ion implantation process. A second-conductivity-type pinned photodiode layer 602 may be formed underneath the front surface 609 of the semiconductor substrate 500 such that a periphery of the second-conductivity-type pinned photodiode layer 602 overlaps with an edge of the transfer gate electrode 605 in a plan view. The lateral extent of the second-conductivity-type pinned photodiode layer 602 may be limited to one side of a transfer gate electrode 605 to be subsequently formed. Thus, at least one edge of the second-conductivity-type pinned photodiode layer 602 may be laterally spaced from the shallow trench isolation structures 620 by a region in which a transfer gate electrode 605 and a floating diffusion region 608 may be subsequently formed.

A buried second-conductivity-type pinned photodiode layer 606 may be formed underneath the second-conductivity-type pinned photodiode layer 602 at the depth of the bottom portions of the first-conductivity-type wells 607 by implanting dopants of the second conductivity type with a higher implantation energy than during the implantation process that forms the second-conductivity-type pinned photodiode layer 602. The buried second-conductivity-type pinned photodiode layer 606 may adjoin the first-conductivity-type wells 607. In one embodiment, each buried second-conductivity-type pinned photodiode layer 606 may have a periphery that adjoins the first-conductivity-type wells 607.

In one embodiment, a p-n junction between the buried second-conductivity-type pinned photodiode layer 606 and the first-conductivity-type wells 607 may continuously extend around the entire area of a subpixel to form a generally cylindrical surface without any opening therethrough. The p-n junction may continuously extend underneath portions of a shallow trench isolation structure 620 that laterally surround the subpixel. The top portion of the buried second-conductivity-type pinned photodiode layer 606 may be adjoined to the bottom portion of the second-conductivity-type pinned photodiode layer 602 within each subpixel. The area of the second-conductivity-type pinned photodiode layer 602 may be located entirely within the area of the underlying buried second-conductivity-type pinned photodiode layer 606 in each subpixel.

In one embodiment, the depth of the top surface of the buried second-conductivity-type pinned photodiode layer 606 may be in a range from 400 nm to 1,500 nm, although lesser and greater depths may also be used. In one embodiment, the depth of the bottom surface of the buried second-conductivity-type pinned photodiode layer 606 may be in a range from 800 nm to 2,500 nm, although lesser and greater depths may also be used.

The unimplanted portion of the substrate semiconductor layer 601 that overlies the buried second-conductivity-type pinned photodiode layer 606 provide a doping of the first-conductivity-type, and may be subsequently used as a body region of a transfer transistor. As such, the unimplanted portion of the substrate semiconductor layer 601 that overlies the buried second-conductivity-type pinned photodiode layer 606 is herein referred to as a transfer transistor body region 611. In one embodiment, the buried second-conductivity-type pinned photodiode layer 606 may have the same lateral extent as a transfer transistor 630 to be subsequently formed, and may coincide with the portion of the shallow trench isolation structure 620 that encircles the combination of the second-conductivity-type pinned photodiode layer 602 and the transfer transistor body region 611.

Gate stack structures (614, 605, 615) may be formed over the front surface 609 of the semiconductor substrate 500 by depositing and patterning a layer stack including a gate dielectric layer and a gate electrode layer. Each patterned portion of the layer stack constitutes a gate stack structure (614, 605, 615), which may be a transfer gate stack structure (614T, 605) or a control gate stack structure (614, 615). Each transfer gate stack structure (614T, 605) includes a gate dielectric, which is herein referred to as a transfer gate dielectric 614T, and a gate electrode, which is herein referred to as a transfer gate electrode 605. Each transfer gate stack structure (614T, 605) is located between a second-conductivity-type pinned photodiode layer 602 and a floating diffusion region 608. Each of the control gate stack structures (614, 615) includes a respective layer stack of a gate dielectric 614 and a gate electrode 615 of other transistors in a sensing circuit, which may include a reset transistor 640, a source-follower transistor 650, a select transistor 660, and other suitable transistors that may be used to amplify the signal generated by the photodetector of the subpixel.

Various active regions (608, 612) having a doping of the second conductivity type is formed, which include a floating diffusion region 608 that functions as the drain region of the transfer transistor 630. The second-conductivity-type pinned photodiode layer 602 accumulates electrical charges (such as electrons in embodiments in which the second conductivity type is n-type) during sensing (i.e., while the subpixel actively detects the photons impinging thereupon, for example, for the purpose of taking a frame or a photo) functions as the source region of the transfer transistor 630. The active regions 612 include source regions and drain regions of the various transistors (640, 650, 660) in the sensing circuit. The floating diffusion region 608 is vertically spaced from the buried second-conductivity-type pinned photodiode layer 606 by the transfer transistor body region 611.

The floating diffusion region 608 and the active regions 612 may be formed by ion implantation of dopants of the second conductivity type using masked ion implantation processes. The combination of a respective patterned photoresist layer and the gate stack structures (614, 605, 615) may be used ion implantation blocking structures (i.e., masking structures) during the ion implantation processes. The depth of the bottom surface of the floating diffusion region 608 may be in a range from 100 nm to 400 nm, such as from 150 nm to 250 nm, although lesser and greater depths may also be used. The depth of the bottom surfaces of the active regions 612 may be in a range from 100 nm to 600 nm, such as from 150 nm to 400 nm, although lesser and greater depths may also be used.

A first-conductivity-type pinning layer 603 may be formed directly on top of the second-conductivity-type pinned photodiode layer 602 by ion implantation of dopants of the first-conductivity-type. The first-conductivity-type pinning layer 603 suppresses depletion of the interface between the second-conductivity-type pinned photodiode layer 602 and the first-conductivity-type pinning layer 603, and electrically stabilizes the second-conductivity-type pinned photodiode layer 602. The first-conductivity-type pinning layer 603 is omitted in all of the top-down views of the various exemplary structures of the present disclosure in order to clearly illustrate the lateral extent of the second-conductivity-type pinned photodiode layer 602 that underlies the first-conductivity-type pinning layer 603. The depth of the p-n junction between the first-conductivity-type pinning layer 603 and the second-conductivity-type pinned photodiode layer 602 may be in a range from 5 nm to 100 nm, although lesser and greater depths may also be used.

Interconnect-level dielectric layers 670 may be formed over the front surface 609 of the semiconductor substrate 500, and metal interconnect structures 680 connecting the various nodes of the transistors (630, 640, 650, 660) may be formed within each subpixel. The interconnect-level dielectric layers 670 may include a respective dielectric material such as undoped silicate glass, a doped silicate glass, organosilicate glass, a porous dielectric material, or combinations thereof. Dielectric liners including various dielectric materials (such as silicon nitride, silicon oxynitride, silicon oxide carbide, and/or dielectric metal oxides) may be optionally used in the interconnect-level dielectric layers 670. The metal interconnect structures 680 may include various metal via structures 682 and various metal line structures 684. For example, the floating diffusion region 608 may be connected to the gate electrode 615 of the source-follower transistor 650 by a subset of the metal interconnect structures 680. A photodetector may comprise a transfer transistor 630, and may be connected to a sense circuit including additional transistors (640, 650, 660).

In one embodiment, the gate length of the transfer gate stack structure (614T, 605), i.e., the width of the transfer gate stack structure (614T, 605) along the horizontal direction connecting the second-conductivity-type pinned photodiode layer 602 and the floating diffusion region 608, may be uniform throughout. The gate length of the transfer gate stack structure (614T, 605) may be, for example, in a range from 50 nm to 500 nm, although lesser and greater gate lengths may also be used. According to an embodiment of the present disclosure, the patterns of the second-conductivity-type pinned photodiode layer 602, the transfer gate stack structure (614T, 605), and the floating diffusion region 608 may be selected such that the maximum of the lateral separation distance between any point within the second-conductivity-type pinned photodiode layer 602 and the floating diffusion region 608 is not greater than the sum of one half of the maximum lateral dimension of the second-conductivity-type pinned photodiode layer 602 and the gate length of the transfer gate stack structure (614T, 605). The gate length of the transfer gate stack structure (614T, 605) may be the lateral distance between a pair of parallel sidewalls of the transfer gate stack structure (614T, 605).

In prior art photodetector structures having a rectangular second-conductivity-type pinned photodiode layer and a rectangular floating diffusion region of a same width, the maximum lateral separation distance between points within the second-conductivity-type pinned photodiode layer and the floating diffusion region is the sum of the full length of the second-conductivity-type pinned photodiode layer along the direction of the current flow during charge transfer and the gate length of the transfer gate electrode. The various embodiments of the present disclosure may reduce the maximum lateral separation distance between points within the second-conductivity-type pinned photodiode layer 602 and the floating diffusion region 608 below the level provided in the prior art photodetector structures.

In one embodiment, a subpixel may include a second-conductivity-type pinned photodiode layer 602 that forms a p-n junction with the substrate semiconductor layer 601, and a floating diffusion region 608 that is laterally spaced from a periphery of the second-conductivity-type pinned photodiode layer 602 and laterally surrounds the second-conductivity-type pinned photodiode layer 602. The subpixel may include at least one transfer gate stack structure (614T, 605) including a respective transfer gate dielectric 614T (which is one of the gate dielectrics 614) and a respective transfer gate electrode 605 and located between the second-conductivity-type pinned photodiode layer 602 and the at least one floating diffusion region 608 (in a plan view, i.e., a top-down view). The at least one transfer gate stack structure (614T, 605) may be a single transfer gate stack structure (614T, 605).

A geometrical center GC of the second-conductivity-type pinned photodiode layer 602 is the point having a Cartesian coordinate that is the average of the Cartesian coordinates of all points within the second-conductivity-type pinned photodiode layer 602. The location of the geometrical center GC of the second-conductivity-type pinned photodiode layer 602 is the same irrespective of any Cartesian coordinate system used to perform the calculation. The geometrical center of the second-conductivity-type pinned photodiode layer 602 is the same as the center of gravity of the second-conductivity-type pinned photodiode layer 602 since the second-conductivity-type pinned photodiode layer 602 provide a same density throughout.

The transfer gate stack structure (614T, 605) is located at a peripheral region of the subpixel, and the second-conductivity-type pinned photodiode layer 602 is located at a center region of the subpixel. Thus, the at least one transfer gate stack structure (614T, 605) at least partially laterally surrounds the second-conductivity-type pinned photodiode layer 602.

In one embodiment, the transfer gate stack structure (614T, 605) may completely encircle the entire area of the second-conductivity-type pinned photodiode layer 602. In this case, the transfer gate stack structure (614T, 605) encircles the second-conductivity-type pinned photodiode layer 602 with a total azimuthal extension angle α of 360 degrees around the geometrical center GC of the second-conductivity-type pinned photodiode layer 602. The total azimuthal angle α is the sum of all angles around the geometrical center GC of the second-conductivity-type pinned photodiode layer 602 within which a transfer gate stack structure (614T, 605) is present.

Referring to FIG. 2D, a second configuration of the first exemplary structure can be derived from the first configuration of the first exemplary structure of FIGS. 2A-2C by changing the annular configuration of the floating diffusion region 608 into an arc configuration such that the floating diffusion region 608 does not completely enclose the second-conductivity-type pinned photodiode layer 602. In this case, the total azimuthal extension angle α of the transfer gate stack structure (614T, 605) around the geometrical center GC of the second-conductivity-type pinned photodiode layer 602 is reduced to an angle less than 360 degrees. In one embodiment, the total azimuthal extension angle α around the geometrical center GC of the second-conductivity-type pinned photodiode layer 602 can be in a range from 240 degrees to less than 360 degrees (such as 355 degrees).

Referring to FIG. 2E, a third configuration of the first exemplary structure can be derived from the second configuration of the first exemplary structure illustrated in FIG. 2D by dividing the transfer gate structure (614T, 605) into a plurality of transfer gate electrodes (614T, 605) that partially encircles the entire area of the second-conductivity-type pinned photodiode layer 602. In such an embodiment, the single transfer gate stack structure (614T, 605) partially encircles the second-conductivity-type pinned photodiode layer 602 with a total azimuthal extension angle α in a range from 240 degrees to less than 360 degrees (such as 355 degrees) around the geometrical center GC of the second-conductivity-type pinned photodiode layer 602.

Referring to FIG. 2F, a fourth configuration of the first exemplary structure may be derived from the third configuration of the first exemplary structure illustrated in FIG. 2E by employing a plurality of transfer gate stack structures (614T, 605) in lieu of a single transfer gate stack structure (614T, 605). In one embodiment, the plurality of transfer gate stack structures (614T, 605) that partially encircles the entire area of the second-conductivity-type pinned photodiode layer 602. In such an embodiment, the plurality of transfer gate stack structures (614T, 605) partially encircles the second-conductivity-type pinned photodiode layer 602 with a total azimuthal extension angle α in a range from 240 degrees to less than 360 degrees (such as 355 degrees) around the geometrical center GC of the second-conductivity-type pinned photodiode layer 602. The total azimuthal extension angle α may be the sum of all azimuthal angles around the geometrical center GC of the second-conductivity-type pinned photodiode layer 602 within which a transfer gate stack structure (614T, 605) is present. For example, the azimuthal extension angle α may be a sum of a first azimuthal extension angle α1 around the geometrical center GC of the second-conductivity-type pinned photodiode layer 602 within which one of the plurality of transfer gate stack structures (614T, 605) is present, and a second azimuthal extension angle α2 around the geometrical center GC of the second-conductivity-type pinned photodiode layer 602 within which another of the plurality of transfer gate stack structures (614T, 605) is present. In case a plurality of transfer gate stack structures (614T, 605) is employed, the plurality of transfer gate electrodes 605 that are interconnected with one another by metal interconnect structures 680. The metal interconnect structures 680 may include a metal line structure 684 and a pair of metal via structures that contact a bottom surface of the metal line structure 684 and a top surface of a respective one of the transfer gate electrodes 605.

Referring collectively to FIGS. 2A-2F, a subpixel may include a second-conductivity-type pinned photodiode layer 602 that forms a p-n junction with the substrate semiconductor layer 601, and at least one floating diffusion region 608 (which may be a single floating diffusion region 608 as illustrated in FIGS. 2A, 2C, and 2D or a plurality of floating diffusion regions 608 as illustrated in FIGS. 2E and 2F) that is laterally spaced from a periphery of the second-conductivity-type pinned photodiode layer 602 and at least partially laterally surrounds the second-conductivity-type pinned photodiode layer 602 (i.e., partially as illustrated in FIGS. 2D, 2E, and 2F or fully as illustrated in FIGS. 2A and 2C). The subpixel may include at least one transfer gate stack structure (614T, 605) including a respective transfer gate dielectric 614T (which is one of the gate dielectrics 614) and a respective transfer gate electrode 605 and located between the second-conductivity-type pinned photodiode layer 602 and the at least one floating diffusion region 608 (in a plan view, i.e., a top-down view). The at least one transfer gate stack structure (614T, 605) may be a single transfer gate stack structure (614T, 605) as illustrated in FIGS. 2A, 2C, 2D, and 2E, or a plurality of transfer gate stack structures (614T, 605) as illustrated in FIG. 2F.

Generally, the at least one transfer gate stack structure (614T, 605) is located at a peripheral region of the subpixel, and the second-conductivity-type pinned photodiode layer 602 is located at a center region of the subpixel. Thus, the at least one transfer gate stack structure (614T, 605) at least partially laterally surrounds the second-conductivity-type pinned photodiode layer 602.

In one embodiment, the at least one transfer gate stack structure (614T, 605) may be a single transfer gate stack structure (614T, 605) that completely encircles the entire area of the second-conductivity-type pinned photodiode layer 602. In such an embodiment, the at least one transfer gate stack structure (614T, 605) encircles the second-conductivity-type pinned photodiode layer 602 with a total azimuthal extension angle α of 360 degrees around the geometrical center GC of the second-conductivity-type pinned photodiode layer 602 as illustrated in FIGS. 2A and 2D. The total azimuthal angle α is the sum of all angles around the geometrical center GC of the second-conductivity-type pinned photodiode layer 602 within which a transfer gate stack structure (614T, 605) is present.

In one embodiment, the at least one transfer gate stack structure (614T, 605) may be a single transfer gate stack structure (614T, 605) that partially encircles the entire area of the second-conductivity-type pinned photodiode layer 602. In such an embodiment, the single transfer gate stack structure (614T, 605) partially encircles the second-conductivity-type pinned photodiode layer 602 with a total azimuthal extension angle α in a range from 240 degrees to less than 360 degrees (such as 355 degrees) around the geometrical center GC of the second-conductivity-type pinned photodiode layer 602 as illustrated in FIG. 2E.

In one embodiment, the at least one transfer gate stack structure (614T, 605) may be a plurality of transfer gate stack structures (614T, 605) that partially encircles the entire area of the second-conductivity-type pinned photodiode layer 602. In such an embodiment, the plurality of transfer gate stack structures (614T, 605) partially encircles the second-conductivity-type pinned photodiode layer 602 with a total azimuthal extension angle α in a range from 240 degrees to less than 360 degrees (such as 355 degrees) around the geometrical center GC of the second-conductivity-type pinned photodiode layer 602 as illustrated in FIG. 2F. The total azimuthal extension angle α may be the sum of all azimuthal angles around the geometrical center GC of the second-conductivity-type pinned photodiode layer 602 within which a transfer gate stack structure (614T, 605) is present. For example, the azimuthal extension angle α may be a sum of a first azimuthal extension angle α1 around the geometrical center GC of the second-conductivity-type pinned photodiode layer 602 within which one of the plurality of transfer gate stack structures (614T, 605) is present, and a second azimuthal extension angle α2 around the geometrical center GC of the second-conductivity-type pinned photodiode layer 602 within which another of the plurality of transfer gate stack structures (614T, 605) is present.

In embodiments in which the at least one transfer gate stack structure (614T, 605) comprises a plurality of transfer gate stack structures (614T, 605), the plurality of transfer gate electrodes 605 that are interconnected with one another by metal interconnect structures 680. The metal interconnect structures 680 may include a metal line structure 684 and a pair of metal via structures that contact a bottom surface of the metal line structure 684 and a top surface of a respective one of the transfer gate electrodes 605.

Generally, the azimuthal extension angle α may be in a range from 240 degrees to 360 degrees around a geometrical center GC of the second-conductivity-type pinned photodiode layer 602 as illustrated in FIGS. 2A, 2C, 2D, 2E, and 2F.

In one embodiment, the at least one floating diffusion region 608 may comprise, and/or may consist of, a single floating diffusion region 608 that partially or completely encircles the entire area of the second-conductivity-type pinned photodiode layer 602 as a single continuous structure. The single floating diffusion region 608 may completely encircle the entire area of the second-conductivity-type pinned photodiode layer 602 as a single continuous structure as illustrated in FIG. 2A. Alternatively, the single floating diffusion region 608 may partially encircle the area of the second-conductivity-type pinned photodiode layer 602 as a single continuous structure as illustrated in FIG. 2D.

In one embodiment, the at least one floating diffusion region 608 may comprise a plurality of floating diffusion regions 608 that are laterally spaced apart from each other or among one another by a shallow trench isolation structure 620 as illustrated in FIGS. 2E and 2F. The plurality of floating diffusion regions 608 may partially encircle the area of the second-conductivity-type pinned photodiode layer 602 with gaps thereamongst. The plurality of floating diffusion regions 608 may be electrically interconnected with each other by metal interconnect structures 680, which may include at least one metal line structure 684 and at least two metal via structures.

In one embodiment, a shallow trench isolation structure 620 laterally encircles, and contacts, each of the at least one floating diffusion region 608. In one embodiment, the shallow trench isolation structure 620 may be laterally spaced from the second-conductivity-type pinned photodiode layer 602 by a semiconductor material portion having a doping of the first-conductivity-type, i.e., by the transfer transistor body region 611, which is the body region of the transfer transistor 630 and includes the semiconductor channel of the transfer transistor 630.

Generally, the sensing circuit (640, 650, 660) of each subpixel may be provided within the area of the unit cell UC. In one embodiment, the various transistors of the sensing circuit (640, 650, 660) may be arranged side by side within an area of a strip located in proximity to an edge of the unit cell UC and extending along the entire length of a side of the unit cell UC or along at least 30% of the length of the side of the unit cell UC as illustrated in FIGS. 2A-2F. In another embodiment, the various transistors of the sensing circuit (640, 650, 660) may be arranged around the floating diffusion region 608 of the transfer transistor 630 within an area of a block located in proximity to a corner of the unit cell UC.

The first exemplary structure includes at least one instance of the subpixel. The first exemplary structure may include an image sensor comprising an array of pixels located on the semiconductor substrate 500. The first exemplary structure may include a plurality of subpixels located within a respective pixel in the array of pixels. In one embodiment, each pixel within the array of pixels comprises a respective instance of the subpixel.

Figure 3A:
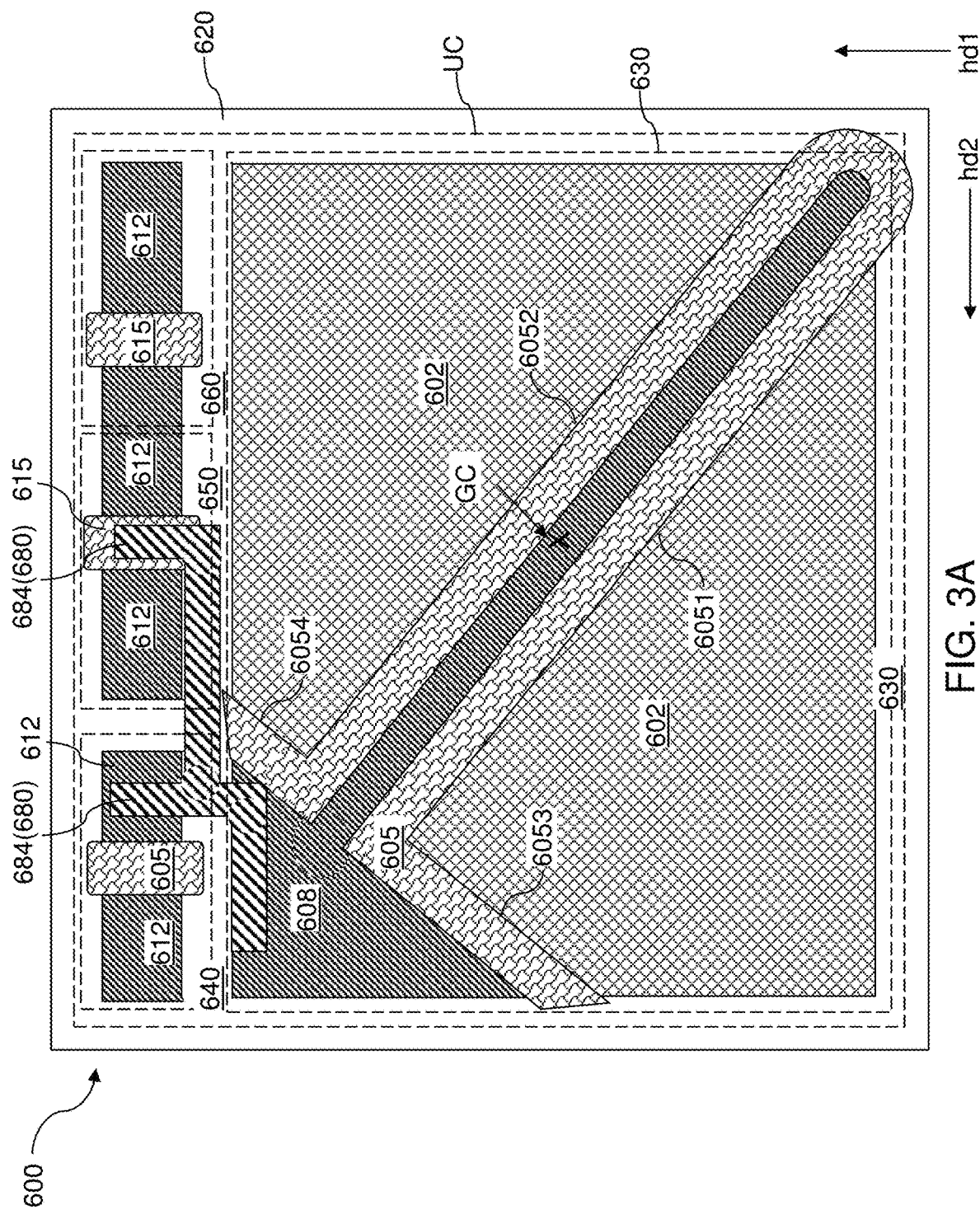
FIG. 3A is a plan view of front side sensor components within the area of a subpixel in a first configuration of a second exemplary structure according to an embodiment of the present disclosure.
Figure 3B:
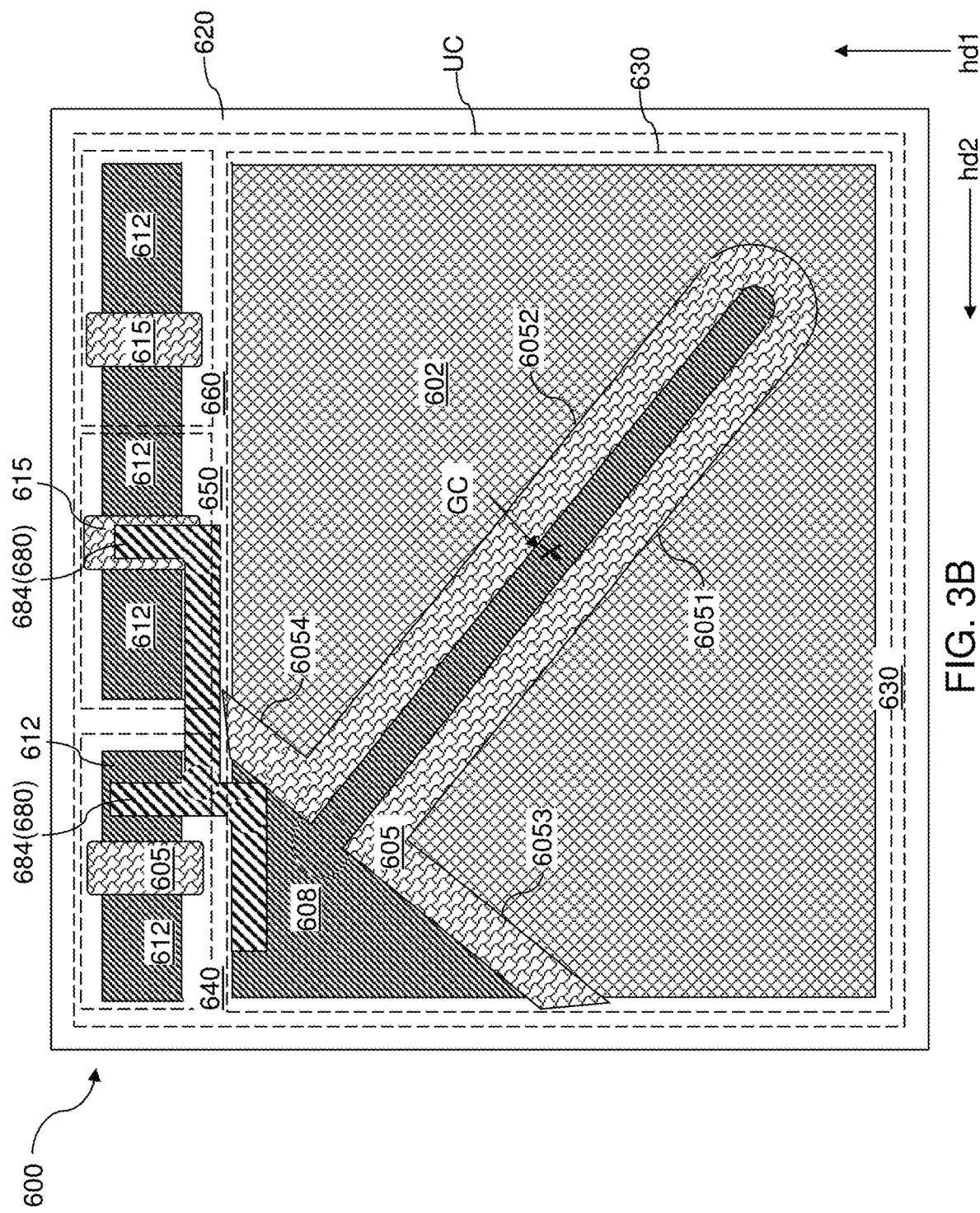
FIG. 3B is a plan view of front side sensor components within the area of a subpixel in a second configuration of the second exemplary structure according to an embodiment of the present disclosure.
Figure 3C:
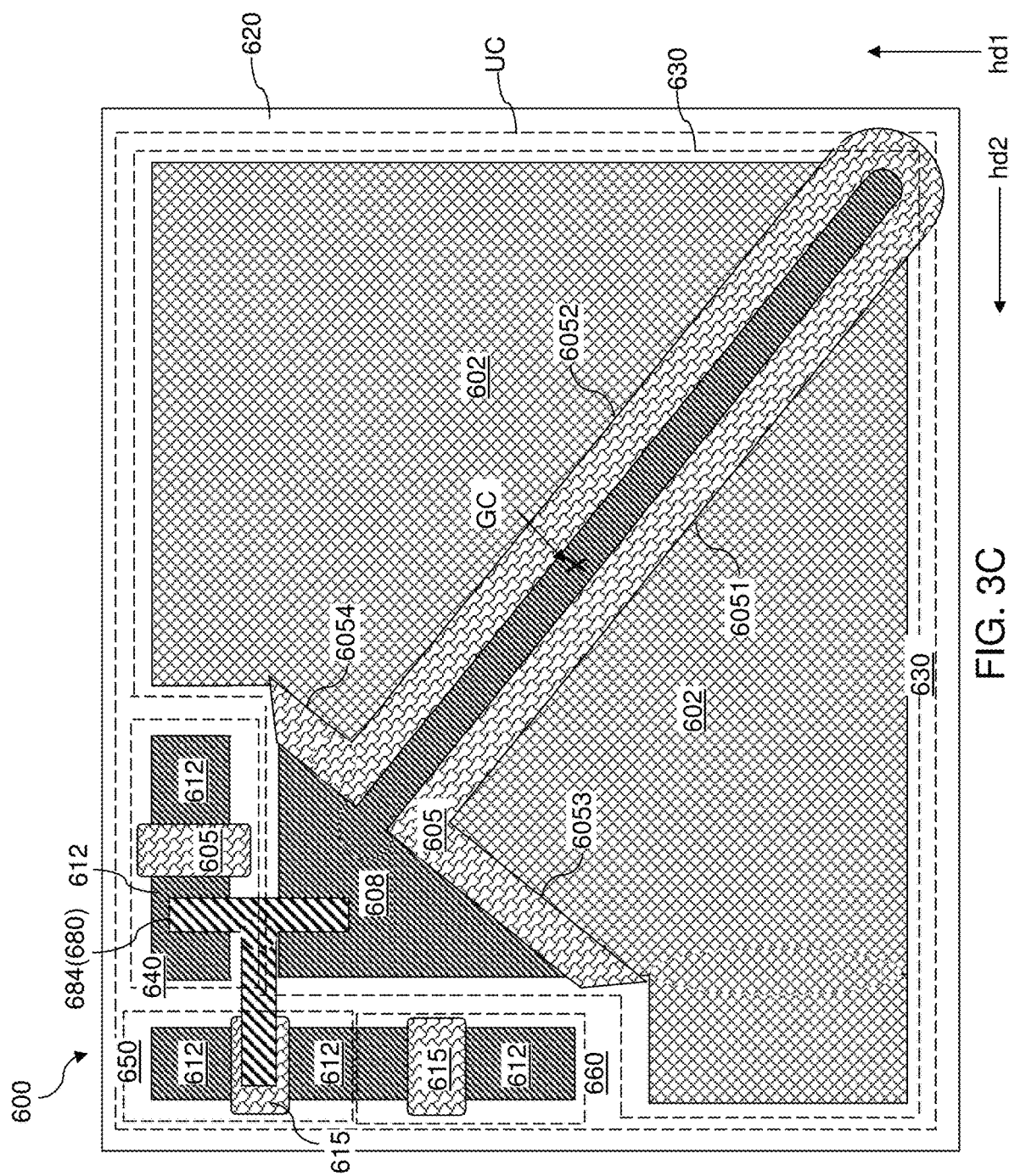
FIG. 3C is a plan view of front side sensor components within the area of a subpixel in a third configuration of the second exemplary structure according to an embodiment of the present disclosure.
Figure 3D:
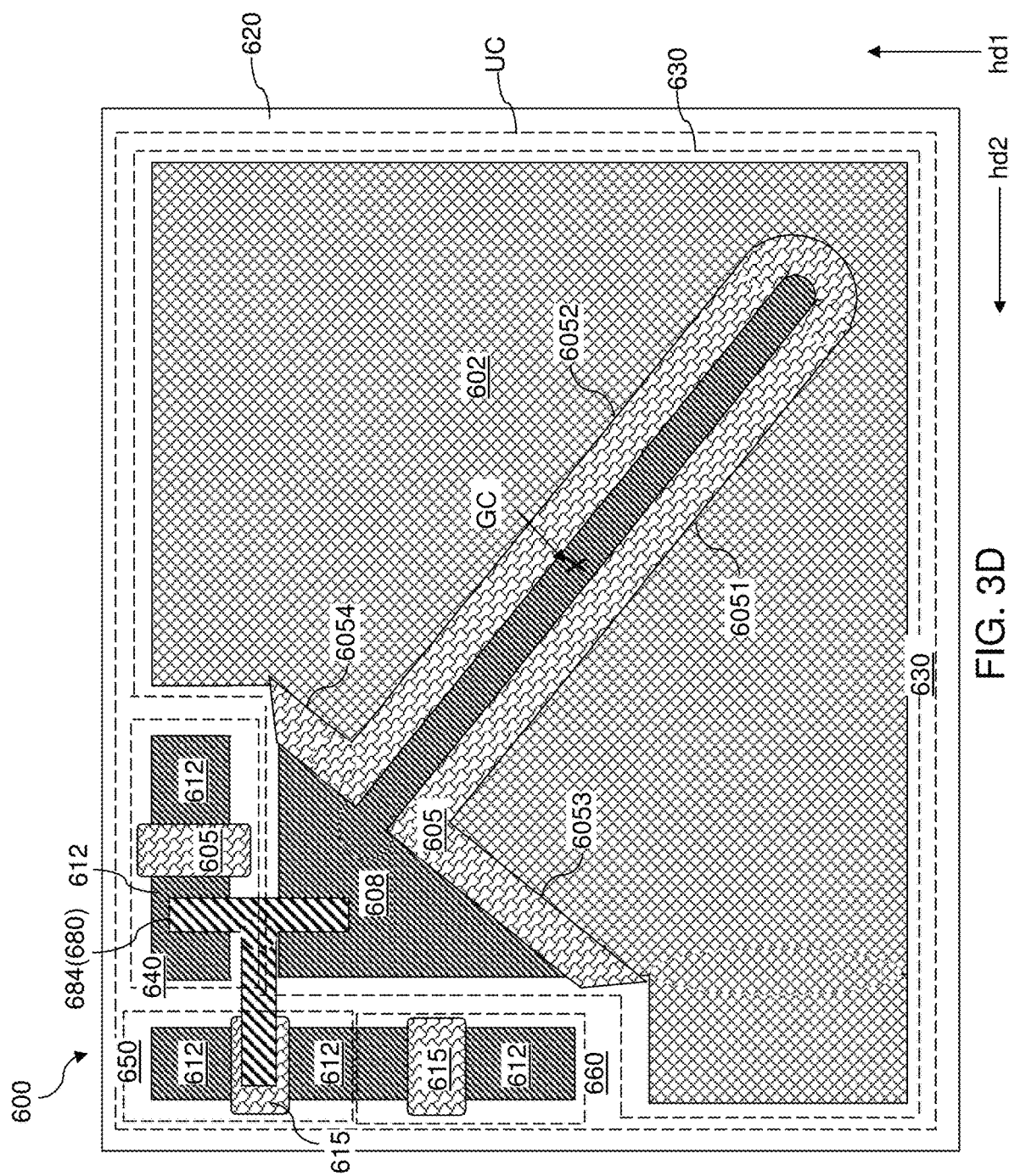
FIG. 3D is a plan view of front side sensor components within the area of a subpixel in a fourth configuration of the second exemplary structure according to an embodiment of the present disclosure.
Figure 3E:
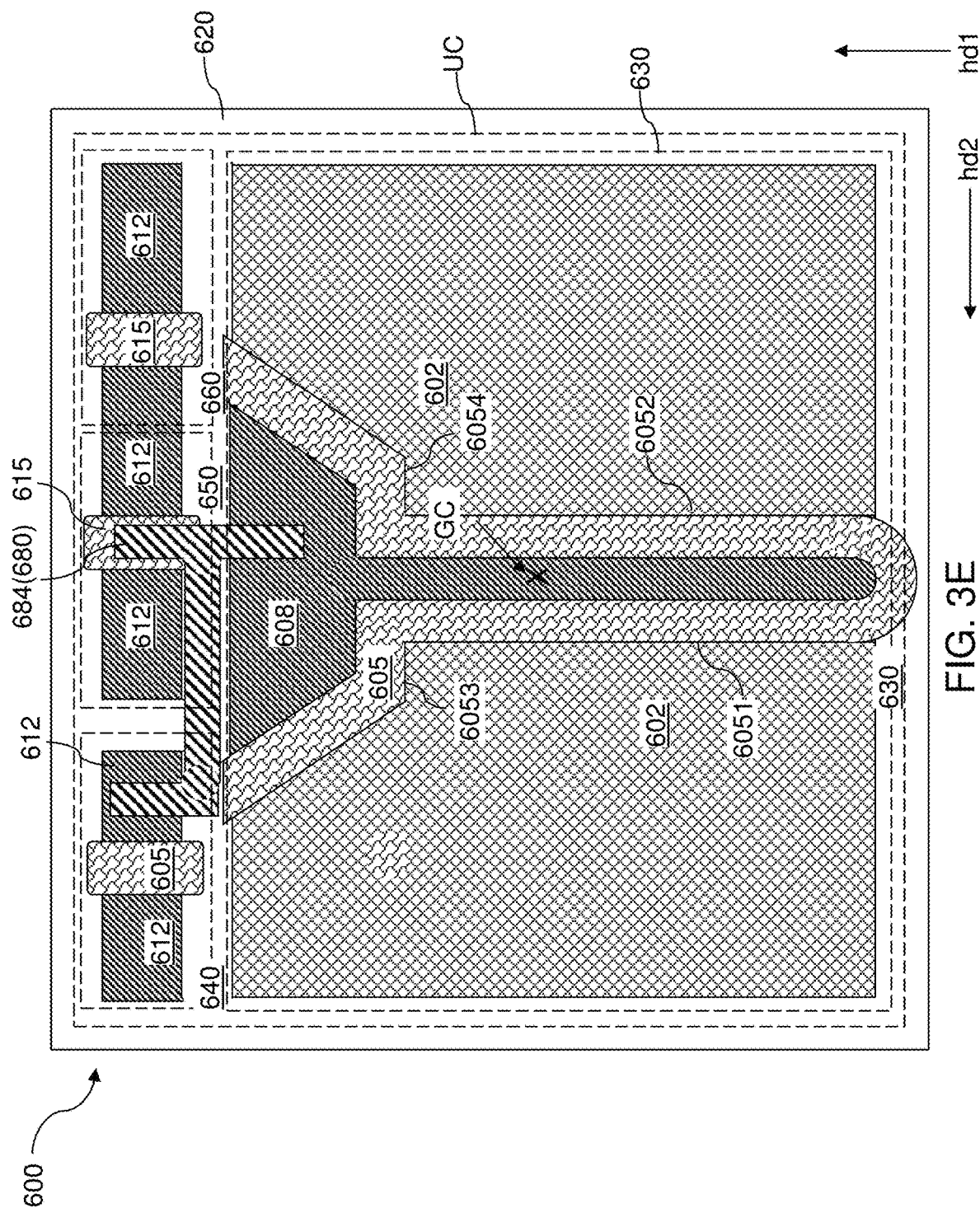
FIG. 3E is a plan view of front side sensor components within the area of a subpixel in a fifth configuration of the second exemplary structure according to an embodiment of the present disclosure.
Figure 3F:
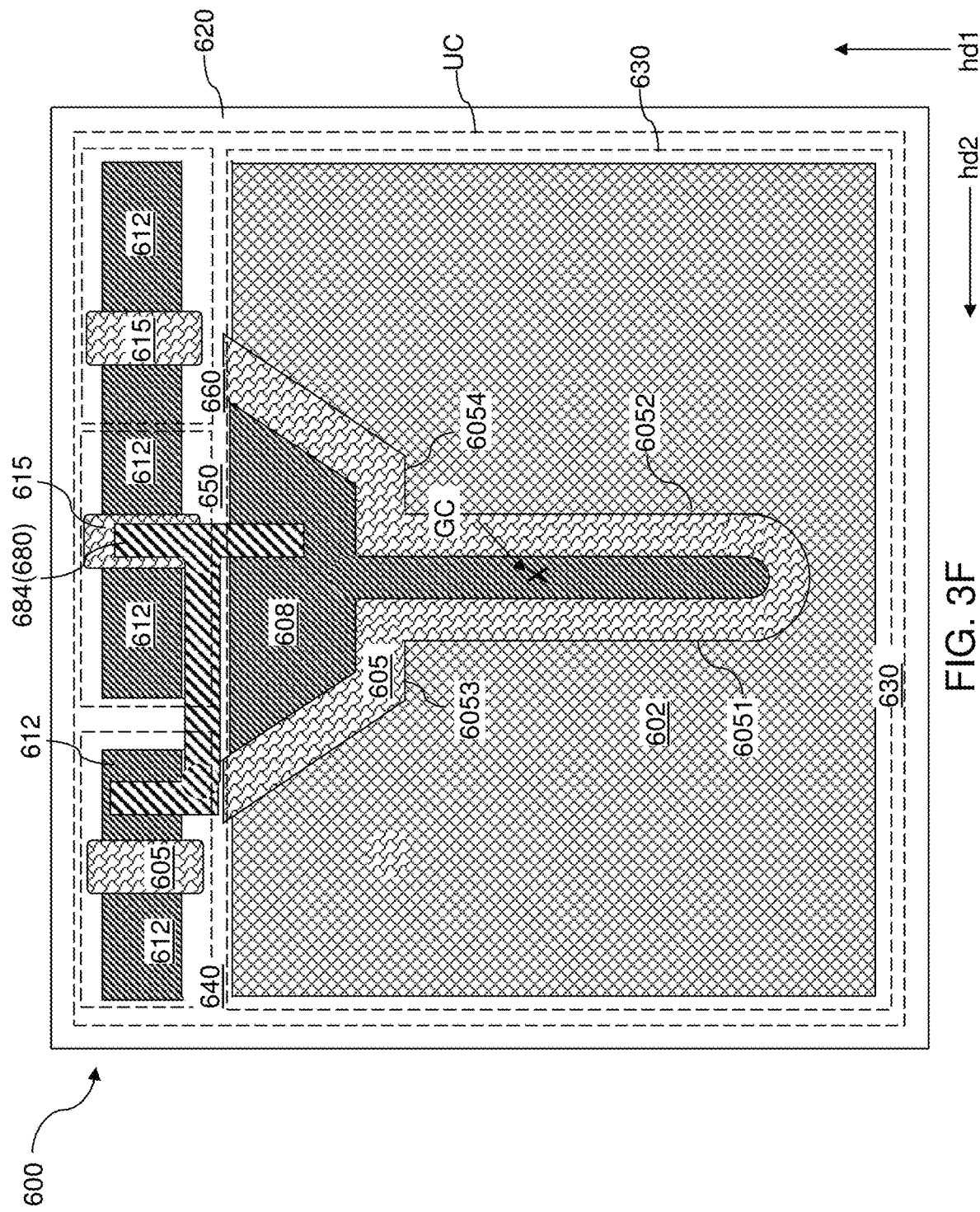
FIG. 3F is a plan view of front side sensor components within the area of a subpixel in a sixth configuration of the second exemplary structure according to an embodiment of the present disclosure.

FIG. 3A is a plan view of front side sensor components within the area of a subpixel in a first configuration of a second exemplary structure according to an embodiment of the present disclosure. FIG. 3B is a plan view of front side sensor components within the area of a subpixel in a second configuration of the second exemplary structure according to an embodiment of the present disclosure. FIG. 3C is a plan view of front side sensor components within the area of a subpixel in a third configuration of the second exemplary structure according to an embodiment of the present disclosure. FIG. 3D is a plan view of front side sensor components within the area of a subpixel in a fourth configuration of the second exemplary structure according to an embodiment of the present disclosure. FIG. 3E is a plan view of front side sensor components within the area of a subpixel in a fifth configuration of the second exemplary structure according to an embodiment of the present disclosure. FIG. 3F is a plan view of front side sensor components within the area of a subpixel in a sixth configuration of the second exemplary structure according to an embodiment of the present disclosure.

Referring to FIG. 3A, the first configuration of the second exemplary structure may be derived from the first exemplary structure by changing the shapes of the second-conductivity-type pinned photodiode layer 602, the gate stack structure (614T, 605), and the floating diffusion region 608 in a manner that provides a protruding portion of the floating diffusion region 608 at, or in proximity to, the geometrical center of the second-conductivity-type pinned photodiode layer 602.

The first configuration of the second exemplary structure include two second-conductivity-type pinned photodiode layers 602 that form p-n junctions with the substrate semiconductor layer 601. A floating diffusion region 608 can be laterally spaced from the two second-conductivity-type pinned photodiode layers 602. A transfer gate stack structure (614T, 605) including a transfer gate dielectric 614T and a transfer gate electrode 605 may be located between the two second-conductivity-type pinned photodiode layers 602 and the floating diffusion region 608. While the transfer gate dielectric 614T is not expressly illustrated in FIG. 3A, it is understood that the transfer gate dielectric 614T has the same area as the transfer gate electrode 605. The transfer gate stack structure (614T, 605) may be located between the floating diffusion region 608 and each of the two second-conductivity-type pinned photodiode layers 602.

In one embodiment, the gate length of the transfer gate stack structure (614T, 605), i.e., the width of the transfer gate stack structure (614T, 605) along the horizontal direction connecting each second-conductivity-type pinned photodiode layer 602 and the floating diffusion region 608, may be uniform throughout.

The horizontal shape of each second-conductivity-type pinned photodiode layer 602 provide a periphery, which is herein referred to as the periphery of the respective second-conductivity-type pinned photodiode layer 602. Thus, the two second-conductivity-type pinned photodiode layers 602 provide two peripheries. In one embodiment, the second-conductivity-type pinned photodiode layers 602 may be laterally spaced from each other by a respective portion of the transfer gate stack structure (614T, 605).

The transfer gate stack structure (614T, 605) may have a first edge 6051 that overlies a first segment of the peripheries of the two second-conductivity-type pinned photodiode layers 602 and a second edge 6052 that overlies a second segment of the peripheries of the two second-conductivity-type pinned photodiode layers 602.

According to an embodiment of the present disclosure, the floating diffusion region 608 may comprise a portion located between the first edge 6051 and the second edge 6052. In one embodiment, the first edge 6051 of the transfer gate stack structure (614T, 605) and the second edge 6052 of the transfer gate stack structure (614T, 605) may be parallel to each other.

In one embodiment, the floating diffusion region 608 and the transfer gate stack structure (614T, 605) can include a diagonally-extending straight portion that extends to a corner of the unit cell UC. In this case, the first edge 6051 of the transfer gate stack structure (614T, 605) and the second edge 6052 of the transfer gate stack structure (614T, 605) may not be parallel to one of the horizontal directions (hd1, hd2) along which the unit cell UC is repeated along a horizontal direction. The geometrical center GC of the second-conductivity-type pinned photodiode layers 602 can be located within the area of the floating diffusion region 608. A sensing circuit (640, 650, 660) within each unit cell UC can be formed on a side of a rectangular area of the unit cell UC. The first edge 6051 of the transfer gate stack structure (614T, 605) and the second edge 6052 of the transfer gate stack structure (614T, 605) may be connected to each other by another edge of the transfer gate stack structure (614T, 605) that overlies a portion of a shallow trench isolation structure 620.

Referring to FIG. 3B, the second configuration of the second exemplary structure can be derived from the first configuration of the second exemplary structure illustrated in FIG. 3A by shortening the diagonally-extending straight portion of the floating diffusion region 608 and the transfer gate stack structure (614T, 605). In this case, the two second-conductivity-type pinned photodiode layers 602 of the first configuration of the second exemplary structure of FIG. 3A can be merged to form a single second-conductivity-type pinned photodiode layer 602. The first edge 6051 of the transfer gate stack structure (614T, 605) and the second edge 6052 of the transfer gate stack structure (614T, 605) may be connected to each other entirely by another edge of the transfer gate stack structure (614T, 605) that overlies a segment of a periphery of a second-conductivity-type pinned photodiode layers 602.

Referring to FIG. 3C, a third configuration of the second exemplary structure can be derived from the first configuration of the second exemplary structure of FIG. 3A by forming a sensing circuit (640, 650, 660) within each unit cell UC within a corner region of a rectangular area of the unit cell UC. The first edge 6051 of the transfer gate stack structure (614T, 605) and the second edge 6052 of the transfer gate stack structure (614T, 605) may be connected to each other by another edge of the transfer gate stack structure (614T, 605) that overlies a portion of a shallow trench isolation structure 620.

Referring to FIG. 3D, a fourth configuration of the second exemplary structure can be derived from the third configuration of the second exemplary structure of FIG. 3C by forming a sensing circuit (640, 650, 660) within each unit cell UC within a corner region of a rectangular area of the unit cell UC. The first edge 6051 of the transfer gate stack structure (614T, 605) and the second edge 6052 of the transfer gate stack structure (614T, 605) may be connected to each other entirely by another edge of the transfer gate stack structure (614T, 605) that overlies a segment of a periphery of a second-conductivity-type pinned photodiode layers 602.

Referring to FIG. 3E, a fifth configuration of the second exemplary structure can be derived from the first configuration or the third configuration of the second exemplary structure by forming the floating diffusion region 608 and the transfer gate stack structure (614T, 605) to include a straight portion that extends parallel to a side of a rectangular shape of the unit cell UC. In this case, the first edge 6051 of the transfer gate stack structure (614T, 605) and the second edge 6052 of the transfer gate stack structure (614T, 605) may be parallel to one of the horizontal directions (hd1, hd2) along which the unit cell UC is repeated along a horizontal direction. The first edge 6051 of the transfer gate stack structure (614T, 605) and the second edge 6052 of the transfer gate stack structure (614T, 605) may be connected to each other by another edge of the transfer gate stack structure (614T, 605) that overlies a portion of a shallow trench isolation structure 620.

Referring to FIG. 3F, a sixth configuration of the second exemplary structure can be derived from the second configuration or the fourth configuration of the second exemplary structure by forming the floating diffusion region 608 and the transfer gate stack structure (614T, 605) to include a straight portion that extends parallel to a side of a rectangular shape of the unit cell UC. In this case, the first edge 6051 of the transfer gate stack structure (614T, 605) and the second edge 6052 of the transfer gate stack structure (614T, 605) may be parallel to one of the horizontal directions (hd1, hd2) along which the unit cell UC is repeated along a horizontal direction. The first edge 6051 of the transfer gate stack structure (614T, 605) and the second edge 6052 of the transfer gate stack structure (614T, 605) may be connected to each other entirely by another edge of the transfer gate stack structure (614T, 605) that overlies a segment of a periphery of a second-conductivity-type pinned photodiode layers 602.

Generally, the various configurations of a second exemplary structure illustrated in FIGS. 3A-3F may be derived from the first exemplary structure by changing the shapes of the second-conductivity-type pinned photodiode layer 602, the gate stack structure (614T, 605), and the floating diffusion region 608 in a manner that provides a protruding portion of the floating diffusion region 608 at, or in proximity to, the geometrical center of the second-conductivity-type pinned photodiode layer 602.

The various configurations of the second exemplary structure include at least one second-conductivity-type pinned photodiode layer 602 that forms at least one p-n junction with the substrate semiconductor layer 601. The at least one second-conductivity-type pinned photodiode layer 602 may be a single second-conductivity-type pinned photodiode layer 602 as illustrated in FIGS. 3B, 3D, and 3F, or may be a plurality of second-conductivity-type pinned photodiode layers 602 as illustrated in FIGS. 3A, 3C, and 3E.

The various configurations of the second exemplary structure include a floating diffusion region 608 that may be laterally spaced from the at least one second-conductivity-type pinned photodiode layer 602. A transfer gate stack structure (614T, 605) including a transfer gate dielectric 614T and a transfer gate electrode 605 may be located between the at least one second-conductivity-type pinned photodiode layer 602 and the floating diffusion region 608. While the transfer gate dielectric 614T is not expressly illustrated in FIGS. 3A-3F, it is understood that the transfer gate dielectric 614T provide the same horizontal cross-sectional shape as the transfer gate electrode 605 illustrated in each configuration. The transfer gate stack structure (614T, 605) may be located between the floating diffusion region 608 and each of the at least one second-conductivity-type pinned photodiode layer 602.

In one embodiment, the gate length of the transfer gate stack structure (614T, 605), i.e., the width of the transfer gate stack structure (614T, 605) along the horizontal direction connecting each second-conductivity-type pinned photodiode layer 602 and the floating diffusion region 608, may be uniform throughout.

The horizontal shape of each second-conductivity-type pinned photodiode layer 602 provide a periphery, which is herein referred to as the periphery of the respective second-conductivity-type pinned photodiode layer 602. Thus, the at least one second-conductivity-type pinned photodiode layer 602 provide at least one periphery, which may be a single periphery in embodiments in which the at least one second-conductivity-type pinned photodiode layer 602 consists of a single second-conductivity-type pinned photodiode layer 602. Alternatively, the at least one second-conductivity-type pinned photodiode layer 602 provide a plurality of peripheries in embodiments in which the at least one second-conductivity-type pinned photodiode layer 602 comprises a plurality of second-conductivity-type pinned photodiode layers 602. In embodiments in which a plurality of second-conductivity-type pinned photodiode layers 602 may be present, the second-conductivity-type pinned photodiode layers 602 may be laterally spaced from each other by a respective portion of the transfer gate stack structure (614T, 605).

The transfer gate stack structure (614T, 605) may have a first edge 6051 that overlies a first segment of at least one periphery of the at least one second-conductivity-type pinned photodiode layer 602 and a second edge 6052 that overlies a second segment of the at least one periphery of the at least one second-conductivity-type pinned photodiode layer 602. In embodiments in which the at least one periphery consists of a single periphery of a single second-conductivity-type pinned photodiode layer 602, the first edge 6051 may overlie the first segment of the periphery of the single second-conductivity-type pinned photodiode layer 602 and the second edge 6052 may overlie the second segment of the periphery of the single second-conductivity-type pinned photodiode layer 602 as illustrated in FIGS. 3B, 3D, and 3F. In embodiments in which the at least one periphery comprises a plurality of peripheries of a plurality of second-conductivity-type pinned photodiode layers 602, the first edge 6051 may overlie a segment of a periphery of one of the plurality of second-conductivity-type pinned photodiode layers 602 and the second edge 6052 may overlie a segment of the periphery of another of the plurality of second-conductivity-type pinned photodiode layers 602 as illustrated in FIGS. 3A, 3C, and 3E.

According to an embodiment of the present disclosure, the floating diffusion region 608 may comprise a portion located between the first edge 6051 and the second edge 6052. In one embodiment, the first edge 6051 of the transfer gate stack structure (614T, 605) and the second edge 6052 of the transfer gate stack structure (614T, 605) may be parallel to each other as illustrated in FIGS. 3A-3F.

In one embodiment, the first edge 6051 of the transfer gate stack structure (614T, 605) and the second edge 6052 of the transfer gate stack structure (614T, 605) may be parallel to one of the horizontal directions (hd1, hd2) along which the unit cell UC is repeated along a horizontal direction as illustrated in FIGS. 3E and 3F. Alternatively, the first edge 6051 of the transfer gate stack structure (614T, 605) and the second edge 6052 of the transfer gate stack structure (614T, 605) may not be parallel to one of the horizontal directions (hd1, hd2) along which the unit cell UC is repeated along a horizontal direction as illustrated in FIGS. 3A-3D.

In one embodiment, the first edge 6051 of the transfer gate stack structure (614T, 605) and the second edge 6052 of the transfer gate stack structure (614T, 605) may be connected to each other entirely by another edge of the transfer gate stack structure (614T, 605) that overlies a segment of a periphery of a second-conductivity-type pinned photodiode layers 602 as illustrated in FIGS. 3B, 3D, and 3F. Alternatively, the first edge 6051 of the transfer gate stack structure (614T, 605) and the second edge 6052 of the transfer gate stack structure (614T, 605) may be connected to each other by another edge of the transfer gate stack structure (614T, 605) that overlies a portion of a shallow trench isolation structure 620 as illustrated in FIGS. 3A, 3C, and 3E.

Generally, the transfer gate stack structure (614T, 605) comprises a third edge 6053 that is adjoined to the first edge 6051 and comprises a fourth edge 6054 that is adjoined to the second edge 6052. A significant change in direction of the edges may be present at a location at which the third edge 6053 adjoins the first edge 6051, and/or at a location at which the fourth edge 6054 adjoins the second edge 6052. The angle between the third edge 6053 and the first edge 6051 may, or may not, be orthogonal. In one embodiment, the angle between the third edge 6053 and the first edge 6051 may be in a range from 45 degrees to 135 degrees. The angle between the fourth edge 6054 and the second edge 6052 may, or may not, be orthogonal. In one embodiment, the angle between the fourth edge 6054 and the second edge 6052 may be in a range from 45 degrees to 135 degrees.

In one embodiment, the protruding portion of the floating diffusion region 608 may laterally extend toward the geometrical center of the at least one second-conductivity-type pinned photodiode layer 602. A geometrical center GC of the at least one second-conductivity-type pinned photodiode layer 602 is the point having a Cartesian coordinate that is the average of the Cartesian coordinates of all points within the at least one second-conductivity-type pinned photodiode layer 602. In one embodiment, the geometrical center GC of the at least one second-conductivity-type pinned photodiode layer 602 may be located outside the at least one second-conductivity-type pinned photodiode layer 602 (i.e., outside the volume of the at least one second-conductivity-type pinned photodiode layer 602). The geometrical center GC of the at least one second-conductivity-type pinned photodiode layer 602 may be located within, or may underlie, the transfer gate stack structure (614T, 605) or the floating diffusion region 608. Specifically, the geometrical center GC of the at least one second-conductivity-type pinned photodiode layer 602 may underlie the transfer gate stack structure (614T, 605), or may be located within, or may underlie, the floating diffusion region 608.

FIGS. 3A-3F illustrate examples in which the geometrical center GC of the at least one second-conductivity-type pinned photodiode layer 602 is located within, or underlies, the floating diffusion region 608. However, placement of the geometrical center GC of the at least one second-conductivity-type pinned photodiode layer 602 underneath the transfer gate stack structure (614T, 605) may be effected by modifying the shape of the transfer gate stack structure (614T, 605), thereby modifying the shapes of the floating diffusion region 608 and the at least one second-conductivity-type pinned photodiode layer 602.

In one embodiment, the at least one second-conductivity-type pinned photodiode layer 602 comprises, and consists of, a single continuous second-conductivity-type pinned photodiode layer 602 including each portion of the at least one second-conductivity-type pinned photodiode layer 602 as illustrated in FIGS. 3B, 3D, and 3F. In another embodiment, the at least one second-conductivity-type pinned photodiode layer 602 comprises a plurality of second-conductivity-type pinned photodiode layers 602 that do not directly contact each other or one another, and are laterally spaced apart by a semiconductor material portion (such as the transfer transistor body region 611) that underlies the transfer gate stack structure and having a doping of the first-conductivity-type.

Generally, the sensing circuit (640, 650, 660) of each subpixel may be provided within the area of the unit cell UC. In one embodiment, the various transistors of the sensing circuit (640, 650, 660) may be arranged side by side within an area of a strip located in proximity to an edge of the unit cell UC and extending along the entire length of a side of the unit cell UC or along at least 30% of the length of the side of the unit cell UC as illustrated in FIGS. 3A, 3B, 3E, and 3F. In another embodiment, the various transistors of the sensing circuit (640, 650, 660) may be arranged around the floating diffusion region 608 of the transfer transistor 630 within an area of a block located in proximity to a corner of the unit cell UC as illustrated in FIGS. 3C and 3D.

The second exemplary structure includes at least one instance of the subpixel. The second exemplary structure may include an image sensor comprising an array of pixels located on the semiconductor substrate 500. The second exemplary structure may include a plurality of subpixels located within a respective pixel in the array of pixels. In one embodiment, each pixel within the array of pixels comprises a respective instance of the subpixel.

Figure 4A:
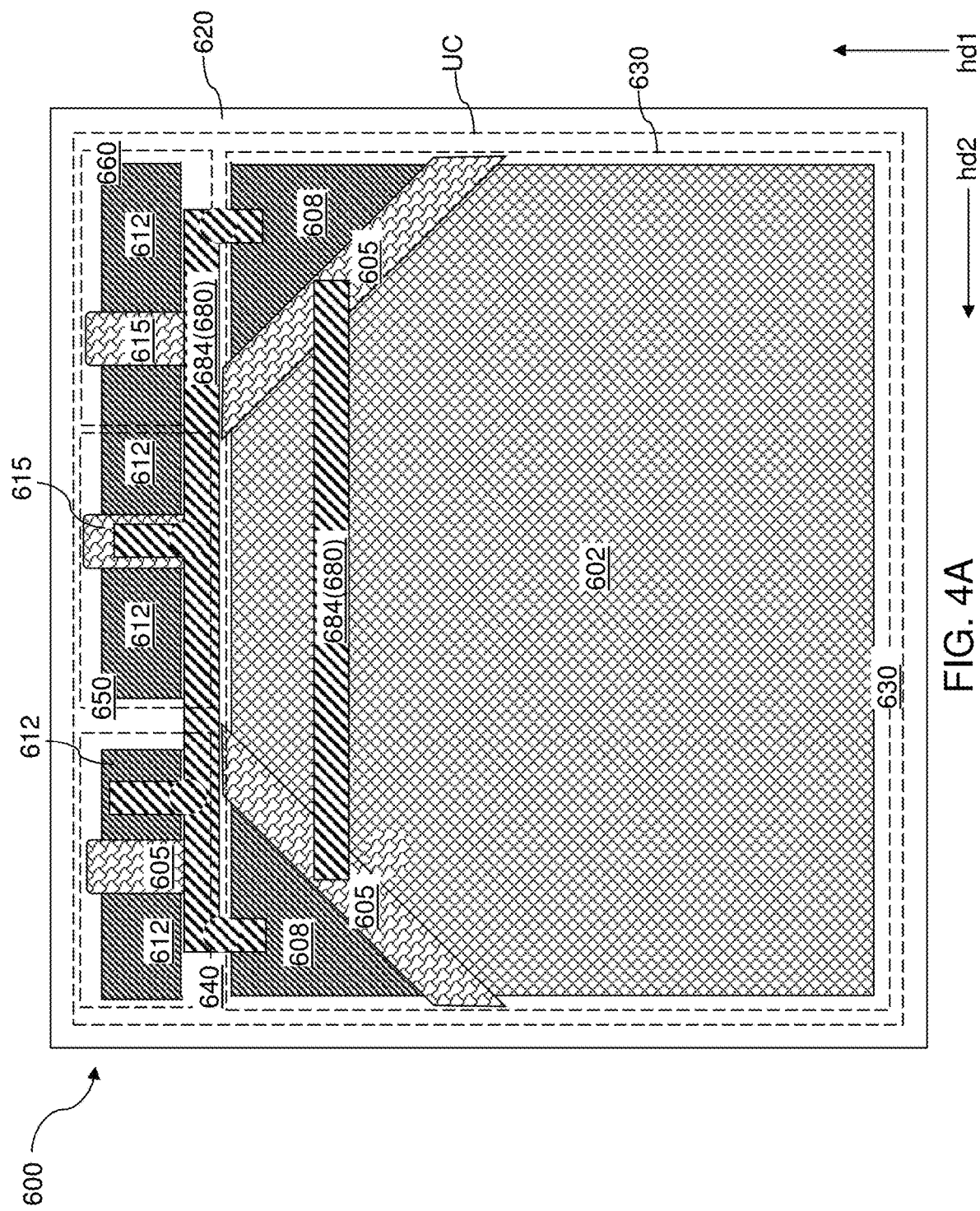
FIG. 4A is a plan view of front side sensor components within the area of a subpixel in a first configuration of a third exemplary structure according to an embodiment of the present disclosure.
Figure 4B:
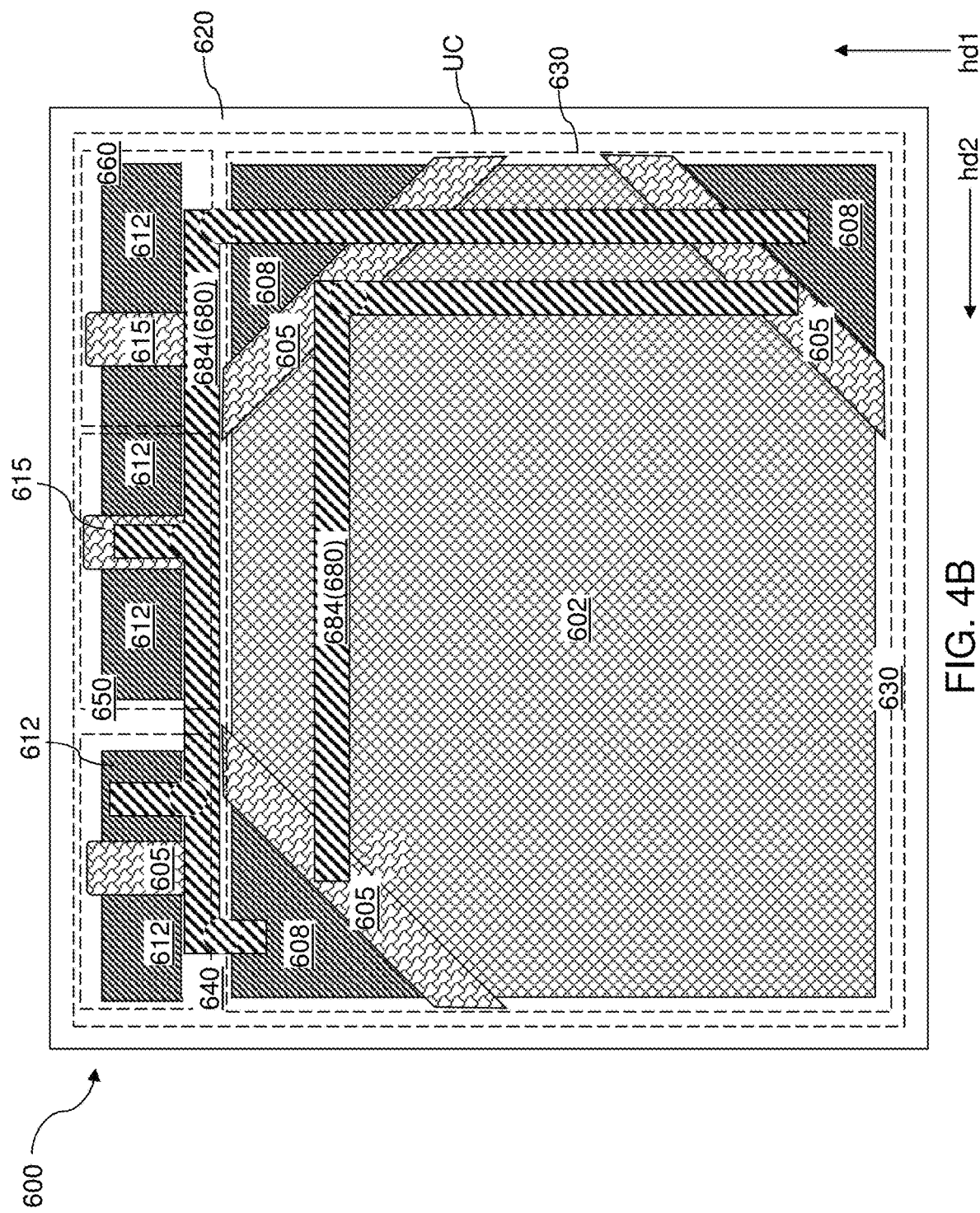
FIG. 4B is a plan view of front side sensor components within the area of a subpixel in a second configuration of the third exemplary structure according to an embodiment of the present disclosure.
Figure 4C:
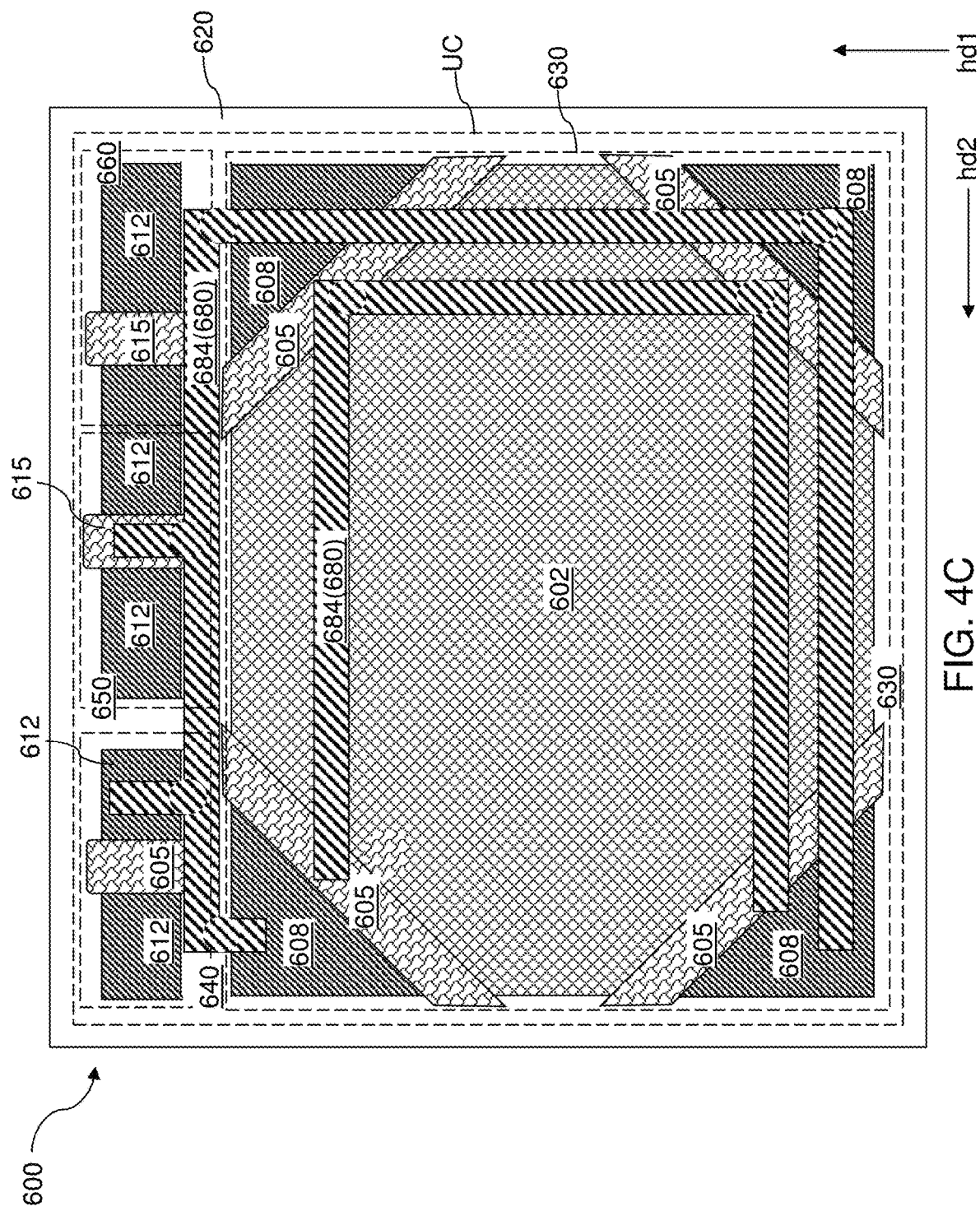
FIG. 4C is a plan view of front side sensor components within the area of a subpixel in a third configuration of the third exemplary structure according to an embodiment of the present disclosure.
Figure 4D:
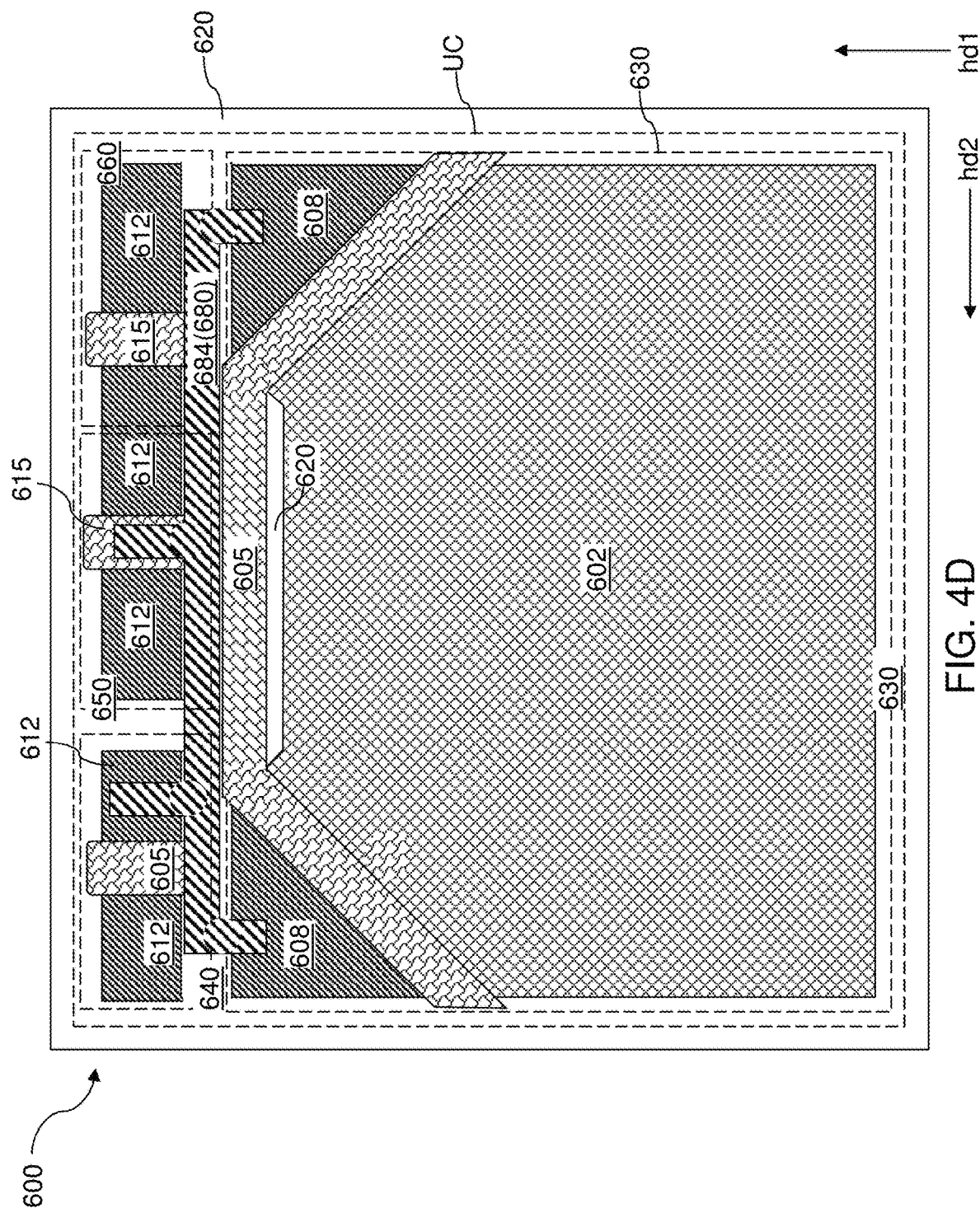
FIG. 4D is a plan view of front side sensor components within the area of a subpixel in a fourth configuration of the third exemplary structure according to an embodiment of the present disclosure.
Figure 4E:
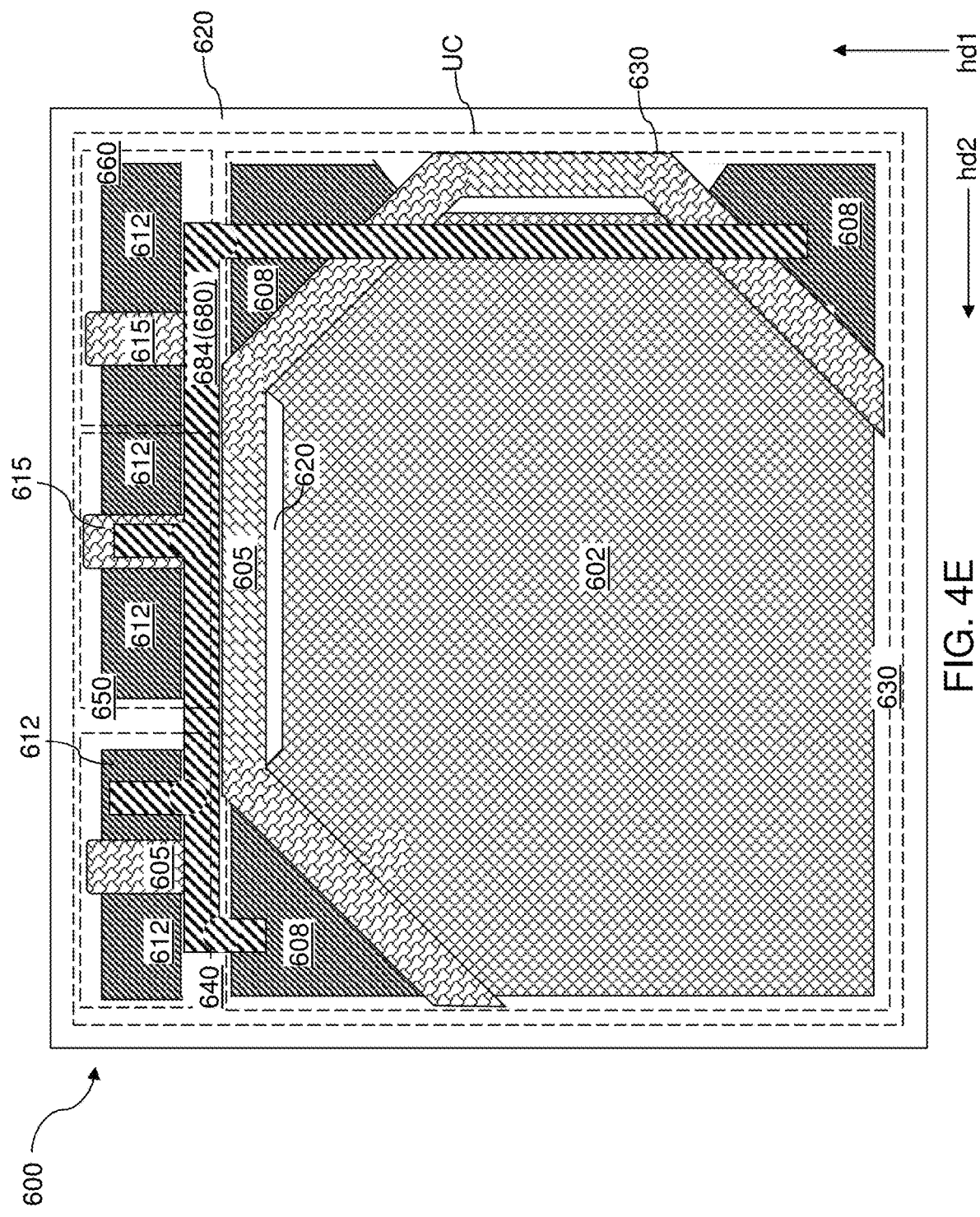
FIG. 4E is a plan view of front side sensor components within the area of a subpixel in a fifth configuration of the third exemplary structure according to an embodiment of the present disclosure.
Figure 4F:
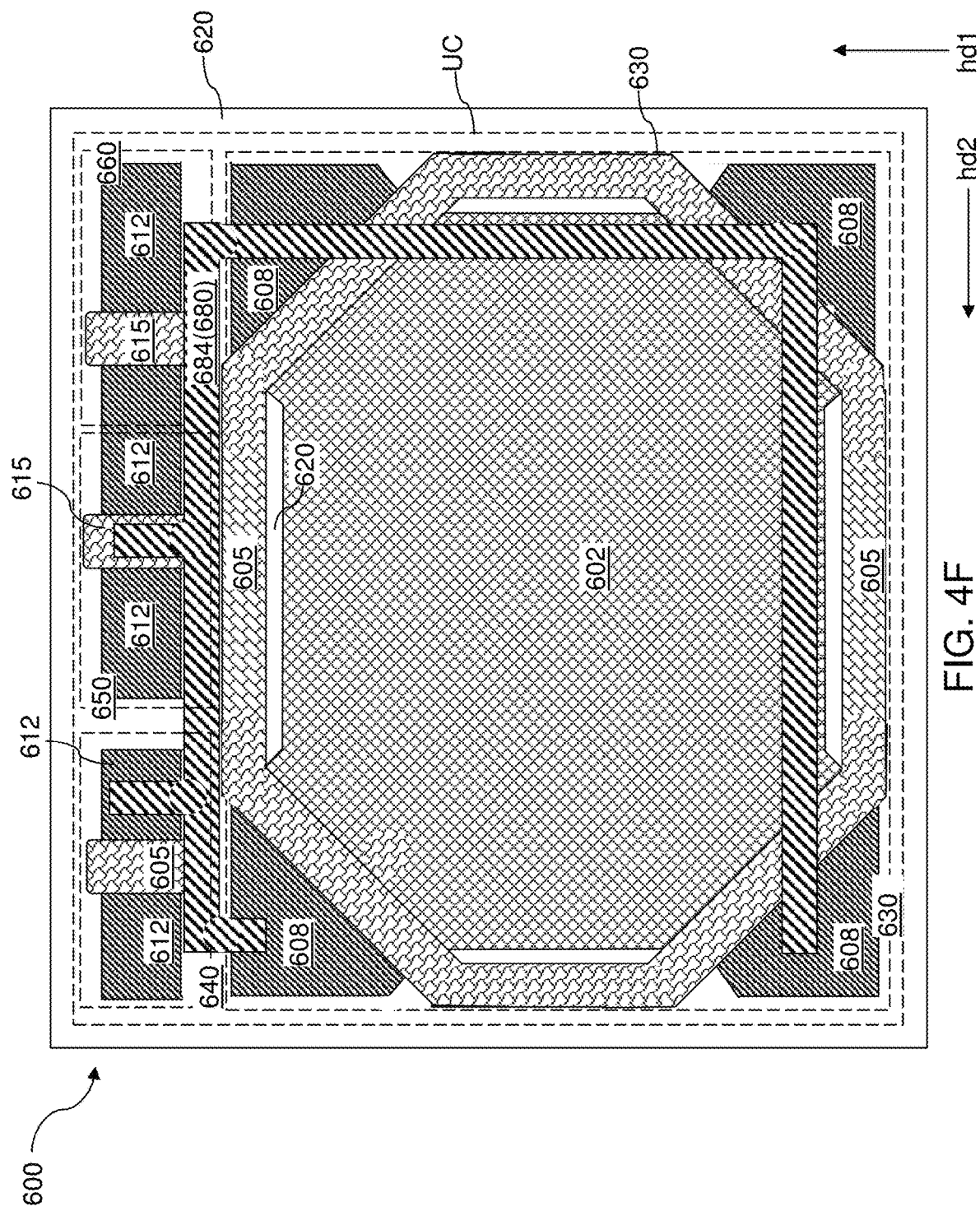
FIG. 4F is a plan view of front side sensor components within the area of a subpixel in a sixth configuration of the third exemplary structure according to an embodiment of the present disclosure.

FIG. 4A is a plan view of front side sensor components within the area of a subpixel in a first configuration of a third exemplary structure according to an embodiment of the present disclosure. FIG. 4B is a plan view of front side sensor components within the area of a subpixel in a second configuration of the third exemplary structure according to an embodiment of the present disclosure. FIG. 4C is a plan view of front side sensor components within the area of a subpixel in a third configuration of the third exemplary structure according to an embodiment of the present disclosure. FIG. 4D is a plan view of front side sensor components within the area of a subpixel in a fourth configuration of the third exemplary structure according to an embodiment of the present disclosure. FIG. 4E is a plan view of front side sensor components within the area of a subpixel in a fifth configuration of the third exemplary structure according to an embodiment of the present disclosure. FIG. 4F is a plan view of front side sensor components within the area of a subpixel in a sixth configuration of the third exemplary structure according to an embodiment of the present disclosure.

Referring to FIG. 4A, a first configuration of the third exemplary structure is illustrated, which may be derived from the first exemplary structure or from the second exemplary structure by changing the shapes of the second-conductivity-type pinned photodiode layer 602, the gate stack structure (614T, 605), and the floating diffusion region 608 in a manner that provides a plurality of floating diffusion regions 608 around the second-conductivity-type pinned photodiode layer 602. The floating diffusion regions 608 may be laterally spaced from each other or among one another, and may be electrically connected among one another by metal interconnect structures 680. The metal interconnect structures 680 may include at least one metal line structure 684 and at least two metal via structures.

A second-conductivity-type pinned photodiode layer 602 forms a p-n junction with the substrate semiconductor layer 601. The second-conductivity-type pinned photodiode layer 602 may be a single continuous structure located at a center portion of the subpixel, and may have a periphery that extends to the shallow trench isolation structure 620 located at a periphery of the subpixel. The geometrical center of the second-conductivity-type pinned photodiode layer 602 may be located within the second-conductivity-type pinned photodiode layer 602.

A plurality of floating diffusion regions 608 may be laterally spaced from the second-conductivity-type pinned photodiode layer 602. The floating diffusion regions 608 do not contact each other or among one another, and are laterally spaced apart from each other or among one another by the second-conductivity-type pinned photodiode layer 602 and by a plurality of transfer gate stack structures (614T, 605). In one embodiment, the floating diffusion regions 608 may be electrically connected (i.e., electrically shorted) to each other or one another by a set of metal interconnect structures 680, which may include at least one metal line structure 684 and at least two metal via structures.

Each transfer gate stack structure (614T, 605) includes a respective transfer gate dielectric 614T and a respective transfer gate electrode 605. Each transfer gate stack structure (614T, 605) may be located between the second-conductivity-type pinned photodiode layer 602 and a respective one of the floating diffusion regions 608.

In one embodiment, multiple discrete transfer gate stack structures (614T, 605) that are not in direct contact with each other or among one another can be provided. In one embodiment, a plurality of discrete transfer gate electrodes 605 may be electrically connected (i.e., electrically shorted) to each other or one another by a set of metal interconnect structures 680, which may include at least one metal line structure 684 and at least two metal via structures.

While the transfer gate dielectrics 614T are not expressly illustrated, it is understood that each transfer gate dielectric 614T may have the same horizontal cross-sectional shape as the overlying transfer gate electrode 605 illustrated in each configuration. Each transfer gate stack structure (614T, 605) may be located between the floating diffusion regions 608 and the second-conductivity-type pinned photodiode layer 602 in a plan view, i.e., in a top-down view.

In one embodiment, the gate length of the transfer gate stack structures (614T, 605), i.e., the width of the transfer gate stack structure (614T, 605) along the horizontal direction connecting the second-conductivity-type pinned photodiode layer 602 and a respective floating diffusion region 608, may be uniform throughout.

In an illustrative example, the floating diffusion regions 608 may be located at corner regions of a semiconductor material portion having a polygonal horizontal cross-sectional shape that includes the floating diffusion regions 608, the second-conductivity-type pinned photodiode layer 602, and the transfer transistor body region 611 that underlies the transfer gate stack structure (614T, 605). The boundary of the semiconductor material portion may be defined by a continuously surrounding portion of the shallow trench isolation structure 620 that laterally surrounds the semiconductor material portion.

For example, the semiconductor material portion have a rectangular horizontal cross-sectional shape, and the two, three, or four floating diffusion regions 608 at two, three, or four corners of the rectangular horizontal cross-sectional shape. In one embodiment, each of the floating diffusion regions 608 may have a respective triangular horizontal cross-sectional shape, which may be the shape of a right triangle.

Each of the transfer gate stack structures (614T, 605) may have a respective horizontal cross-sectional shape of a strip having a uniform width and laterally extending at a non-zero angle with respective to the first horizontal direction hd1 and at another non-zero angle with respect to the second horizontal direction hd2. For example, the lateral extension direction of each of the transfer gate stack structures (614T, 605) with respective to the first horizontal direction hd1 may be in a range from 15 degrees to 75 degrees, such as from 30 degrees to 60 degrees (e.g., 45 degrees).

In one embodiment, the total number of floating diffusion regions 608 may be two.

Referring to FIG. 4B, a second configuration of the third exemplary structure can be derived from the first configuration of the third exemplary structure of FIG. 4A by forming three floating diffusion regions 608 and three transfer gate stack structures (614T, 605). The three floating diffusion regions 608 can be interconnected among one another employing a first subset of the metal interconnect structures 680. The three transfer gate electrodes 614T can be interconnected among one another employing a second subset of the metal interconnect structures 680.

Referring to FIG. 4C, a third configuration of the third exemplary structure can be derived from the second configuration of the third exemplary structure of FIG. 4B by forming four floating diffusion regions 608 and four transfer gate stack structures (614T, 605). The four floating diffusion regions 608 can be interconnected among one another employing a first subset of the metal interconnect structures 680. The four transfer gate electrodes 614T can be interconnected among one another employing a second subset of the metal interconnect structures 680.

Referring to FIG. 4D, a fourth configuration of the third exemplary structure can be derived from the first configuration of the third exemplary structure by connecting the two transfer gate stack structures (614T, 605) into a single transfer gate stack structure (614T, 605) that are interconnected with an interconnection portion that overlies a portion of the shallow trench isolation structure 620.

Referring to FIG. 4E, a fifth configuration of the third exemplary structure can be derived from the second configuration of the third exemplary structure by connecting the three transfer gate stack structures (614T, 605) into a single transfer gate stack structure (614T, 605) that are interconnected with an interconnection portion that overlies a portion of the shallow trench isolation structure 620.

Referring to FIG. 4F, a sixth configuration of the third exemplary structure can be derived from the third configuration of the third exemplary structure by connecting the four transfer gate stack structures (614T, 605) into a single transfer gate stack structure (614T, 605) that are interconnected with an interconnection portion that overlies a portion of the shallow trench isolation structure 620.

Referring collectively to FIGS. 4A-4F, a plurality of floating diffusion regions 608 is provided around the second-conductivity-type pinned photodiode layer 602 in the various configurations of the third exemplary structure. The floating diffusion regions 608 may be laterally spaced from each other or among one another, and may be electrically connected among one another by metal interconnect structures 680. The metal interconnect structures 680 may include at least one metal line structure 684 and at least two metal via structures.

In one embodiment, the at least one transfer gate stack structure (614T, 605) may include multiple discrete transfer gate stack structures (614T, 605) that are not in direct contact with each other or among one another as illustrated in FIGS. 4A-4C. In one embodiment, a plurality of discrete transfer gate electrodes 605 may be electrically connected (i.e., electrically shorted) to each other or one another by a set of metal interconnect structures 680, which may include at least one metal line structure 684 and at least two metal via structures.

In one embodiment, the at least one transfer gate stack structure (614T, 605) may consist of a single transfer gate stack structure (614T, 605) that continuously extends over the entire top surface of the transfer transistor body region 611 as a single continuous structure as illustrated in FIGS. 4D-4F. In one embodiment, the single transfer gate stack structure (614T, 605) may laterally extend over a portion or portions of the shallow trench isolation structure 620 that protrudes inward toward the geometrical center of the second-conductivity-type pinned photodiode layer 602 as illustrated in FIGS. 4D-4F. The single transfer gate stack structure (614T, 605) may have a shape of a meandering line structure with two distinct ends as illustrated in FIGS. 4D and 4E, or may have a general shape of a toroid as illustrated in FIG. 4F.

In one embodiment, the at least one transfer gate stack structure (614T, 605) may be provided as a single transfer gate stack structure (614T, 605) having multiple line segments that are adjoined with one another to provide a single continuous structure. A first subset of the line segments of the single transfer gate stack structure (614T, 605) may overlie a respective region of a top surface of a transfer transistor body region 611 located between a respective floating diffusion region 608 and the second-conductivity-type pinned photodiode layer 602. A second subset of the line segments of the single transfer gate stack structure (614T, 605) may overlie a respective region of the shallow trench isolation structure 620. The line segments in the first subset and the line segments in the second subset may be interlaced to provide the single continuous structure of the transfer gate stack structure (614T, 605).

In embodiments in which the shallow trench isolation structure 620 includes portions that protrude toward the geometrical center of the second-conductivity-type pinned photodiode layer 602, each of the floating diffusion regions 608 may have a horizontal cross-sectional shape of a triangle, a quadrilateral, or a pentagon depending on the location of an edge of the laterally protruding portion of the shallow trench isolation structure 620 relative to the intersection point at which a straight outer edge of the transfer gate stack structure (614T, 605) intersects an edge of a floating diffusion region 608.

In one embodiment, the shallow trench isolation structure 620 may laterally surrounds, and may contacts each of, the floating diffusion regions 608. In one embodiment, two floating diffusion regions 608 that do not contact each other may be provided per subpixel as illustrated in FIG. 4A. In another embodiment, the floating diffusion regions 608 may comprise three or more discrete floating diffusion regions 608 that do not contact one another as illustrated in FIGS. 4B and 4C.

Generally, the sensing circuit (640, 650, 660) of each subpixel may be provided within the area of the unit cell UC. In one embodiment, the various transistors of the sensing circuit (640, 650, 660) may be arranged side by side within an area of a strip located in proximity to an edge of the unit cell UC and extending along the entire length of a side of the unit cell UC or along at least 30% of the length of the side of the unit cell UC as illustrated in FIGS. 4A-4C. In another embodiment, the various transistors of the sensing circuit (640, 650, 660) may be arranged around the floating diffusion region 608 of the transfer transistor 630 within an area of a block located in proximity to a corner of the unit cell UC.

The third exemplary structure includes at least one instance of the subpixel. The third exemplary structure may include an image sensor comprising an array of pixels located on the semiconductor substrate 500. The third exemplary structure may include a plurality of subpixels located within a respective pixel in the array of pixels. In one embodiment, each pixel within the array of pixels comprises a respective instance of the subpixel.

Figure 5:
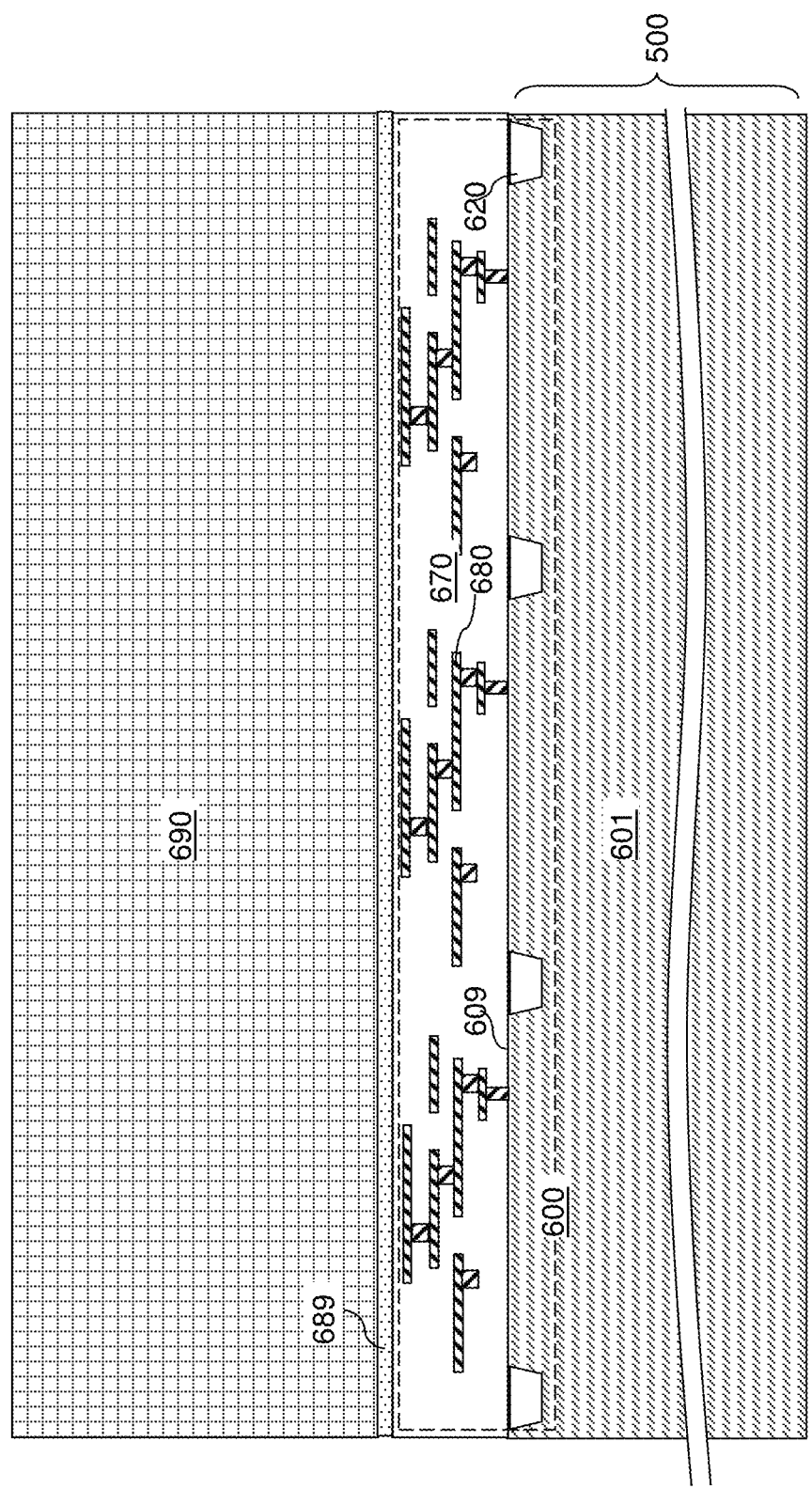
FIG. 5 is a vertical cross-sectional view of the exemplary structure after formation of metal interconnect structures formed within interconnection-level dielectric layers and attachment of a carrier substrate according to an embodiment of the present disclosure.

FIG. 5 is a vertical cross-sectional view of the exemplary structure after formation of metal interconnect structures formed within interconnection-level dielectric layers and attachment of a carrier substrate according to an embodiment of the present disclosure. Referring to FIG. 5, additional interconnect-level dielectric layers 670 and additional metal interconnect structures 680 may be formed on the front side of the semiconductor substrate 500. The front side of the assembly of the semiconductor substrate 500, the interconnect-level dielectric layers 670, and the structures formed therein may be bonded to a carrier substrate 690. The carrier substrate 690 is temporarily attached to the assembly of the semiconductor substrate 500 and the interconnect-level dielectric layers 670 to provide subsequent thinning of the semiconductor substrate 500, and to provide subsequent handling of the assembly of a thinned semiconductor substrate 500 and the interconnect-level dielectric layers 670. The carrier substrate 690 may include a semiconductor material, an insulating material, or a metallic material, and may have a thickness in a range from 300 microns to 1 mm, although lesser and greater thicknesses may also be used.

Any suitable bonding method may be used to bond the carrier substrate 690 to the front side of the interconnect-level dielectric layers 670. Exemplary bonding methods that may be used to bond the carrier substrate 690 to the interconnect-level dielectric layers 670 include, but are not limited to, oxide-to-oxide bonding, oxide-to-semiconductor bonding, fusion bonding, hybrid bonding, anodic bonding, direct bonding, other suitable bonding processes, and/or combinations thereof. Optionally, a bonding buffer layer 689 including an intermediate bonding material (e.g., silicon oxide, silicon nitride, or a semiconductor material) may be used to provide bonding between the interconnection-level dielectric layers 670 and the carrier substrate 690.

Figure 6:
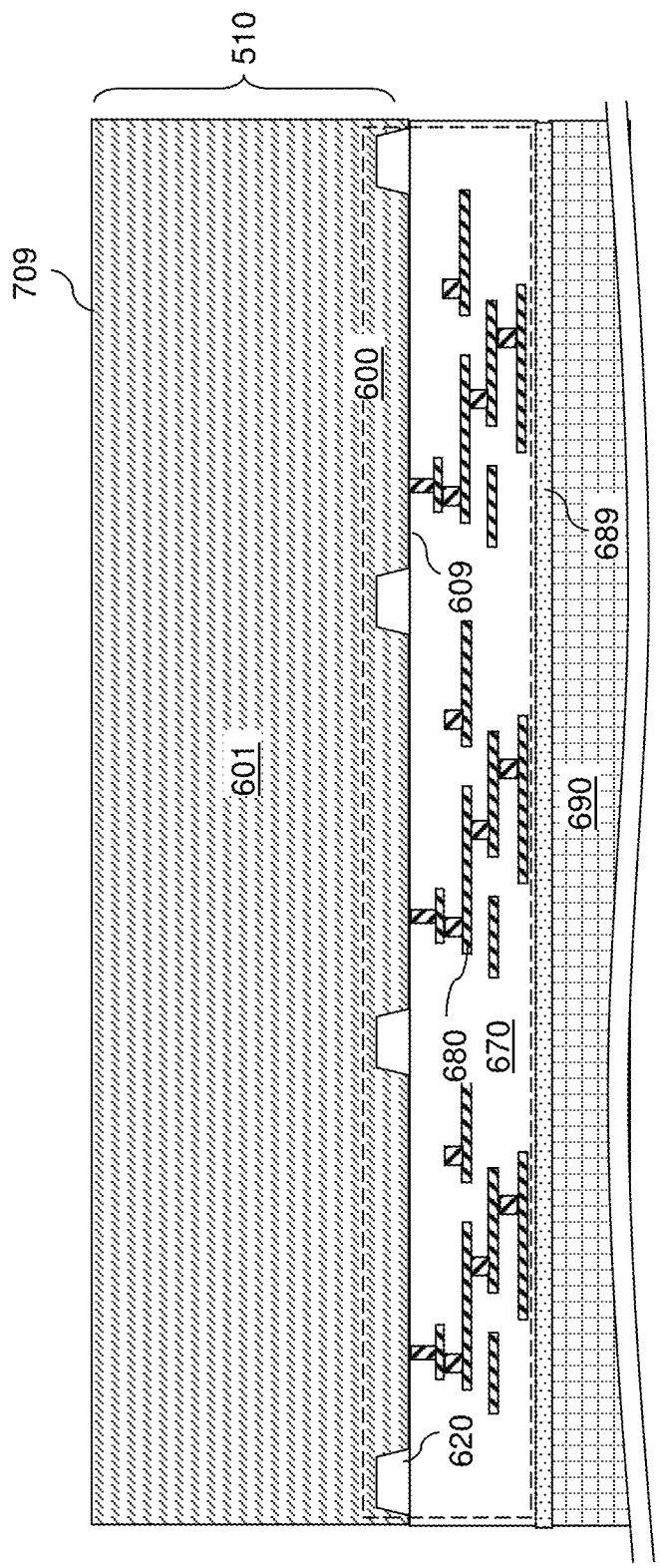
FIG. 6 is a vertical cross-sectional view of the exemplary structure after thinning a semiconductor substrate according to an embodiment of the present disclosure.

FIG. 6 is a vertical cross-sectional view of the exemplary structure after thinning a semiconductor substrate according to an embodiment of the present disclosure. Referring to FIG. 6, the backside of the semiconductor substrate 500 may be thinned, for example, by grinding, polishing, an isotropic etch process, and/or an anisotropic etch process. The carrier substrate 690 may provide mechanical support to the semiconductor substrate 500 during the thinning process. In one embodiment, the semiconductor substrate 500 may be thinned to a thickness in a range from 1 micron to 12 microns, such as from 1.5 microns to 8 microns. The semiconductor substrate 500 as thinned after the thinning process is herein referred to as a thinned semiconductor substrate 510, or as a semiconductor substrate 510. The thickness of the thinned semiconductor substrate 510 may be determined by the maximum depth of deep trenches to be subsequently formed on the backside of the thinned semiconductor substrate 510. In one embodiment, the thickness of the thinned semiconductor substrate 510 may be selected such that deep trenches 719 to be subsequently formed on the backside of the semiconductor substrate 510 reaches proximal surfaces of the shallow trench isolation structures 620. The backside surface 709 of the thinned semiconductor substrate 510 may be polished to provide a planar horizontal surface that is parallel to the front surface 609 of the thinned semiconductor substrate 510. The exemplary structure may be subsequently flipped upside down for further processing.

Figure 7:
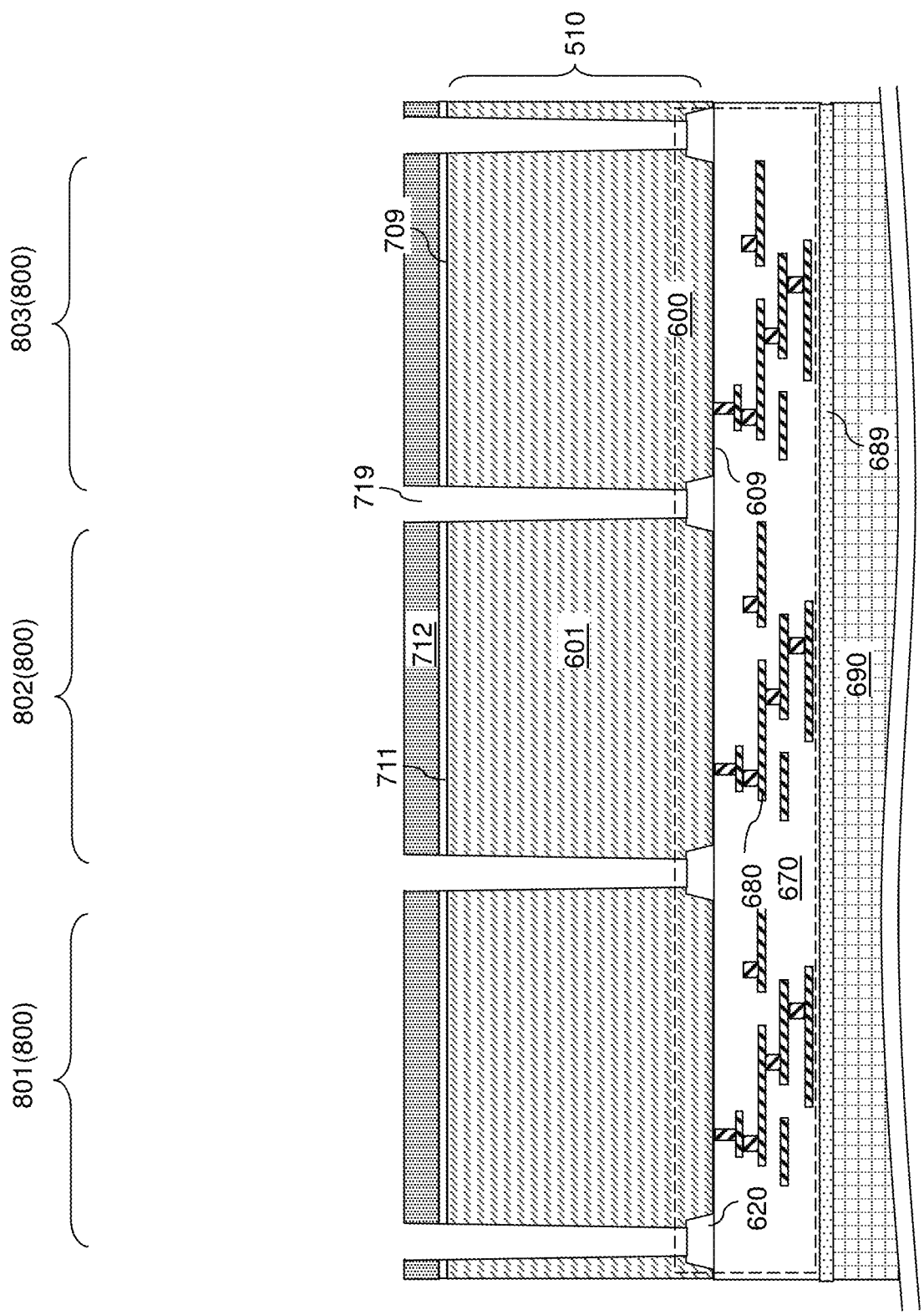
FIG. 7 is a vertical cross-sectional view of the exemplary structure after formation of deep trenches on the backside of the semiconductor substrate according to an embodiment of the present disclosure.

FIG. 7 is a vertical cross-sectional view of the exemplary structure after formation of deep trenches on the backside of the semiconductor substrate according to an embodiment of the present disclosure. Referring to FIG. 7, an optional pad dielectric layer 711 and a hard mask layer 712 may be formed over the backside surface 709 of the semiconductor substrate 510. The optional pad dielectric layer 711, if present, may include a silicon oxide layer, and may have a thickness in a range from 5 nm to 50 nm. The hard mask layer 712 includes an etch mask material that may be subsequently removed selective to the pad dielectric layer 711 and/or selective to the semiconductor substrate 510. For example, the hard mask layer 712 may include silicon nitride, borosilicate glass, or a metallic material. The hard mask layer 712 may have a thickness in a range from 50 nm to 800 nm, although lesser and greater thicknesses may also be used.

A photoresist layer (not shown) may be applied over the hard mask layer 712, and may be lithographically patterned to form openings that generally replicate the pattern of the shallow trench isolation structures 620 located underneath. A first etch process may be performed to transfer the pattern in the photoresist layer through the hard mask layer 712 and the optional pad dielectric layer 711. Unmasked portions of the semiconductor substrate 510 may be etched by performing a second anisotropic etch process, which transfers the pattern of the openings in the photoresist layer and the hard mask layer 712 through the semiconductor substrate 510. The depth of the deep trenches 719 may be in a range from 1 micron to 10 microns, such as from 1.5 microns to 8 microns. The photoresist layer may be completely consumed during the second anisotropic etch process. Deep trenches 719 may be formed through the semiconductor substrate 510.

The deep trenches 719 may define areas for subpixels 800. Each subpixel 800 may be located within a respective subpixel region, which is located within a region of a pixel, i.e., within a pixel region. For example, an area of a pixel may include an area of a first subpixel 801, an area of a second subpixel 802, and an area of a third subpixel 803. In an illustrative example, the first subpixel 801 may be formed in a region that includes a photodetector configured to detect green light, the second subpixel 802 may be formed in a region that includes a photodetector configured to detect red light, and the third subpixel 803 may be formed in a region that includes a photodetector configured to detect blue light. Each subpixel 800 may include a volume containing a patterned columnar portion of the semiconductor substrate 510 that is laterally enclosed by a connected set of deep trenches 719. A pixel region of a pixel includes all subpixel regions for the set of subpixels 800 contained within the pixel.

Figure 8:
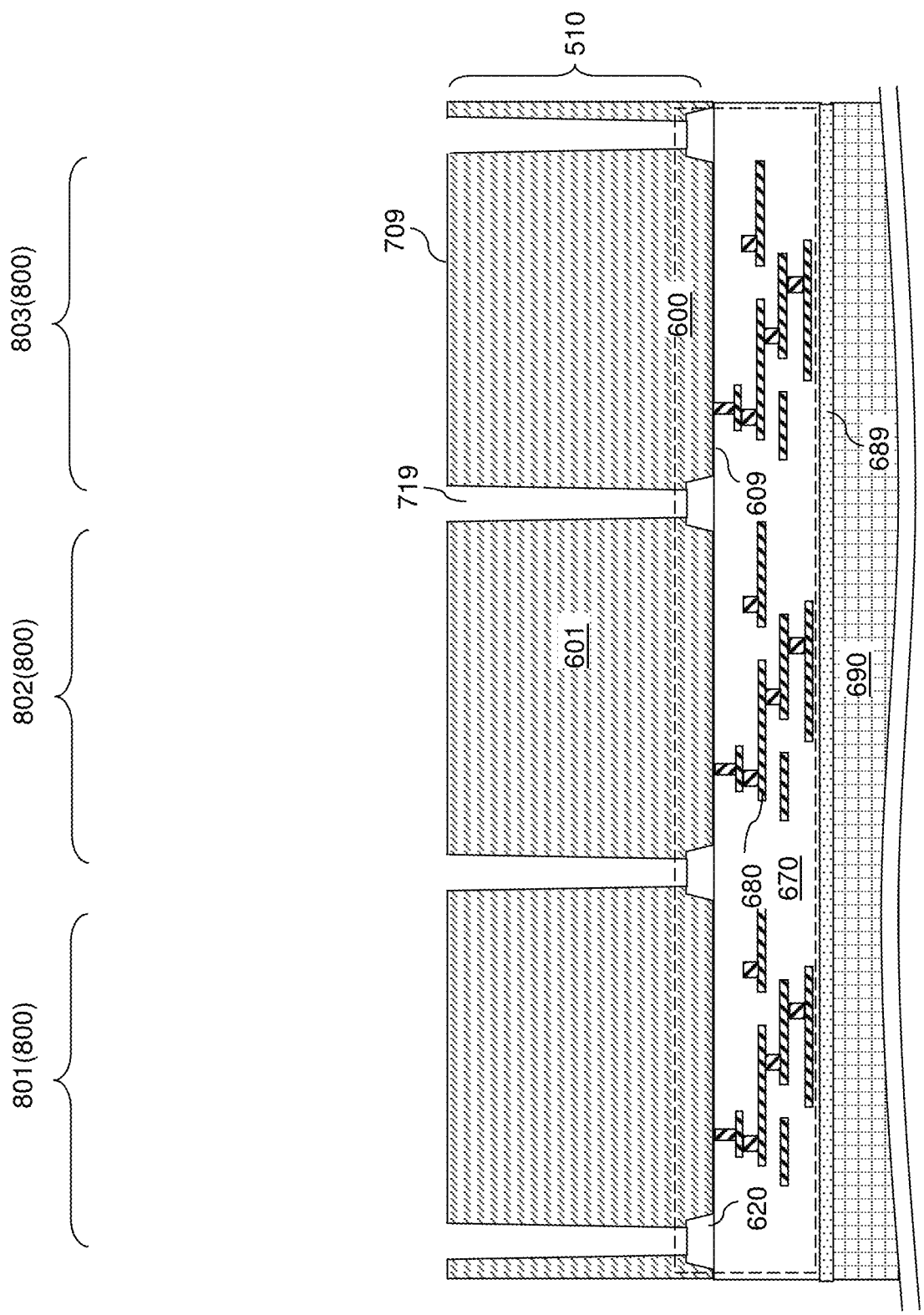
FIG. 8 is a vertical cross-sectional view of the exemplary structure after removal of a hard mask layer and a pad dielectric layer according to an embodiment of the present disclosure.

FIG. 8 is a vertical cross-sectional view of the exemplary structure after removal of a hard mask layer and a pad dielectric layer according to an embodiment of the present disclosure. Referring to FIG. 8, the hard mask layer 712 may be removed selective to the semiconductor substrate 510, the pad dielectric layer 711, and the shallow trench isolation structures 620. In an illustrative example, if the hard mask layer 712 includes silicon nitride, a wet etch process using hot phosphoric acid may be performed to remove the hard mask layer 712. Subsequently, the pad dielectric layer 711 may be removed selective to the semiconductor substrate 510.

Figure 9:
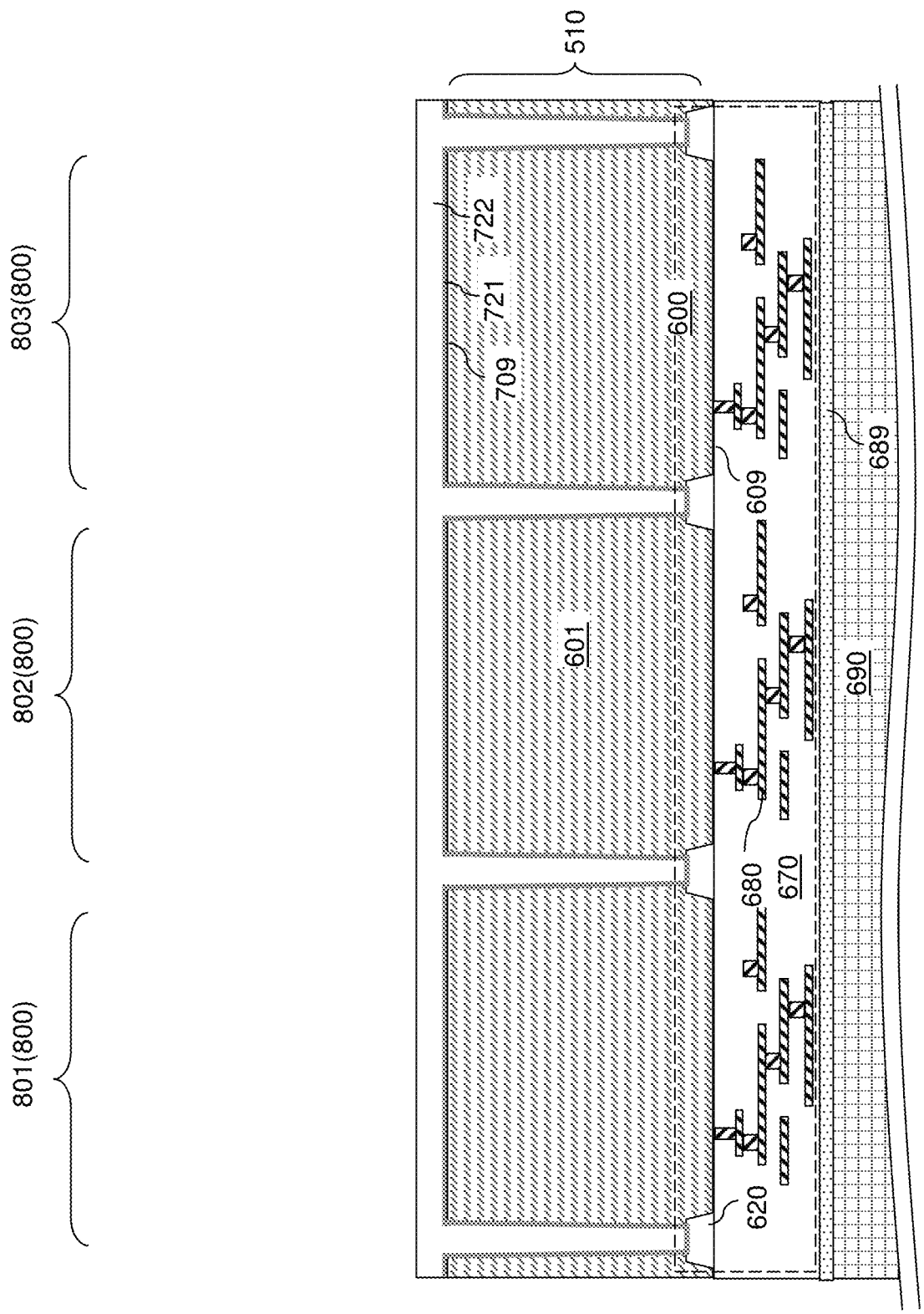
FIG. 9 is a vertical cross-sectional view of the exemplary structure after formation of a dielectric metal oxide liner and a dielectric isolation layer according to an embodiment of the present disclosure.

FIG. 9 is a vertical cross-sectional view of the exemplary structure after formation of a dielectric metal oxide liner and a dielectric isolation layer according to an embodiment of the present disclosure. Referring to FIG. 9, a dielectric metal oxide liner 721 may be conformally deposited over the physically exposed surfaces of the semiconductor substrate 510. The dielectric metal oxide liner 721 may be formed on the sidewalls of the deep trenches 719, on the backside surface 709 of the semiconductor substrate 510, and on surfaces of the shallow trench isolation structures 620 in embodiments in which the shallow trench isolation structures 620 are physically exposed to the deep trenches 719. The dielectric metal oxide liner 721 includes a dielectric metal oxide material having a dielectric constant greater than 7.9 (i.e., a "high-k" dielectric material). Exemplary dielectric metal oxide materials that may be used for the dielectric metal oxide liner 721 include hafnium oxide, aluminum oxide, zirconium oxide, magnesium oxide, calcium oxide, yttrium oxide, tantalum oxide, strontium oxide, titanium oxide, lanthanum oxide, barium oxide or combinations thereof. The dielectric metal oxide liner 721 may be deposited using a chemical vapor deposition process or an atomic layer deposition (ALD). The thickness of the dielectric metal oxide liner 721 may be in a range from 2 nm to 6 nm, although lesser and greater thicknesses may also be used.

The dielectric metal oxide liner 721 may be formed to provide negative charge trapping. For example, the dielectric metal oxide liner 721 may be deposited with a non-stoichiometric oxygen-rich composition, or may be surface-treated, for example, with plasma, to have a non-stoichiometric oxygen-rich surface compression. In such an embodiment, the dielectric metal oxide liner 721 may include an oxygen-rich dielectric metal oxide material with negatively charged interstitial oxygen atoms and/or dangling or broken metal oxide bonds, thereby providing accumulation of negative charges within the dielectric metal oxide liner 721. In an illustrative example, the areal density of accumulated negative charges within the dielectric metal oxide liner 721 may be in a range from $5.0 \times 10^9$ electrons per $cm^2$ to $1.0 \times 10^{14}$ electrons per $cm^2$, such as from $1.0 \times 10^{10}$ electrons per $cm^2$ to $2.0 \times 10^{13}$ electrons per $cm^2$. The dielectric metal oxide material used in the dielectric metal oxide liner 721 may accumulate more negative charges than other dielectric materials such as silicon nitride or silicon oxide. The negative charge in the dielectric metal oxide liner 721 increases hole accumulation within interfacial portions of the first-conductivity-type wells 607 and the substrate semiconductor layer 601 of the semiconductor substrate 510. A depletion region may be formed within portions of the first-conductivity-type wells 607 and the substrate semiconductor layer 601 of the semiconductor substrate 510 that are proximal to the dielectric metal oxide liner 721. The depletion region reduces dark current and/or white pixels for the image sensor.

A dielectric isolation layer 722 may be formed by conformally depositing a dielectric material in remaining volumes of the deep trenches 719. The dielectric isolation layer 722 includes a dielectric material such as undoped silicate glass, a doped silicate glass (such as borosilicate glass), or a combination thereof. The combination of the dielectric metal oxide liner 721 and the dielectric isolation layer 722 may fill the deep trenches 719 (with or without seams and/or encapsulated cavities).

Figure 10:
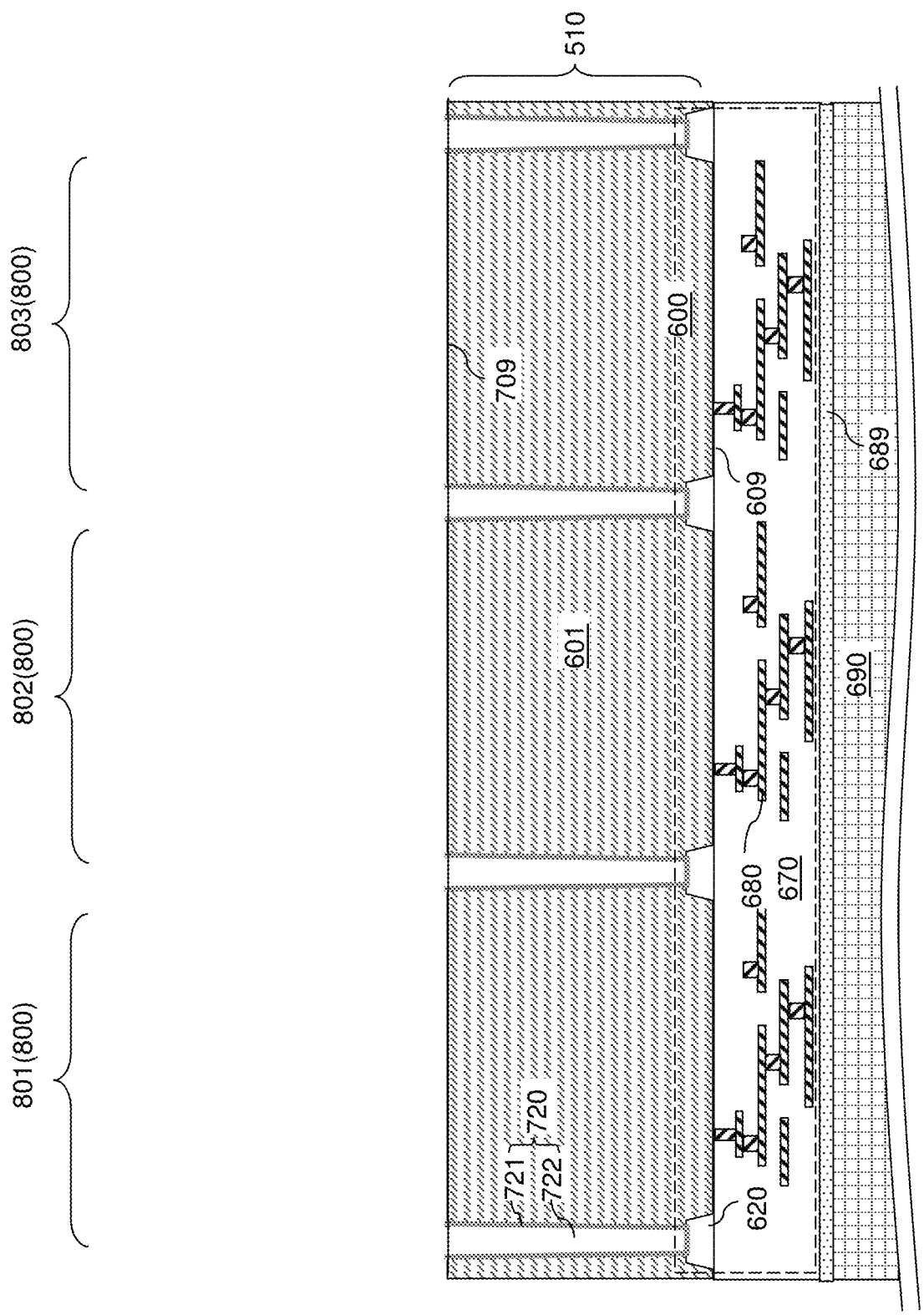
FIG. 10 is a vertical cross-sectional view of the exemplary structure after formation of deep trench isolation structures according to an embodiment of the present disclosure.

FIG. 10 is a vertical cross-sectional view of the exemplary structure after formation of deep trench isolation structures according to an embodiment of the present disclosure. Referring to FIG. 10, horizontal portions of the dielectric isolation layer 722 and the dielectric metal oxide liner 721 may be removed from above the backside surface 709 of the semiconductor substrate 510 by a planarization process. A recess etch and/or a chemical mechanical planarization process may be used to remove the horizontal portions of the dielectric isolation layer 722 and the dielectric metal oxide liner 721. In one embodiment, the dielectric metal oxide liner 721 may be used as an etch stop layer during a recess etch process that removes the horizontal portions of the dielectric isolation layer 722, or as a stopping layer during a chemical mechanical planarization process that removes the horizontal portions of the dielectric isolation layer 722. The horizontal portions of the dielectric metal oxide liner 721 that overlies the backside surface 709 of the semiconductor substrate 510 may be subsequently removed by performing an isotropic etch process (such as a wet etch process) that etches the material of the dielectric metal oxide liner 721 selective to the semiconductor material of the semiconductor substrate 510. Remaining vertically-extending portions of the dielectric metal oxide liner 721 and the dielectric isolation layer 722 fill the deep trenches 719, and are herein referred to as deep trench isolation structures 720.

Figure 11:
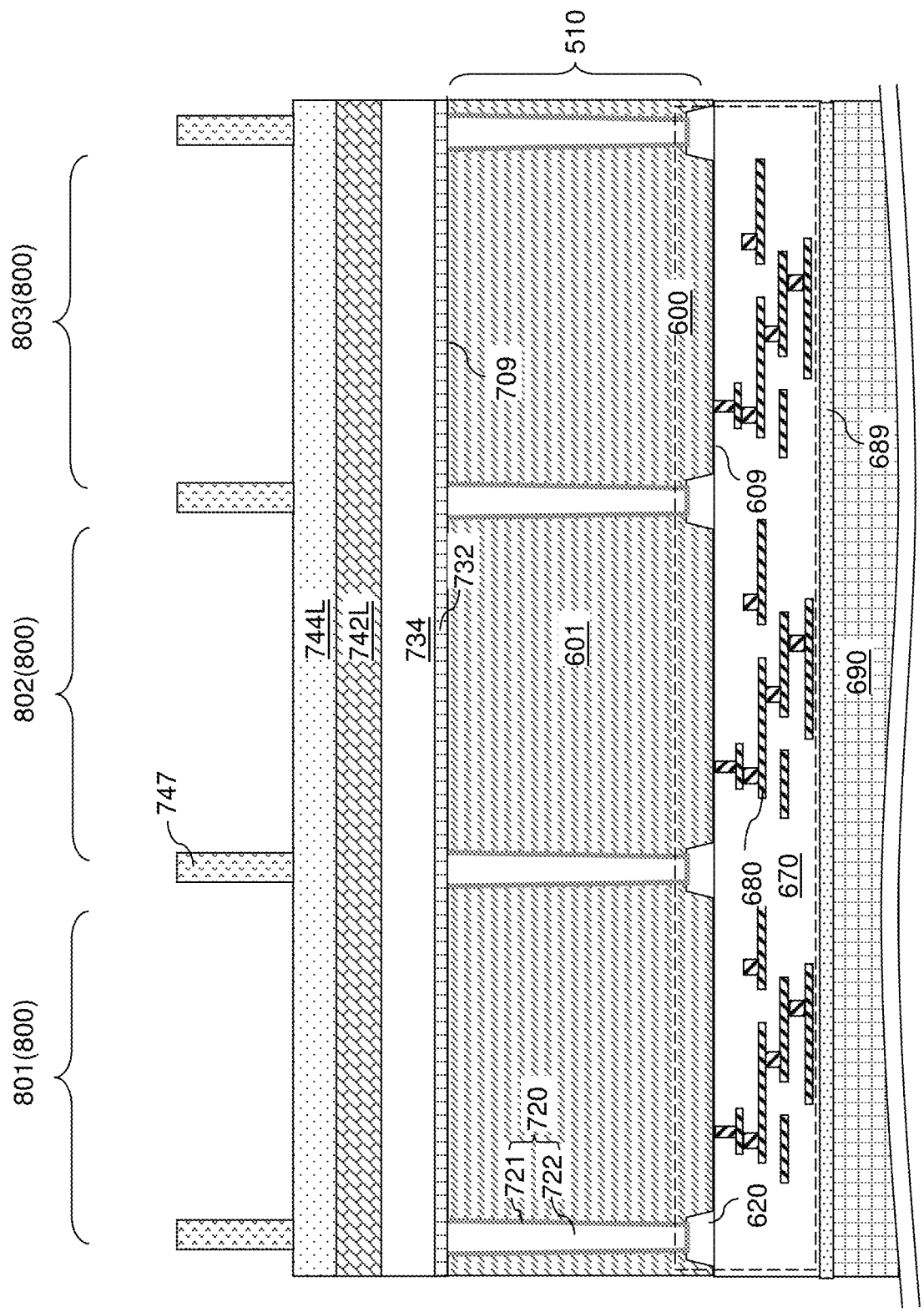
FIG. 11 is a vertical cross-sectional view of the exemplary structure after formation of an antireflective coating (ARC) layer, an optical refraction layer, a dielectric grid material layer, a metallic reflective material layer, and a patterned photoresist layer according to an embodiment of the present disclosure.

FIG. 11 is a vertical cross-sectional view of the exemplary structure after formation of an antireflective coating (ARC) layer, an optical refraction layer, a dielectric grid material layer, a metallic reflective material layer, and a patterned photoresist layer according to an embodiment of the present disclosure. Referring to FIG. 11, an optional antireflective coating (ARC) layer 732, an optical buffer layer 734, a dielectric grid material layer 742L, and a metallic reflective material layer 744L may be sequentially deposited over the backside surface 709 of the semiconductor substrate 510.

The optional ARC layer 732 includes an antireflective coating material that reduces reflection between the semiconductor material of the semiconductor substrate 510 and the overlying material layer, i.e., the optical buffer layer 734. The optional ARC layer 732, if present, may have a refractive index that is between the refractive index of the semiconductor material of the semiconductor substrate 510 and the refractive index of the optical buffer layer 734. The optional ARC layer 732 may include a single material layer or a layer stack of multiple layers having gradually changing refractive indices. The optional ARC layer 732 includes an optically transparent material, and may include a semiconductor material, an insulating material, a conductive material, and/or a polymer material. The ARC layer 732 may have a thickness in a range from 50 nm to 300 nm, although lesser and greater thicknesses may also be used.

The optical buffer layer 734 may include a semiconductor material (such as silicon, germanium, a silicon-germanium alloy, or a III-V compound semiconductor material) or a dielectric material (such as silicon oxide, silicon oxynitride, silicon nitride), or a dielectric metal oxide (e.g., aluminum oxide). The optical buffer layer 734 may include a material that is conducive to formation of trenches having a high aspect ratio during a subsequent anisotropic etch process. The optical buffer layer 734 may be formed as an unpatterned (blanket) material layer having two horizontal planar surfaces that are parallel to the backside surface 709 of the semiconductor substrate 510. The distal surface of the optical buffer layer 734 is one of the two horizontal planar surfaces of the optical buffer layer 734 that is more distal from the semiconductor substrate 510, i.e., a top surface of the optical buffer layer 734.

The dielectric grid material layer 742L may include a dielectric material such as silicon oxide, a porous dielectric material, polyimide, or another dielectric material. The thickness of the dielectric grid material layer may be in a range from 50 nm to 500 nm, although lesser and greater thicknesses may also be used. The metallic reflective material layer 744L may include a metallic material that may provide high reflectivity. For example, the metallic reflective material layer 744L may include silver, aluminum, copper, gold, or any other highly reflective metallic material. The thickness of the metallic reflective material layer 744L may be in a range from 50 nm to 500 nm, although lesser and greater thicknesses may also be used.

A photoresist layer 747 may be applied over the metallic reflective material layer 744L, and may be lithographically patterned to form openings within areas of the second-conductivity-type pinned photodiode layers 602, i.e., within the areas of the photodetectors that include a respective p-n junction between the second-conductivity-type pinned photodiode layers 602 and the first-conductivity-type wells 607. The areas of the transistors of the sensing circuit (such as the reset transistors 640, the source-follower transistors 650, and the select transistors 660) may, or may not, be covered by the photoresist layer 747.

Figure 12A:
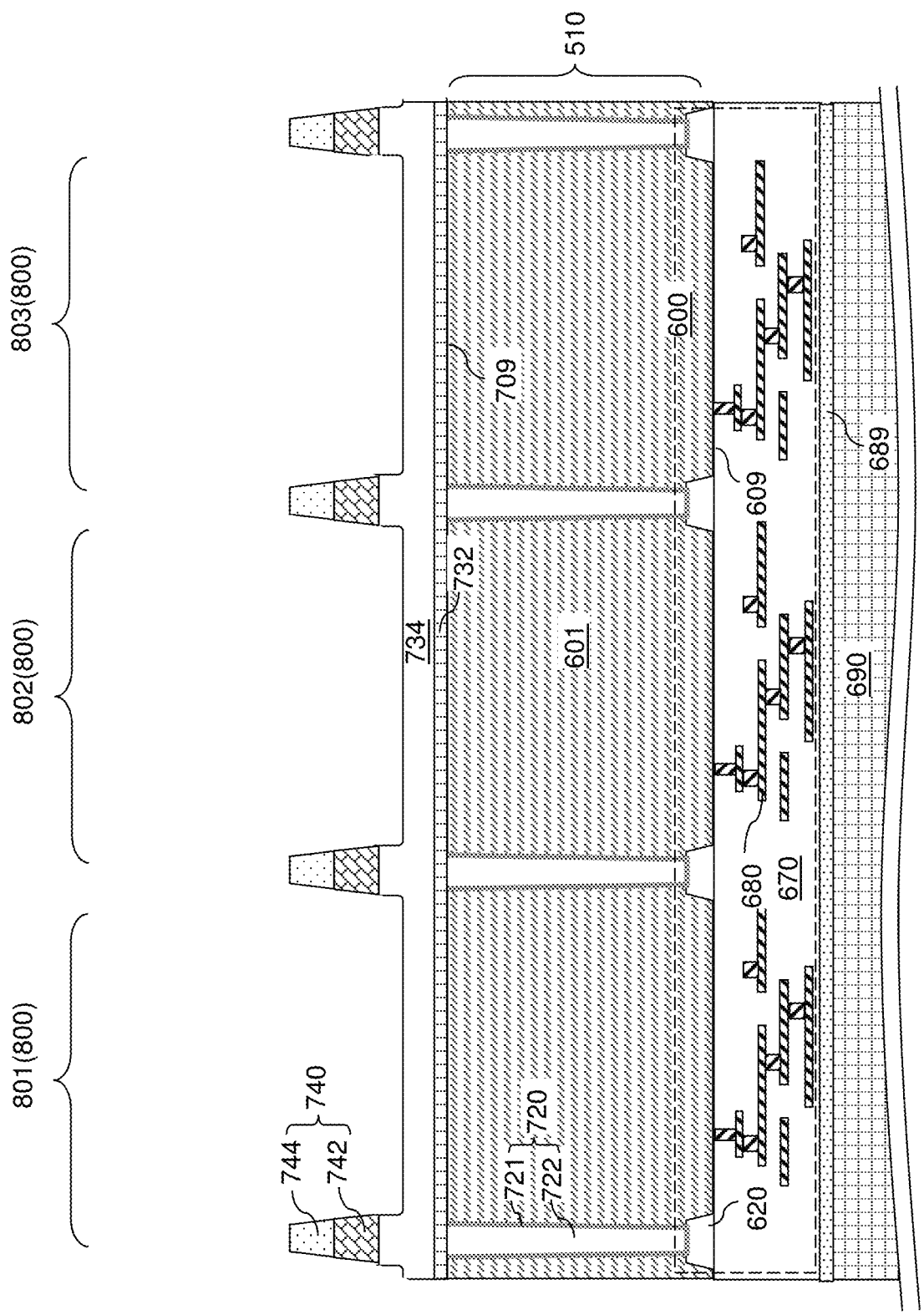
FIG. 12A is a vertical cross-sectional view of the exemplary structure after formation of a composite grid structure according to an embodiment of the present disclosure.
Figure 12B:
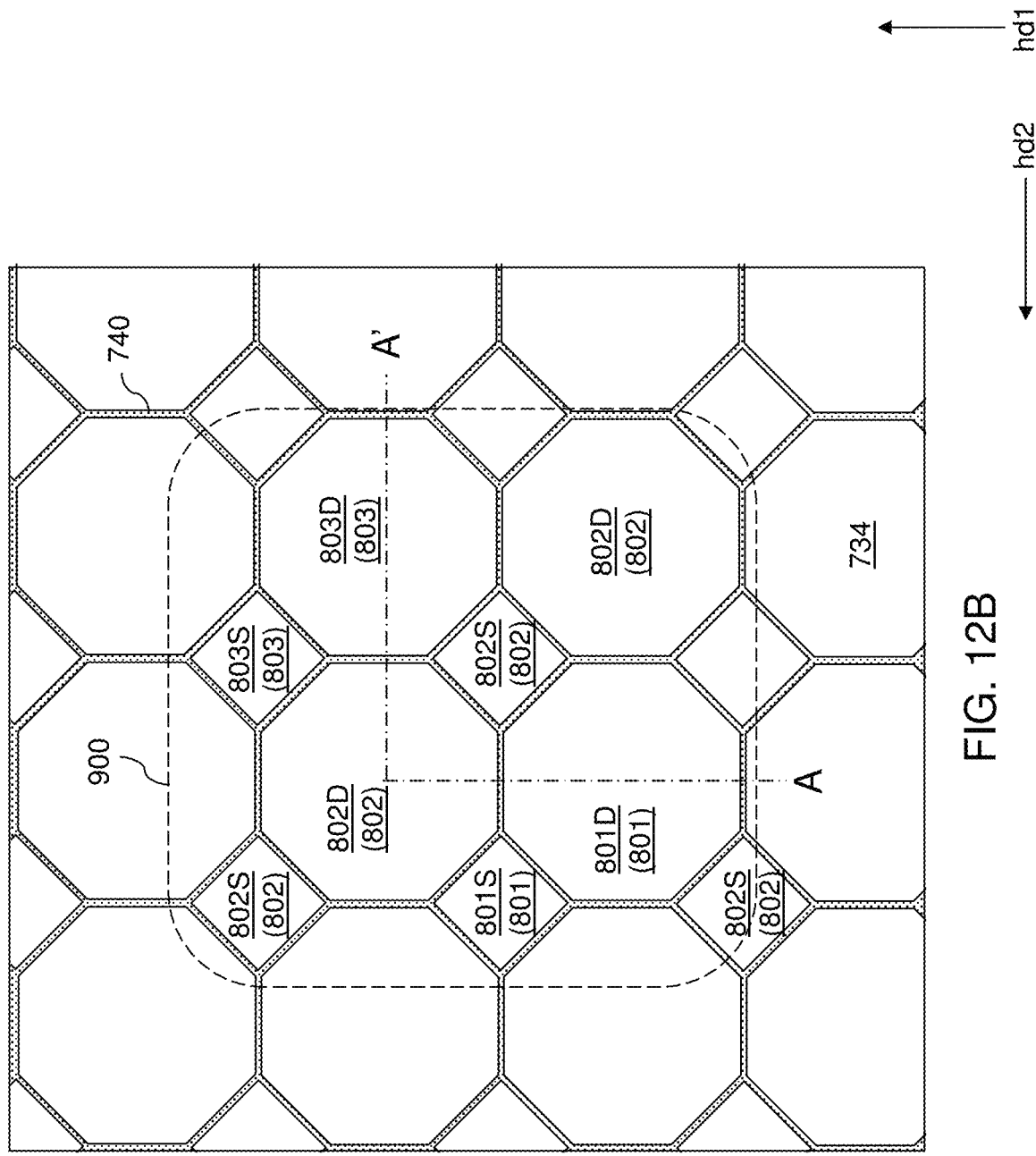
FIG. 12B is a plan view of the exemplary structure of FIG. 12A. The hinged vertical plane A-A' corresponds to the plane of the vertical cross-sectional view of FIG. 12A.

FIG. 12A is a vertical cross-sectional view of the exemplary structure after formation of a composite grid structure according to an embodiment of the present disclosure. FIG. 12B is a plan view of the exemplary structure of FIG. 12A. The hinged vertical plane A-A' corresponds to the plane of the vertical cross-sectional view of FIG. 12A. Referring to FIGS. 12A and 12B, portions of the dielectric grid material layer 742L and the metallic reflective material layer 744L that are not masked by the patterned portions of the photoresist layer 747 may be etched to form openings therethrough. Remaining portions of the dielectric grid material layer 742L form a dielectric grid structure 742, and remaining portions of the metallic reflective material layer 744L form a metallic grid structure 744. The stack of the dielectric grid structure 742 and the metallic grid structure 744 constitutes a grid structure 740, which is also referred to as a composite grid structure.

The grid structure 740 may overlie peripheries of the second-conductivity-type pinned photodiode layers 602, and define a light collection area for each photodetector located within a respective subpixel 800. A pixel 900 may include a set of subpixels configured to detect light at different wavelengths. Each pixel 900 may be located within a respective pixel region, which includes a set of subpixels 800. For example, a pixel 900 may include at least one instance of a first subpixel 801, at least one instance of a second subpixel 802, and at least one instance of a third subpixel 803. In the illustrated example, a pixel may include a first subpixel 801 (such as a green subpixel) located in a first subpixel region, two second subpixels 802 (such as two red subpixels) located in two second subpixel regions, and a third subpixel 803 (such as a blue subpixel) located in a third subpixel region. Generally, a pixel 900 may include various combinations of at least two types of subpixels 800 configured to detect light at different wavelength ranges. Alternatively, an image sensor may be a monochromatic image sensor including a single type of subpixels 800. In such an embodiment, each pixel 900 may include only a single subpixel 800.

Generally, a grid structure 740 comprises at least a metallic grid structure 744 having reflective sidewalls. The grid structure 740 may comprise a composite grid structure including a vertical stack of a metallic grid structure 744 having reflective sidewalls and a dielectric grid structure 742. The grid structure 740 may be formed over the distal surface of the optical buffer layer 734. The grid structure 740 includes openings that overlie a respective one of the photodetectors comprising a transfer transistor 630. The portions of the distal surface of the optical buffer layer 734 that are contacted by the bottom surfaces of the grid structure are planar distal surface portions of the distal surface of the optical buffer layer 734. The portions of the distal surface of the optical buffer layer 734 that do not contact the grid structure 740 may be collaterally vertically recessed relative to the horizontal plane including the bottom surface of the grid structure during the anisotropic etch process that patterns the grid structure.

The grid structure 740 may divide each subpixel 800 into a detector region and a sensing circuit region. For example, a first subpixel 801 may include a first detector region 801D that overlies the second-conductivity-type pinned photodiode layer 602 of the first subpixel 801, and a first sensing circuit region 801S that overlies the sensing circuit (640, 650, 660) of the first subpixel 801. A second subpixel 802 may include a second detector region 802D that overlies the second-conductivity-type pinned photodiode layer 602 of the second subpixel 802, and a second sensing circuit region 802S that overlies the sensing circuit (640, 650, 660) of the second subpixel 802. A third subpixel 803 may include a third detector region 803D that overlies the second-conductivity-type pinned photodiode layer 602 of the third subpixel 803, and a third sensing circuit region 803S that overlies the sensing circuit (640, 650, 660) of the third subpixel 803. Generally, the set of all subpixels 800 within a pixel 900 may be arranged in any pattern that is conducive to periodic repetition of the pixels 900 within an array 1000 of pixels 900.

Figure 13:
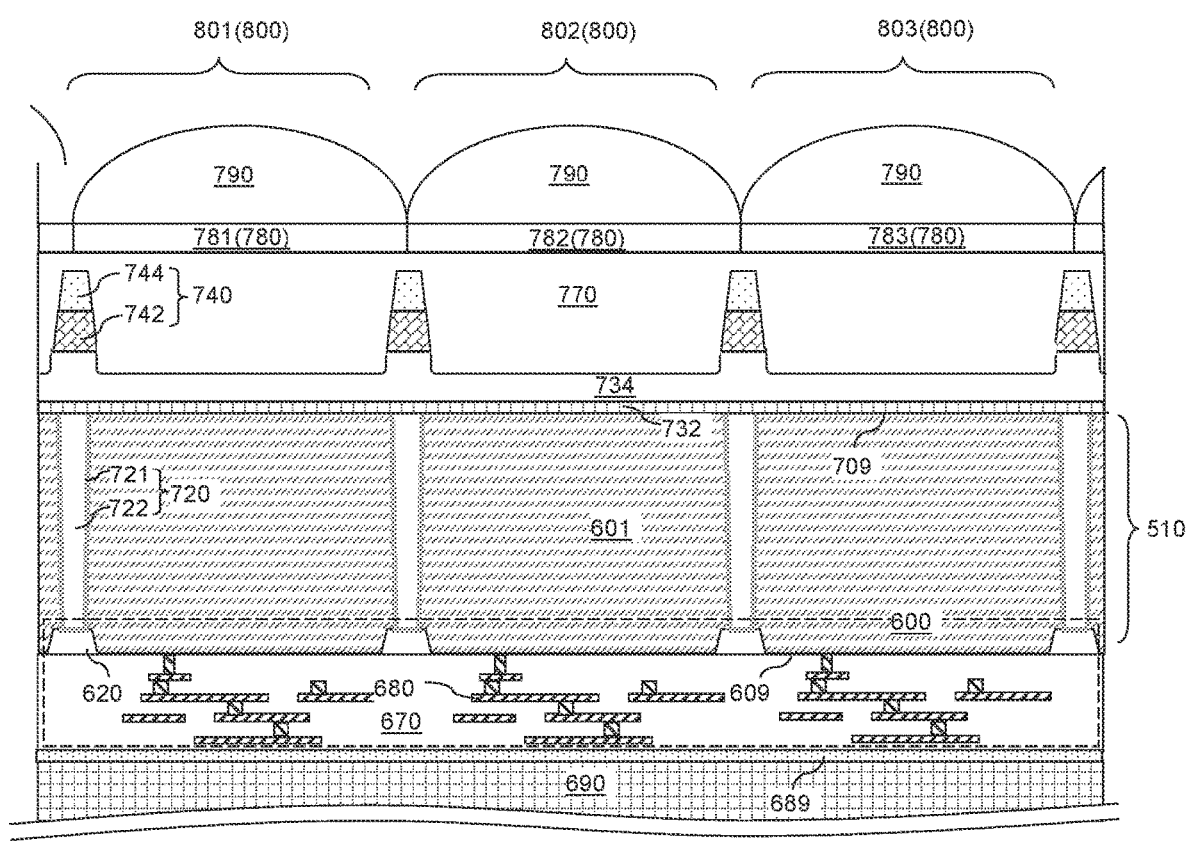
FIG. 13 is a vertical cross-sectional view of the exemplary structure after formation of an optically transparent layer, color filters, and lenses according to an embodiment of the present disclosure.

FIG. 13 is a vertical cross-sectional view of the exemplary structure after formation of an optically transparent layer, color filters, and lenses according to an embodiment of the present disclosure. Referring to FIG. 13, an optically transparent layer 770 having a planar top surface may be formed over the grid structure 740. The optically transparent layer 770 may be formed by depositing a self-planarizing dielectric material such as flowable oxide (FOX). Alternatively, a transparent dielectric material may be deposited and planarized, for example, by chemical mechanical planarization to provide the optically transparent layer 770.

The optically transparent layer 770 vertically extends through the openings in the grid structure 740, and provides a second refractive index that is different from the first refractive index. The optically transparent layer 770 is formed on the optical buffer layer 734.

Various color filtering materials may be applied over the optically transparent layer 770, and may be patterned to form various color filters 780. The color filters 780 may include first-type color filters 781 formed within the regions of the first subpixels 801, second-type color filters 782 formed within the regions of the second subpixels 802, and third-type cooler filters 783 formed within the regions of the third subpixels 803. The composition of each color filtering material may be selected such that light within a target wavelength ranges passes through the color filtering material, while light outside the target wavelength range is absorbed by the color filtering material.

Optical lenses 790 may be formed over the color filters 780 by applying an optically transparent material over the color filters 780 and by patterning the optically transparent material into material portions having convex surfaces that are centered on a respective one of the underlying openings within the grid structure 740.

Figure 14:
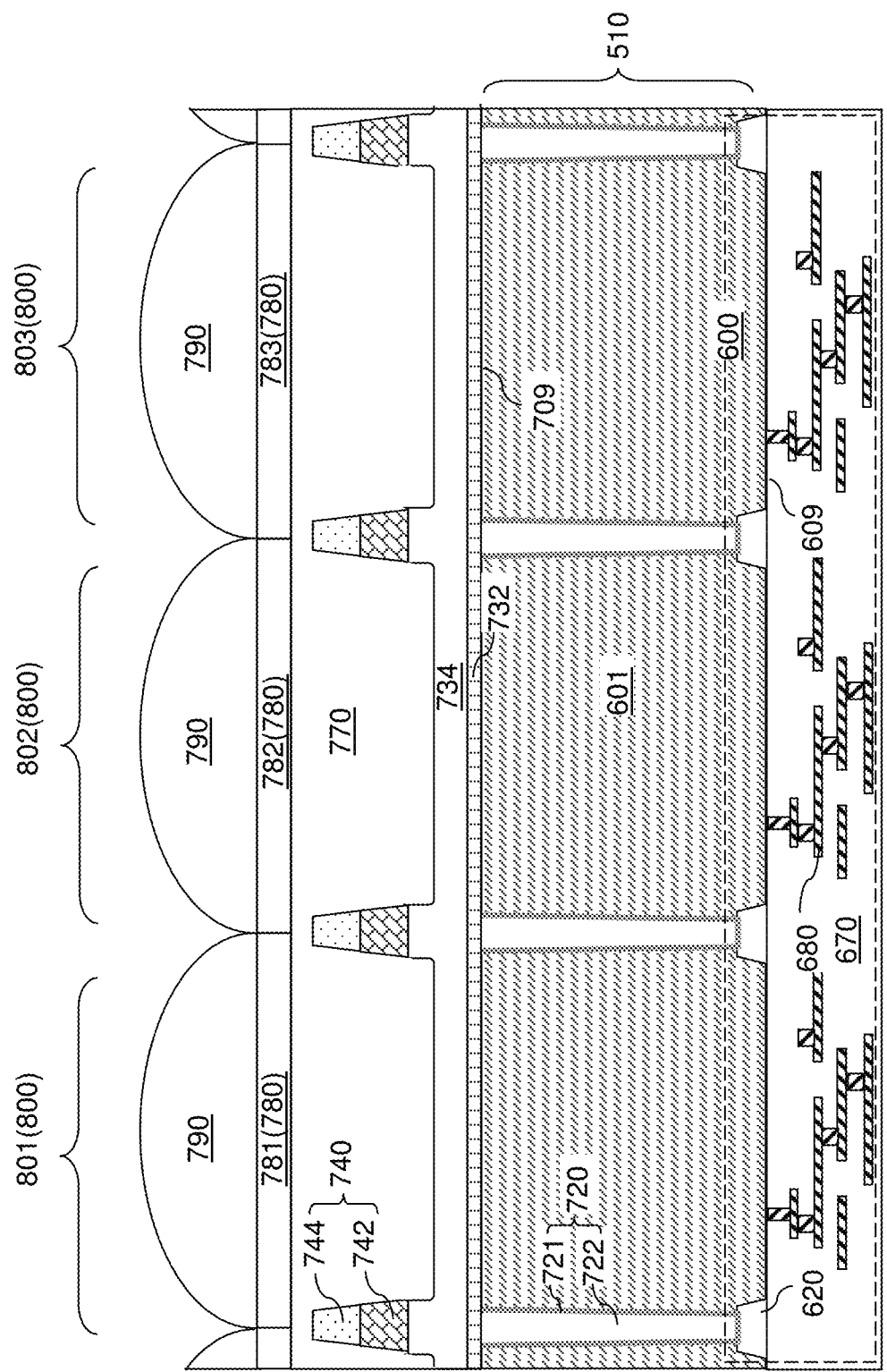
FIG. 14 is a vertical cross-sectional view of the exemplary structure after removal of the carrier substrate according to an embodiment of the present disclosure.

FIG. 14 is a vertical cross-sectional view of the exemplary structure after removal of the carrier substrate according to an embodiment of the present disclosure. Referring to FIG. 14, the carrier substrate 690 and the bonding buffer layer 689 (if present) may be detached from the interconnect-level dielectric layers 670. The semiconductor substrate 510 and the device structures thereupon may be singulated into discrete image sensors prior to, or after, detaching the carrier substrate 690 from the semiconductor substrate 510.

Generally, an array 1000 of pixels may be formed on the semiconductor substrate 510. Each pixel within the array 1000 of pixels comprises at least one subpixel, and each subpixel comprise a respective photodetector (comprising a transfer transistor 630) and a respective sensing circuit (640, 650, 660) located on a front surface 609 of the semiconductor substrate 510. The optically transparent layer 770 may overlie the array of masking structures.

Figure 15:
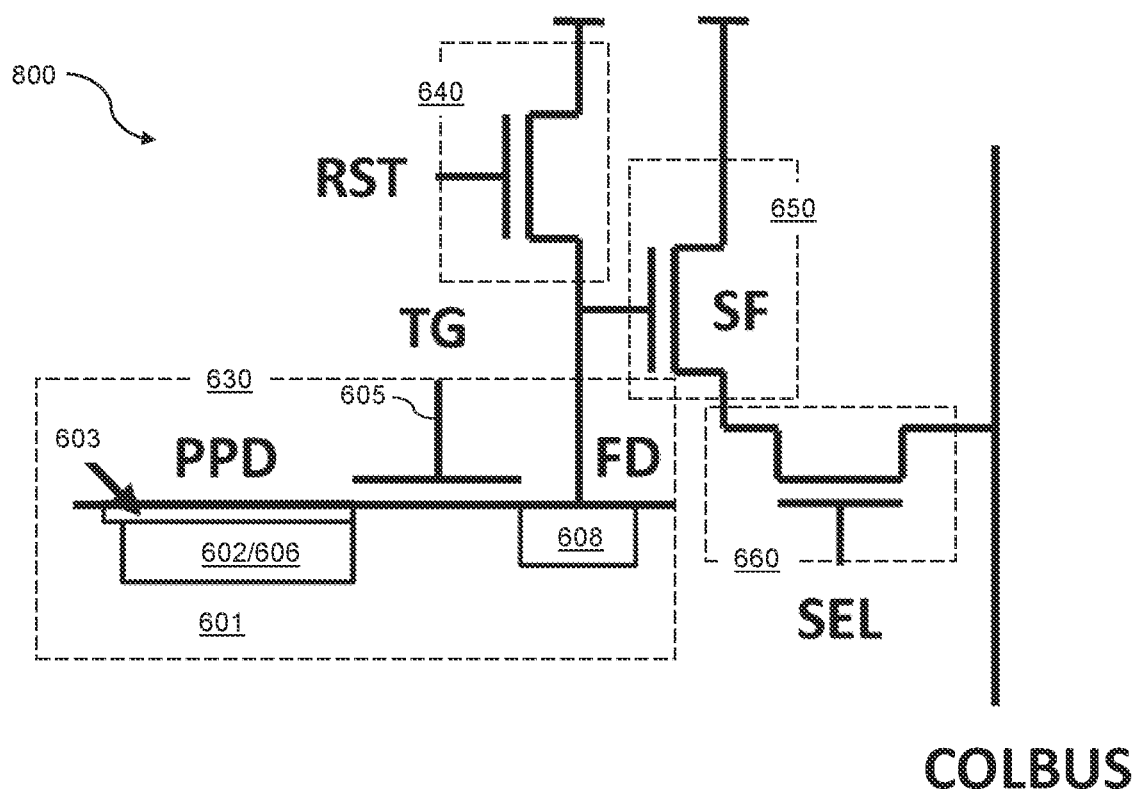
FIG. 15 is a schematic circuit diagram of a subpixel according to an embodiment of the present disclosure.

FIG. 15 is a schematic circuit diagram of a subpixel according to an embodiment of the present disclosure. Referring to FIG. 15, a general circuit schematic for a combination of a photodetector (comprising a transfer transistor 630) and a sensing circuit (640, 650, 660) within each subpixel 800 of the present disclosure is illustrated. The transfer transistor 630 includes a p-n junction between the combination of a second-conductivity-type pinned photodiode layer 602 and a buried second-conductivity-type pinned photodiode layer 606 and the substrate semiconductor layer 601 having a doping of the first-conductivity-type. A first-conductivity-type pinning layer 603 is provided on a top side of the second-conductivity-type pinned photodiode layer 602 to provide charge pinning and thereby to reduce the dark current and white pixel effects. The set of the substrate semiconductor layer 601, the buried second-conductivity-type pinned photodiode layer 606, the second-conductivity-type pinned photodiode layer 602, and the first-conductivity-type pinning layer 603 functions as a pinned photodiode PPD. The second-conductivity-type pinned photodiode layer 602 functions as a source region of the transfer transistor 630, and a floating diffusion region 608, labeled as "FD," functions as a drain region of the transfer transistor 630. The transfer gate electrode 605, labeled "TG," controls the transfer of the electrical charges accumulated in the second-conductivity-type pinned photodiode layer 602 into the floating diffusion region 608. The transfer transistor 630 functions as a photodetector.

The sensing circuit (640, 650, 660) may include a reset transistor 640 (labeled "RST") that is configured to drain the electrical charges in the floating diffusion region 608 immediately before sensing so that the electrical charge that accumulates in the floating diffusion region 608 during sensing is linearly proportional to the electrical charge accumulated in the second-conductivity-type pinned photodiode layer 602. The gate electrode of the source follower 650 (labeled "SF") is electrically connected to the floating diffusion region 608 via a set of metal interconnect structures. Thus, the voltage at the gate electrode of the source follower 650 is proportional to the electrical charges in the floating diffusion region 608. The select transistor (labeled "SEL") 660 is turned on during a read operation to output the voltage at a common node of the source follower and the select transistor 660 (as modulated by the voltage at the gate electrode of the source follower 650) to a column output bus (labeled "COLBUS").

Figure 16:
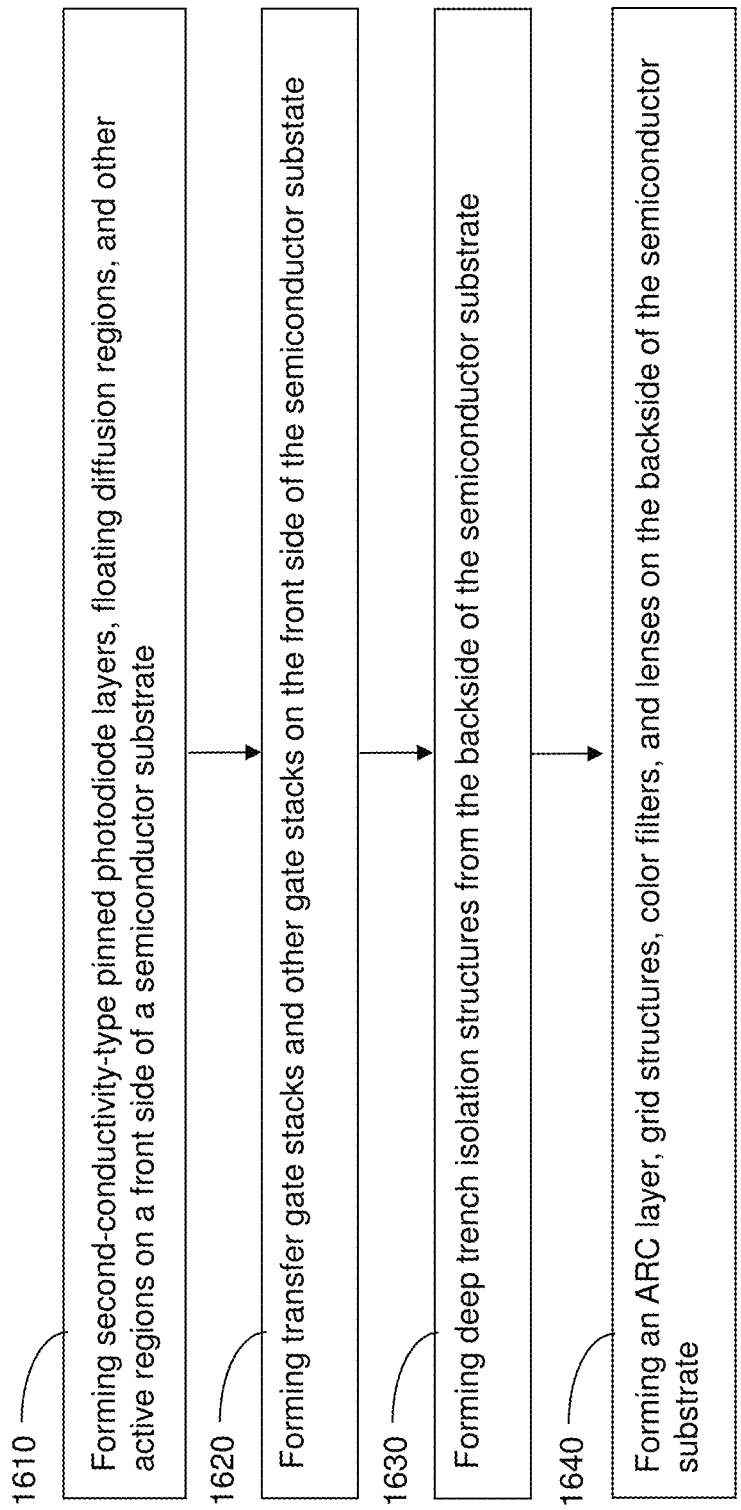
FIG. 16 is a flow chart for an exemplary process sequence for forming an image sensor according to an embodiment of the present disclosure.

FIG. 16 is a flow chart for an exemplary process sequence for forming an image sensor according to an embodiment of the present disclosure. Referring to FIG. 16, a general method of forming an image sensor is provided according to an embodiment of the present disclosure. Referring to step 1610, front side sensor components 600 such as second-conductivity-type pinned photodiode layers 602, floating diffusion regions 608, and other active regions 612 of field effect transistors (640, 650, 660) may be formed on a front side of a semiconductor substrate 500. The patterns of the second-conductivity-type pinned photodiode layers 602, and floating diffusion regions 608 may be selected as described above. Referring to step 1620, transfer gate stack structures (614T, 605) and other gate stack structures (614, 615) are formed on the front side of the semiconductor substrate 500. The pattern of the transfer gate stack structures (614T, 605) may be selected as described above. Referring to step 1630, deep trench isolation structures 720 may be formed from the backside of a semiconductor substrate 510, which may be provided by thinning the semiconductor substrate 500. Referring to step 1640, ARC layer 732, grid structures 740, color filters 780, and lenses 790 may be formed on the backside of the semiconductor substrate 510.

Referring to all drawings and according to various embodiments of the present disclosure, a semiconductor structure is provided, which comprises at least one instance of a subpixel 800 located on a semiconductor substrate 510 including a substrate semiconductor layer 601 having a doping of a first-conductivity-type. Each instance of the subpixel 800 comprises: a second-conductivity-type pinned photodiode layer 602 that forms a p-n junction with the substrate semiconductor layer 601; at least one floating diffusion region 608 that is laterally spaced from a periphery of the second-conductivity-type pinned photodiode layer 602 and at least partially laterally surrounds the second-conductivity-type pinned photodiode layer 602; and at least one transfer gate stack structure (614T, 605) including a respective transfer gate dielectric 614T and a respective transfer gate electrode 605 and located between the second-conductivity-type pinned photodiode layer 602 and the at least one floating diffusion region 608, and at least partially laterally surrounding the second-conductivity-type pinned photodiode layer 602 with a total azimuthal extension angle α in a range from 240 degrees to 360 degrees around a geometrical center GC of the second-conductivity-type pinned photodiode layer 602.

According to an embodiment of the present disclosure, a semiconductor structure is provided, which comprises at least one instance of a subpixel 800 located on a semiconductor substrate 510 including a substrate semiconductor layer 601 having a doping of a first-conductivity-type. Each instance of the subpixel 800 comprises: at least one second-conductivity-type pinned photodiode layer 602 that forms at least one p-n junction with the substrate semiconductor layer 601; a floating diffusion region 608 that is laterally spaced from the at least one second-conductivity-type pinned photodiode layer 602; and a transfer gate stack structure (614T, 605) including a transfer gate dielectric 614T and a transfer gate electrode 605 and located between the floating diffusion region 608 and each of the at least one second-conductivity-type pinned photodiode layer 602, and having a first edge 6051 that overlies a first segment of at least one periphery of the at least one second-conductivity-type pinned photodiode layer 602 and a second edge 6052 that overlies a second segment of the at least one periphery of the at least one second-conductivity-type pinned photodiode layer 602, wherein the floating diffusion region 608 comprises a portion located between the first edge 6051 and the second edge 6052.

According to another embodiment of the present disclosure, a semiconductor structure is provided, which comprises at least one instance of a subpixel 800 located on a semiconductor substrate 510 including a substrate semiconductor layer 601 having a doping of a first-conductivity-type. Each instance of the subpixel 800 comprises: a second-conductivity-type pinned photodiode layer 602 that forms a p-n junction with the substrate semiconductor layer 601; floating diffusion regions 608 that are laterally spaced from the second-conductivity-type pinned photodiode layer 602; and at least one transfer gate stack structure (614T, 605) including a respective transfer gate dielectric 614T and a respective transfer gate electrode 605 and located between the second-conductivity-type pinned photodiode layer 602 and a respective one of the floating diffusion regions 608.

The various embodiments of the present disclosure reduce the maximum charge travel distance for the electrical charges that accumulate in the second-conductivity-type pinned photodiode layer 602 during transfer into the floating diffusion region(s) 608 by providing various innovative layout features to the at least one second-conductivity-type pinned photodiode layer 602, the at least one floating diffusion region 608, and the at least one transfer gate stack structure (614T, 605). Faster charge transfer from the second-conductivity-type pinned photodiode layer(s) 602 to the floating diffusion region(s) 608 provide faster operation of the photodetector, and thus, provides faster operation of the CMOS image sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising at least one instance of a subpixel located on a semiconductor substrate including a substrate semiconductor layer having a doping of a first-conductivity-type, wherein each instance of the subpixel comprises:
   a second-conductivity-type pinned photodiode layer that forms a p-n junction with the substrate semiconductor layer;
   at least one floating diffusion region that is laterally spaced from a periphery of the second-conductivity-type pinned photodiode layer and at least partially laterally surrounds the second-conductivity-type pinned photodiode layer; and
   a single transfer gate stack structure including a transfer gate dielectric and a transfer gate electrode and located between the second-conductivity-type pinned photodiode layer and the at least one floating diffusion region, and encircling an area of the second-conductivity-type pinned photodiode layer with a total azimuthal extension angle of 360 degrees around a geometrical center of the second-conductivity-type pinned photodiode layer.

2. The semiconductor structure of claim 1, wherein the at least one floating diffusion region comprises a single floating diffusion region that partially or completely encircles an area of the second-conductivity-type pinned photodiode layer as a single continuous structure.

3. The semiconductor structure of claim 1, wherein the at least one floating diffusion region comprises a plurality of floating diffusion regions that are laterally spaced apart from each other by a shallow trench isolation structure.

4. The semiconductor structure of claim 1, wherein:
   a shallow trench isolation structure laterally encircles, and contacts, the at least one floating diffusion region; and
   the shallow trench isolation structure is laterally spaced from the second-conductivity-type pinned photodiode layer by a semiconductor material portion having a doping of the first-conductivity-type.

5. The semiconductor structure of claim 1, wherein:
   the semiconductor structure comprises an image sensor comprising an array of pixels located on the semiconductor substrate;
   the at least one instance of the subpixel comprises a plurality of subpixels located within a respective pixel in the array of pixels; and
   each pixel within the array of pixels comprises a respective instance of the subpixel.

6. The semiconductor structure of claim 1, wherein the at least one floating diffusion region comprises a single floating diffusion region that completely encircles an area of the second-conductivity-type pinned photodiode layer such that a total azimuthal extension angle of the single floating diffusion region is 360 degrees around the geometrical center of the second-conductivity-type pinned photodiode layer.

7. The semiconductor structure of claim 1, wherein the at least one floating diffusion region comprises a single floating diffusion region that partially encircles an area of the second-conductivity-type pinned photodiode layer such that a total azimuthal extension angle of the single floating diffusion region is less than 360 degrees around the geometrical center of the second-conductivity-type pinned photodiode layer.

8. A semiconductor structure comprising at least one instance of a subpixel located on a semiconductor substrate including a substrate semiconductor layer having a doping of a first-conductivity-type, wherein each instance of the subpixel comprises:
   a second-conductivity-type pinned photodiode layer that forms a p-n junction with the substrate semiconductor layer;
   at least one transfer transistor body region having a doping of the first conductivity type and forming a respective additional p-n junction with the second-conductivity-type pinned photodiode layer and laterally spaced from a first-conductivity-type pinning layer;
   a single floating diffusion region having a doping of the second conductivity type and is laterally spaced from a periphery of the second-conductivity-type pinned photodiode layer by the transfer transistor body region and completely or partially encircles an area of the second-conductivity-type pinned photodiode layer; and
   at least one transfer gate stack structure including a respective transfer gate dielectric and a respective transfer gate electrode and located between the second-conductivity-type pinned photodiode layer and the at least one floating diffusion region and at least partially laterally surrounding the second-conductivity-type pinned photodiode layer with a total azimuthal extension angle in a range from 240 degrees to 360 degrees around a geometrical center of the second-conductivity-type pinned photodiode layer.

9. The semiconductor structure of claim 8, wherein:
   a shallow trench isolation structure laterally encircles, and contacts, the at least one floating diffusion region; and
   the shallow trench isolation structure is laterally spaced from the second-conductivity-type pinned photodiode layer by the at least one floating diffusion region.

10. The semiconductor structure of claim 8, wherein the at least one transfer gate stack structure comprises a single transfer gate stack structure that completely encircles an area of the second-conductivity-type pinned photodiode layer, and the total azimuthal angle is 360 degrees.

11. The semiconductor structure of claim 8, wherein a total azimuthal extension angle of the single floating diffusion region is 360 degrees around the geometrical center of the second-conductivity-type pinned photodiode layer.

12. The semiconductor structure of claim 8, wherein a total azimuthal extension angle of the single floating diffusion region is less than 360 degrees around the geometrical center of the second-conductivity-type pinned photodiode layer.

13. The semiconductor structure of claim 12, wherein:
   a shallow trench isolation structure laterally surrounds the single floating diffusion region;
   the shallow trench isolation structure comprises a lateral protrusion region that extends laterally toward the geometrical center into a gap in the single floating diffusion region; and
   an edge of a transfer gate dielectric of the at least one transfer gate stack structure contacts a top surface of the shallow trench isolation structure.

14. The semiconductor structure of claim 8, wherein:
a shallow trench isolation structure laterally surrounds the single floating diffusion region;
the shallow trench isolation structure comprises a plurality of lateral protrusion regions that extends laterally toward the geometrical center into a respective gap between a respective neighboring pair of the plurality of floating diffusion regions; and
each top surface of the plurality of lateral protrusion regions of the shallow trench isolation structure is contacted by an edge of a respective transfer gate dielectric of the at least one transfer gate stack structure.

15. The semiconductor structure of claim 8, wherein the at least one transfer gate stack structure comprises a plurality of transfer gate electrodes that are interconnected with one another by metal interconnect structures, and the total azimuthal angle is in a range from 240 degrees to 355 degrees.

16. The semiconductor structure of claim 15, wherein:
the at least one floating diffusion region comprises a plurality of floating diffusion regions that are laterally spaced apart and located in different azimuthal angle ranges around the geometrical center of the second-conductivity-type pinned photodiode layer;
a shallow trench isolation structure laterally surrounds the plurality of floating diffusion regions;
the shallow trench isolation structure comprises a plurality of lateral protrusion regions that extends laterally toward the geometrical center into a respective gap between a respective neighboring pair of the plurality of floating diffusion regions; and
each top surface of the plurality of lateral protrusion regions of the shallow trench isolation structure is contacted by an edge of a respective transfer gate dielectric of the at least one transfer gate stack structure.

17. The semiconductor structure of claim 15, wherein the shallow trench isolation structure contacts at least two surface segments of the second-conductivity-type pinned photodiode layer that are azimuthally spaced apart around the geometrical center.

18. A semiconductor structure comprising at least one instance of a subpixel located on a semiconductor substrate including a substrate semiconductor layer having a doping of a first-conductivity-type, wherein each instance of the subpixel comprises:
a second-conductivity-type pinned photodiode layer that forms a first p-n junction with the substrate semiconductor layer;
a first-conductivity-type pinning layer located on a top surface of the second-conductivity-type pinned photodiode layer and forming a second p-n junction with the second-conductivity-type pinned photodiode layer;
at least one transfer transistor body region having a doping of the first conductivity type and forming a respective third p-n junction with the second-conductivity-type pinned photodiode layer and laterally spaced from the first-conductivity-type pinning layer;
at least one floating diffusion region having a doping of the second conductivity type and is laterally spaced from a periphery of the second-conductivity-type pinned photodiode layer by the transfer transistor body region and at least partially laterally surrounds the second-conductivity-type pinned photodiode layer; and
a single transfer gate stack structure including a transfer gate dielectric and a transfer gate electrode and located between the second-conductivity-type pinned photodiode layer and the at least one floating diffusion region and completely encircling an area of the second-conductivity-type pinned photodiode layer with a total azimuthal extension angle of 360 degrees around a geometrical center of the second-conductivity-type pinned photodiode layer.

19. The semiconductor structure of claim 18, wherein:
the first-conductivity-type pinning layer comprises a periphery that is laterally offset inward from an inner sidewall of each of the at least one transfer gate stack structure; and
the second-conductivity-type pinned photodiode layer comprises a top surface in direct contact with a gate dielectric of the at least one transfer gate stack structure.

20. The semiconductor structure of claim 18, wherein the at least one floating diffusion region comprises a single floating diffusion region that completely encircles an area of the second-conductivity-type pinned photodiode layer.

* * * * *